(12) United States Patent
Yamazaki

(10) Patent No.: US 7,795,627 B2
(45) Date of Patent: Sep. 14, 2010

(54) SEMICONDUCTOR DEVICE AND METHOD FOR MANUFACTURING THE SAME

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 37 days.

(21) Appl. No.: 12/076,987

(22) Filed: Mar. 26, 2008

(65) Prior Publication Data

US 2008/0283848 A1 Nov. 20, 2008

(30) Foreign Application Priority Data

May 18, 2007 (JP) .............................. 2007-133500

(51) Int. Cl.
*H01L 33/00* (2010.01)

(52) U.S. Cl. .............................. 257/88; 257/13; 257/79; 257/E51.018; 257/E33.001; 438/22; 438/30; 438/69; 313/504; 313/505; 349/109

(58) Field of Classification Search ............... 257/88, 257/13, 79, E51.018, E33.001; 313/504, 313/505; 349/109; 438/22, 30, 69
See application file for complete search history.

(56) References Cited

U.S. PATENT DOCUMENTS 6,372,609 B1 4/2002 Aga et al.
6,818,529 B2 11/2004 Bachrach et al.
7,119,365 B2 10/2006 Takafuji et al.
2004/0135149 A1* 7/2004 Cho et al. ................... 257/72
2005/0247932 A1 11/2005 Huang et al.

FOREIGN PATENT DOCUMENTS

| JP | 10-135479 | 5/1998 |
| JP | 2003-029667 | 1/2003 |
| JP | 2003-324188 | 11/2003 |
| WO | WO 2006/062180 | * 6/2006 |

OTHER PUBLICATIONS

Invitation to Pay Additional Fees (Application No. PCT/JP2008/055997) Dated Apr. 22, 2008, Eng.

* cited by examiner

*Primary Examiner*—Davienne Monbleau
*Assistant Examiner*—Farid Khan
(74) *Attorney, Agent, or Firm*—Eric J. Robinson; Robinson Intellectual Property Law Office, P.C.

(57) ABSTRACT

A plurality of rectangle semiconductor substrates are attached to a single mother glass substrate. A pixel structure is determined so that even if a gap or a an overlapping portion is generated in a boundary between a plurality of semiconductor substrates, a single-crystal semiconductor layer does not overlap with the gap or the overlapping portion. Two TFTs are located in a first unit cell including the first light emitting element, four TFTs are located in a second unit cell including the second light emitting element, and no TFT is located in a third unit cell including the third light emitting element. A boundary line is between the third unit cell and a fourth unit cell.

10 Claims, 21 Drawing Sheets

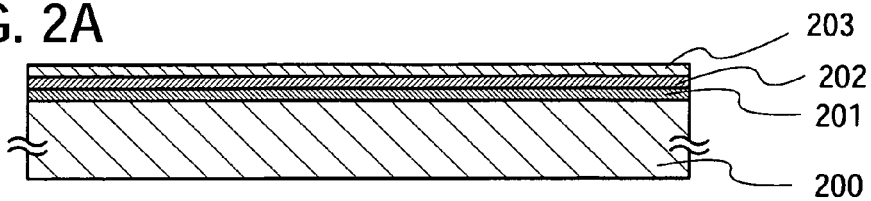
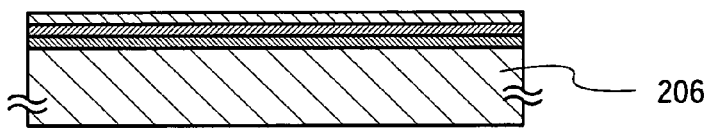
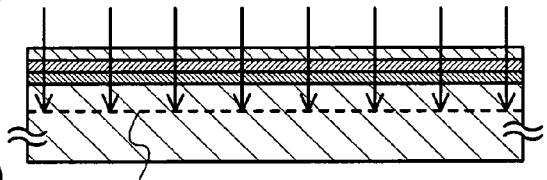
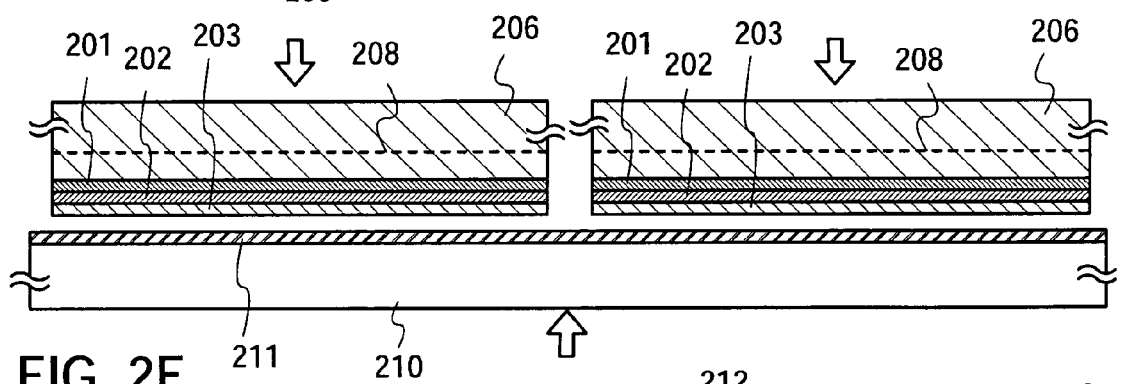
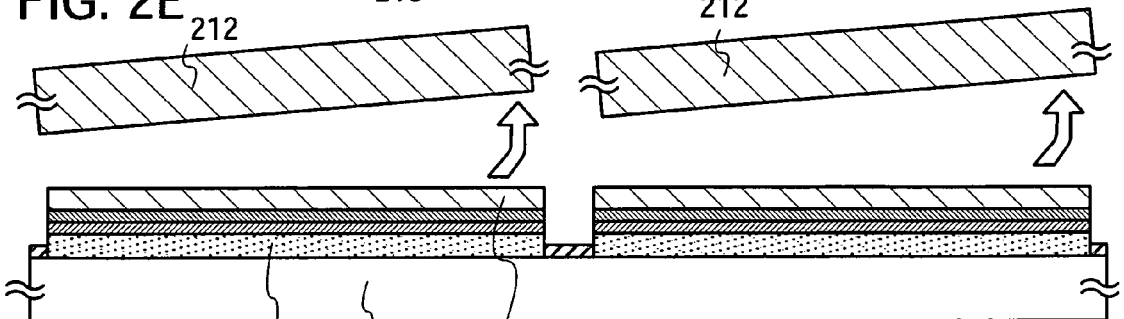
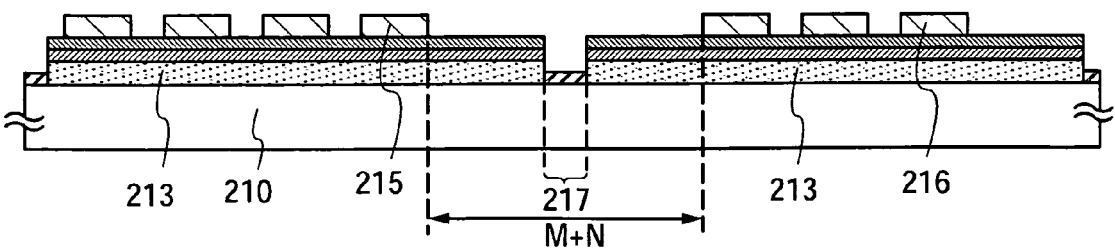

FIG. 3A
FIG. 3B
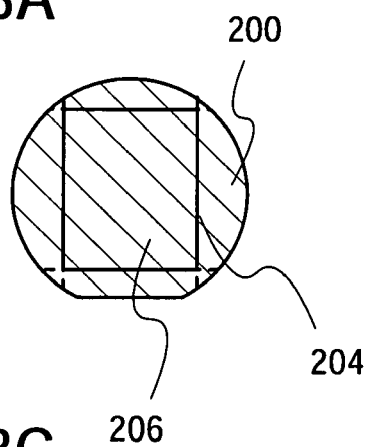
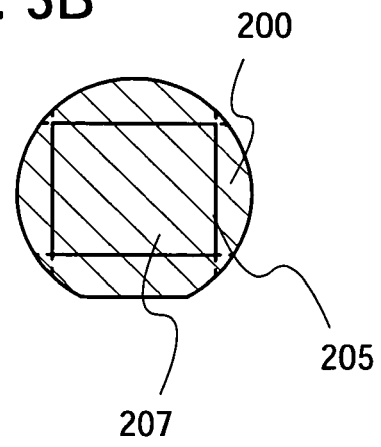
FIG. 3C
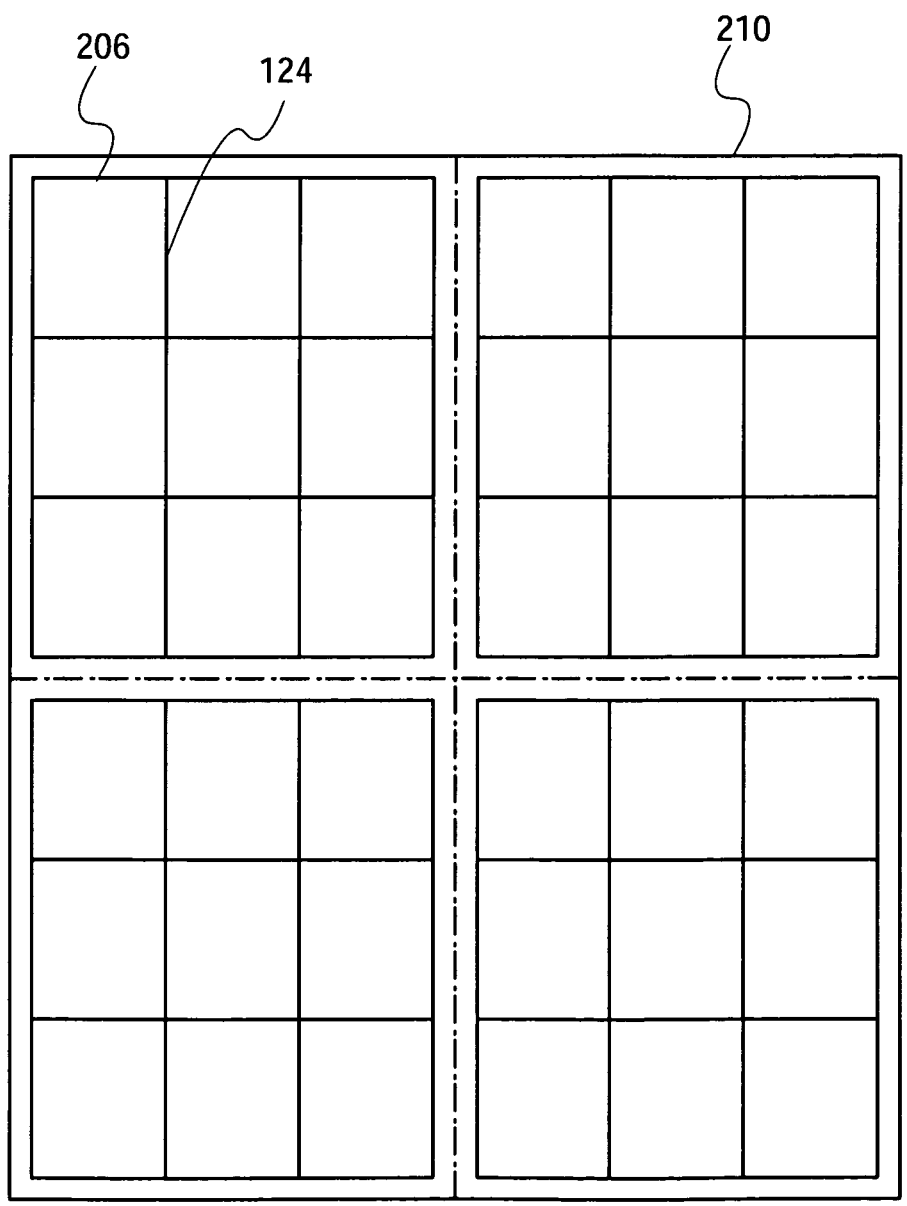

FIG. 21

| accelerating voltage | hydrogen atom ratios (X:Y) | hydrogen ion species ratios (X:Y/3) |
|---|---|---|
| 80kV | 1 : 44.1 | 1 : 14.7 |
| 60kV | 1 : 42.5 | 1 : 14.2 |
| 40kV | 1 : 43.5 | 1 : 14.5 |

SEMICONDUCTOR DEVICE AND METHOD FOR MANUFACTURING THE SAME

TECHNICAL FIELD

The present invention relates to semiconductor devices which have circuits including thin film transistors (hereinafter, referred to as TFTs), and a method for manufacturing the semiconductor devices. For example, the present invention relates to electro-optical devices typified by liquid crystal display panels, or electronic appliances which have light emitting display devices including an organic light emitting element as a component.

Note that a semiconductor device refers to any device which can function by utilizing semiconductor characteristics in this specification. Electro-optical devices, semiconductor circuits, and electronic appliances are all semiconductor devices.

BACKGROUND ART

In recent years, attention has focused on a technique for making a thin film transistor (TFT) by using a semiconductor thin film (having a thickness of approximately several to several hundreds of nanometers) formed over a substrate having an insulating surface. The thin film transistors are widely applied to electronic devices such as ICs and electro-optical devices, and their rapid development as switching elements for image display devices is particularly desired.

Formation of switching elements for an image display device needs a high-accurate photolithography technique which can arrange the switching elements with high area efficiency, in order to display high-definition images. A large one-shot exposure apparatus, a stepper exposure apparatus, or the like is used in order to form switching elements with precision over a large-area substrate.

Although a large one-shot exposure apparatus can expose a large area to light at one time, there is a problem in that variation in illuminance intensity or degree of parallelization is large. Accordingly, a stepper exposure apparatus which uses an optical system is often used.

A region which is exposed to light at one time with the stepper exposure apparatus is limited. When light exposure is performed on an area which is larger than that region, several shots of light exposure are needed.

A semiconductor substrate called a silicon-on-insulator (SOI substrate) that has a thin single-crystal semiconductor layer on an insulating layer has been developed instead of a silicon wafer that is manufactured by thinly slicing an ingot of a single-crystal semiconductor. The SOI substrates are spreading as substrates in manufacturing microprocessors or the like. This is because an integrated circuit using an SOI substrate attracts attention as an integrated circuit in which parasitic capacitance between a drain of a transistor and a substrate can be reduced, performance of the semiconductor integrated circuit can be improved, and low power consumption is achieved.

As a method for manufacturing SOI substrates, a hydrogen ion implantation separation method is known (for example, see Patent Document 1: U.S. Pat. No. 6,372,609). The hydrogen ion implantation separation method is a method by which hydrogen ions are implanted into a silicon wafer to form a microbubble layer at a predetermined depth from the surface, and a thin silicon layer (SOI layer) is bonded to another silicon wafer using the microbubble layer as a cleavage plane. In addition to heat treatment for separating an SOI layer, it is necessary to perform heat treatment in an oxidizing atmosphere to form an oxide film on the SOI layer, remove the oxide film, and perform heat treatment at 1000° C. to 1300° C. in a reducing atmosphere to increase bonding strength.

On the other hand, attempts have been made to form an SOI layer on an insulating substrate such as glass. As an example of SOI substrates in which SOI layers are formed on glass substrates, an SOI substrate in which a thin single-crystal silicon layer is formed over a glass substrate having a coating film by a hydrogen ion implantation separation method is known (see Patent Document 2: U.S. Pat. No. 7,119,365). In this case also, a thin silicon layer (SOI layer) is formed on the glass substrate in such a way that a microbubble layer is formed at a predetermined depth from the surface by implantation of hydrogen ions to a single-crystal silicon wafer, the glass substrate and the single-crystalline silicon wafer are bonded, and the silicon wafer is separated using the microbubble layer as a cleavage plane.

DISCLOSURE OF INVENTION

In order to separate a single-crystal silicon layer from a silicon wafer by a hydrogen ion implantation separation method, heat treatment at a high temperature equal to or higher than 600° C. has been required. However, in the case of forming an SOI substrate by bonding single-crystal silicon to a glass substrate that is used in a liquid crystal panel or the like for cost reduction of the substrate, there has been a problem in that such heat treatment at a high temperature causes warpage of the glass substrate. When the glass substrate warps, reduction in bonding strength to the single-crystal silicon layer is a concern. In addition, there is also a problem in that strain stress is applied to the single-crystal silicon layer and characteristics of the transistor are adversely affected. In other words, even when a single-crystal silicon layer is disposed over a glass substrate and a transistor is manufactured using the single-crystal silicon layer, sufficient characteristics cannot be obtained with a conventional technique.

One of the objects of the present invention is to provide a method for manufacturing semiconductor devices suitable for mass production in which switching elements using single-crystal silicon layers are provided over a glass substrate. Another object is to provide a method for manufacturing a semiconductor device having a display portion which has a larger area than a semiconductor substrate by using a mother glass substrate and a plurality of semiconductor substrates. Yet another object is to solve a problem in that spaces are generated between adjacently arranged sheets depending on processing accuracy of semiconductor substrates and positioning accuracy of sheets.

A glass substrate is rectangular in shape and had a size of 300×400 mm for the first generation in the beginning of 1990, which has grown to 680×880 mm or 730×920 mm for the fourth generation in 2000.

In contrast, size of semiconductor substrates are not so varied because semiconductor substrates are manufactured by forming an ingot of 20 to 30 cm in diameter by a Czochralski method (a CZ method), and slicing the ingot with a diamond blade or the like so that the slice has a thickness of about 0.5 to 1.5 mm to make a circle wafer.

Accordingly, in the case of manufacturing an active matrix display device using a glass substrate which is larger than a semiconductor substrate, a plurality of semiconductor substrates are used for a single glass substrate.

A region of an active matrix display device which serves as a display portion is rectangular in shape; therefore, a plurality of sheets, which are processed into rectangles from circular semiconductor substrates, are arranged. In other words, rectangle sheets are arranged in matrix along a side of a glass substrate. In this specification, a semiconductor substrate which is processed into a rectangle from a circular semiconductor substrate is referred to as a sheet.

A part of a sheet is separated and a single-crystal semiconductor layer is formed over a support substrate having an insulating surface. The other part of the sheet after separation preferably has a surface along which separation is carried out polished to be planarized, and is used again.

A processed single-crystal semiconductor is bonded to a support substrate having an insulating surface, typically a glass substrate, at a temperature equal to or lower than a strain point of the support substrate. Steps after bonding are also performed in a condition that an upper limit of a process temperature is equal to or lower than the strain point of the support substrate; therefore, warpage of the glass substrate due to heat is reduced. A bonding layer used for bonding can be a silicon oxide layer which is deposited by a chemical vapor deposition method. In this case, a silicon oxide layer which is manufactured by a chemical vapor deposition method using an organic silane gas is preferably used. Examples of an organic silane gas that can be used include silicon-containing compounds, such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$). In this case, a bonding layer may be formed over either one or each of the glass substrate and a semiconductor substrate. This single-crystal semiconductor (hereinafter, also referred to as low temperature single-crystal semiconductor (LTSS)) layer is formed through a plurality of thermal treatment steps.

A region which can be exposed to light at one time with a stepper exposure apparatus is limited. Accordingly, when a region larger than that area is to be exposed to light, several shots of light exposure are performed or, a division light exposure method may be used in which several shots of light exposure are performed using plural kinds of masks for light exposure. In order to efficiently manufacture a plurality of panels using a single mother glass, a diameter of a semiconductor substrate and a size of a sheet which is obtained by processing the semiconductor substrate are determined in consideration of a light exposure region (a rectangle) per shot of a stepper exposure apparatus as a basic unit.

Note that spaces may be generated between adjacently arranged sheets depending on processing accuracy of semiconductor substrates and positioning accuracy of sheets.

A pixel structure is employed in which a semiconductor layer is not disposed adjacent to a space between neighboring sheets. The semiconductor layer which is used as an electrode of a storage capacitor as well as the semiconductor layer which is in a switching element are not disposed adjacent to a space between neighboring sheets. Note that the semiconductor layer mentioned here refers to a semiconductor layer which is obtained from a semiconductor substrate.

A structure of a semiconductor device according to the present invention disclosed in this specification includes a display portion which includes a plurality of unit cells arranged in matrix over a substrate having an insulating surface. In the display portion, a first region in which a plurality of semiconductor layers are disposed with a first gap therebetween and a second region in which a plurality of semiconductor layers are disposed with a second gap therebetween are arranged in a row direction or a column direction, and the gap between the semiconductor layer in the first region and the semiconductor layer in the second region is larger than the first gap and the second gap.

In the foregoing display portion, each of the plurality of unit cells includes a light emitting region and the light emitting regions have the same size.

In addition, the plurality of semiconductor layers disposed with the first gap therebetween are formed of a first sheet and the plurality of semiconductor layers disposed with the second gap therebetween are formed of a second sheet. Note that the first sheet and the second sheet are bonded to the substrate having an insulating surface side by side.

In addition, the plurality of semiconductor layers disposed with the first gap therebetween are exposed to light by single shot with a stepper exposure apparatus and patterned, and the plurality of semiconductor layers disposed with the second gap therebetween are exposed to light by another single shot with the stepper exposure apparatus and patterned.

In a display portion of a semiconductor device, a plurality of semiconductor elements serving as switching elements are disposed. For example, the display portion may be a liquid crystal display element which drives liquid crystal using elements which are electrically connected to switching elements. The display portion may be electronic paper which drives electronic ink using elements which are electrically connected to switching elements. Elements which are electrically connected to switching elements may be light emitting elements which include an organic compound in a light emitting layer (which is also referred to as an organic EL element) or may be light emitting elements which include an inorganic compound in a light emitting layer (which is also referred to as an inorganic EL element).

Inorganic EL elements are classified as either a dispersion type inorganic EL element or a thin-film type inorganic EL element, depending on its structure. Either of them may be used. Although they differ in that the former has an electroluminescent layer in which particles of a light emitting material are dispersed in a binder, whereas the latter has an electroluminescent layer formed of a thin film of a light emitting material, both need electrons accelerated by a high electric field. Mechanisms for obtaining light emission include donor-acceptor recombination light emission, which utilizes a donor level and an acceptor level, and localized light emission, which utilizes inner-shell electron transition of a metal ion. In general, donor-acceptor recombination light emission is employed in dispersion type inorganic EL elements and localized light emission is employed in thin-film type inorganic EL elements in many cases. As a base material for a light emitting material, sulfide, oxide, or nitride can be used. As sulfide, for example, zinc sulfide, cadmium sulfide, calcium sulfide, yttrium sulfide, gallium sulfide, strontium sulfide, or barium sulfide can be used. As oxide, for example, zinc oxide, or yttrium oxide can be used. As nitride, for example, aluminum nitride, gallium nitride, or indium nitride can be used. Further, zinc selenide, zinc telluride, or the like, or ternary mixed crystals such as calcium gallium sulfide, strontium gallium sulfide, or barium gallium sulfide may be used. As a light emission center for localized light emission, manganese, copper, samarium, terbium, erbium, thulium, europium, cerium, praseodymium, or the like can be used. Note that, a halogen element, such as fluorine or chlorine may be added. Such halogen element can be used for charge compensation.

The present invention solves at least one of the foregoing problems.

It is preferable that the light emitting regions be evenly spaced, and in the vicinity of a space between the neighboring sheets, positions of semiconductor layers be away from the space and the distance between semiconductor layers connected to light emitting regions which are next to each other with the space therebetween be large. Another aspect of the present invention is a semiconductor device having a display portion including a plurality of unit cells which are arranged in matrix over a substrate having an insulating surface in which each of a first unit cell and a second unit cell which are adjacently arranged in a row direction has a first electrode, a light emitting layer which overlaps with the first electrode, and a second electrode which overlaps with the light emitting layer. The first unit cell includes a semiconductor layer of a first switching element which is connected to the first electrode of the first unit cell and a semiconductor layer of a second switching element which is connected to the first electrode of the second unit cell.

A semiconductor layer is not disposed adjacent to a light emitting region which is next to a space, and the semiconductor layer is disposed adjacent to a light emitting region which is near the opposite side of the light emitting region from the space. The first unit cell includes a plurality of semiconductor layers and the second unit cell does not include a semiconductor layer.

Another aspect of the present invention is a semiconductor device having a display portion including a plurality of unit cells which are arranged in matrix over a substrate having an insulating surface, in which each of a first unit cell, a second unit cell, a third unit cell, and a fourth unit cell which are adjacently arranged in a row direction has a first electrode, a light emitting layer which overlaps with the first electrode, and a second electrode which overlaps with the light emitting layer; the first unit cell includes a semiconductor layer of a first switching element which is connected to the first electrode of the first unit cell and a semiconductor layer of a second switching element which is connected to the first electrode of the second unit cell; and the fourth unit cell includes a semiconductor layer of a fourth switching element which is connected to the first electrode of the fourth unit cell and a semiconductor layer of a third switching element which is connected to the first electrode of the third unit cell.

Semiconductor layers are not disposed adjacent to two light emitting regions which are next to each other with a space therebetween, and the semiconductor layers are disposed adjacent to two light emitting regions which sandwich the two light emitting regions which are next to each other with a gap therebetween. In the foregoing structure, the first unit cell and the fourth unit cell include a plurality of semiconductor layers and the second unit cell and the third unit cell do not include a semiconductor layer. In other words, while semiconductor layers are not disposed adjacent to two light emitting regions which are next to each other with a space therebetween, a plurality of semiconductor layers are accumulated adjacent to two light emitting regions which sandwich the two light emitting regions which are next to each other with a gap therebetween. Accordingly, in order to provide an area of a light emitting region, a light emitting panel which emits light through a second electrode which is placed over the light emitting layer is preferable to a light emitting panel which emits light through a substrate having an insulating surface.

A method for manufacturing a semiconductor device according to the present invention, which realizes the foregoing structure, includes forming a separation layer by adding hydrogen to a plurality of rectangle semiconductor substrates with an ion doping apparatus; arranging the plurality of rectangle semiconductor substrates over a substrate having an insulating surface; retaining a plurality of single-crystal semiconductor layers over the substrate having an insulating surface by performing heat treatment, bonding the substrate having an insulating surface and the plurality of rectangle semiconductor substrates to each other, and separating parts of the plurality of rectangle semiconductor substrates using the separation layer as a boundary; and selectively etching the plurality of single-crystal semiconductor layers using a mask which is formed over the plurality of single-crystal semiconductor layers.

A stepper exposure apparatus is used for light exposure of a resist in formation of the mask over the plurality of single-crystal semiconductor layers. A stepper exposure apparatus of which a light exposure size of one shot is approximately the same as a size of the rectangle semiconductor substrate or a stepper exposure apparatus of which a light exposure size of one shot is larger than the a size of the rectangle semiconductor substrate. In addition, the semiconductor device has a display portion which uses the plurality of single-crystal semiconductor layers as semiconductor layers of switching elements and which has an area larger than one rectangle semiconductor substrate.

Since the plurality of single-crystal semiconductor layers originally come from semiconductor substrates with small variation, the plurality of single-crystal semiconductor layers which are bonded to the substrate having an insulating surface have small variation. Therefore, display uniformity in a display portion of a semiconductor device can be reduced. In addition, since the plurality of single-crystal semiconductor layers originally come from the semiconductor substrates, the plurality of single-crystal semiconductor layers can be highly effective when used as semiconductor layers in a switching element in a display portion or semiconductor layers in a drive circuit which drives the display portion. For example, a switching element using a single-crystal semiconductor layer shows high electrical characteristics (e.g., a field effect mobility) and can achieve reduction in power consumption of the semiconductor device having a display portion. In addition, a drive circuit using a single-crystal semiconductor layer can drive at high speed.

In addition, since a light transmitting substrate can be used as a substrate having an insulating surface, the present invention is useful for a transmissive liquid crystal display device, a reflective liquid crystal display device, a light emitting display device which uses a surface of a substrate having an insulating surface as a display surface, or a lighting device which uses a surface of a substrate having an insulating surface as a light emitting surface. Further, if a substrate which has the same coefficient of thermal expansion as the substrate having an insulating surface is used as a sealing substrate which is disposed to face the substrate having an insulating surface, airtightness of the pair of substrates can be maintained because they have the same coefficient of thermal expansion even if any heat is applied to a display portion.

Note that before a single-crystal semiconductor layer is bonded to a support substrate such as a glass substrate, oxidation in an oxidation atmosphere in which a halogen is added is preferably performed in order to reduce impurities in the single-crystal semiconductor layer. For example, thermal treatment is performed at a temperature of equal to or higher than 700° C. in an atmosphere containing HCl at 0.5 to 10 volume % (preferably 3 volume %) with respect to oxygen. Preferably, thermal oxidation may be performed at a temperature of 950 to 1100° C. The processing time may be 0.1 to 6 hours, preferably 0.5 to 1 hour. The film thickness of the oxide film, which is formed, is 10 to 1000 nm (preferably 50 to 200 nm), for example, 100 nm. In stead of HCl, one or plural kinds selected from HF, $NF_3$, HBr, $Cl_2$, $ClF_3$, $BCl_3$, $F_2$, or $Br_2$, can be used as a material including a halogen.

When heat treatment is performed within such a temperature range, a gettering effect by a halogen element can be obtained. Gettering particularly has an effect of removing a metal impurity. In other words, an impurity such as metal is turned into a volatile chloride, moved into the air, and removed by action of chlorine. Oxidation with a halogen is preferably performed after a step in which contamination by impurities may occur. For example, oxidation with a halogen is particularly effective if being carried out after performing chemical mechanical polishing (CMP) treatment on the surface of a semiconductor substrate or processing the semiconductor substrate into a rectangle. In addition, hydrogen has action of compensating defects in an interface between the semiconductor substrate and an oxide film so as to lower a localized-level density at the interface.

An oxide film which is formed through oxidation in an oxidizing atmosphere containing a halogen has a function of blocking elements which are impurities in hydrogen ion irradiation. In hydrogen ion irradiation, heavy metal elements which originate from a material of an inner wall of a chamber or an electrode material may be added to a semiconductor substrate as well as hydrogen ions, and contaminate a surface of the semiconductor substrate. In order to reduce effect of surface contamination, the surface may be thinly removed by wet etching or dry etching.

Further, the oxide film which is formed through this thermal treatment can include a halogen. When a halogen element is included at a concentration of $1\times10^{17}/cm^3$ to $5\times10^{20}/cm^3$, the oxide film can serve as a protective film which captures an impurity such as metal and prevent contamination of the semiconductor substrate. In addition, since heavy metal elements which originate from a material of an inner wall of a chamber or an electrode material is added to a region above a region of hydrogen ions in the semiconductor substrate, it is effective to form an oxide film including a halogen on a surface of the semiconductor substrate. If thermal treatment is performed after heavy metal elements are added to the oxide layer, a halogen in the oxide layer is reacted with the heavy metal elements, so that the heavy metal does not diffuse. When an oxide film including a halogen is formed, improvement in electrical characteristics, such as reduction in off current can be achieved in the switching element using a single-crystal semiconductor layer which is disposed over a glass substrate.

A display portion having an area which is larger than that of a semiconductor substrate is manufactured using a single mother glass substrate and a plurality of semiconductor substrates and semiconductor devices having such a display portion can be mass produced.

BRIEF DESCRIPTION OF DRAWINGS

FIGS. 2A to 2F are cross-sectional views illustrating manufacturing steps;

FIGS. 3A to 3C are top views illustrating manufacturing steps;

FIG. 21 is a list of ratios of fitting parameters (hydrogen atom ratios and hydrogen ion species ratios).

BEST MODE FOR CARRYING OUT THE INVENTION

Embodiment Mode

Figure 1:
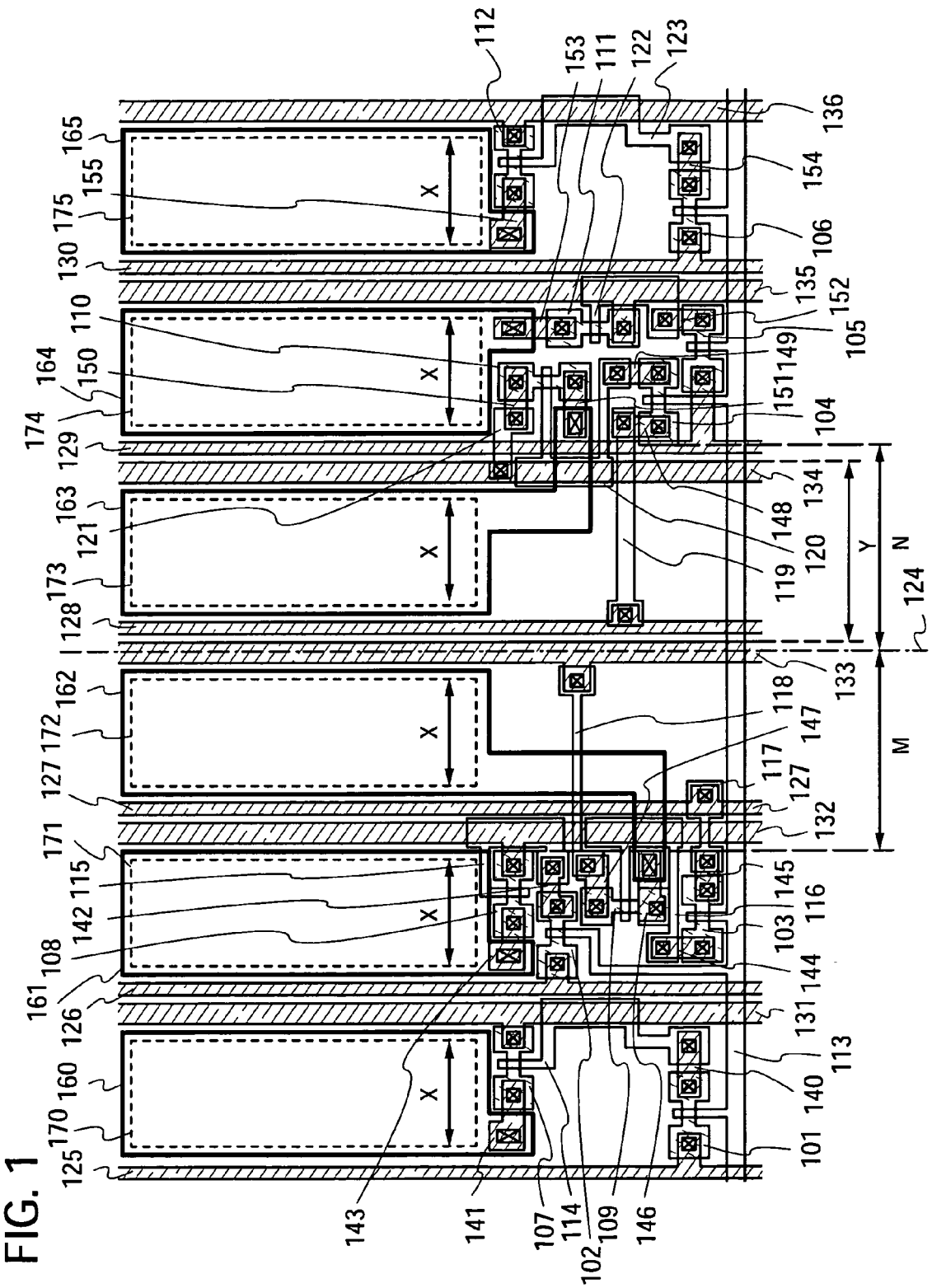
FIG. 1 is a top view illustrating a part of a pixel portion.

Embodiment modes of the present invention will be described hereinafter.

Embodiment Mode 1

First, a top view of a semiconductor substrate 200 which has a thin circular shape is shown in FIG. 3A. As is shown in FIG. 3A, the semiconductor substrate 200 has a flat as a part of its rim to indicate crystallographic orientation. Here, a 5-inch silicon wafer (125 mm in diameter) is used as an example. Note that an 8-inch silicon wafer (200 mm in diameter) or a 12-inch silicon wafer (300 mm in diameter) can be used if needed.

A silicon oxynitride layer 201 is formed over the semiconductor substrate 200. A thickness of the silicon oxynitride layer 201 may be set as appropriate by a practitioner and may be 10 to 500 nm (preferably 10 to 150 nm). The silicon oxynitride layer 201 later serves as a part of an insulating layer in an SOI substrate. Note that the silicon oxynitride layer 201 can be formed by a method such as a CVD method like a plasma CVD method or a low pressure CVD method, or a sputtering method. For example, the silicon oxynitride layer 201 can be formed over the semiconductor substrate 200 through treatment on a surface of the single-crystal silicon substrate with oxygen radicals (which may include OH radicals) which are generated by plasma discharge in an atmosphere containing oxygen and treatment on the surface of the single-crystal silicon substrate with nitrogen radicals (which may include NH radicals) which are generated by plasma discharge in an atmosphere containing nitrogen. Thus, bonding strength can be increased in bonding to a support substrate 210 which is carried out later.

Then, a silicon nitride oxide layer 202 is formed over the silicon oxynitride layer 201. A thickness of the silicon nitride oxide layer 202 may be set as appropriate by a practitioner and may be 10 to 500 nm (preferably 10 to 200 nm). The silicon nitride oxide layer 202 also serves as a part of an insulating layer in an SOI substrate later. Note that the silicon nitride oxide layer 202 can be formed by a method such as a CVD method like a plasma CVD method or a low pressure CVD method, or a sputtering method. The silicon oxynitride layer 201 and the silicon nitride oxide layer 202 are preferably formed successively without being exposed to the atmosphere in order to prevent contamination by impurities.

Note that a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, Si, and hydrogen at concentrations ranging from 50 to 70 at. %, 0.5 to 15 at. %, 25 to 35 at. %, and 0.1 to 10 at. %, respectively. Further, a silicon nitride oxide layer means a layer that contains more nitrogen than oxygen and, in the case where measurements are performed using RBS and HFS, includes oxygen, nitrogen, Si, and hydrogen at concentrations ranging from 5 to 30 at. %, 20 to 55 at. %, 25 to 35 at. %, and 10 to 30 at. %, respectively. Note that percentages of nitrogen, oxygen, Si, and hydrogen fall within the ranges given above, where the total number of atoms contained in the silicon oxynitride film or the silicon nitride oxide film is defined as 100 at. %.

Then, a first bonding layer 203 is formed over the silicon nitride oxide layer 202, as shown in FIG. 2A. A silicon oxide layer is suitable for the first bonding layer 203. In particular, a silicon oxide layer which is formed by a chemical vapor deposition method using an organic silane gas is preferable. Examples of an organic silane gas that can be used include silicon-containing compounds such as tetraethoxysilane, tetramethylsilane, tetramethylcyclotetrasiloxane, octamethylcyclotetrasiloxane, hexamethyldisilazane, triethoxysilane, or trisdimethylaminosilane. Alternatively, a thermal oxide layer formed through heat treatment at high temperature on the single-crystal semiconductor substrate or chemical oxide can be used for the first bonding layer 203. For example, chemical oxide can be formed by treating a surface of the single-crystal semiconductor substrate with ozone-containing water. Chemical oxide is formed reflecting planarity of the surface of the single-crystal semiconductor substrate, which is preferable.

The first bonding layer 203 having a smooth surface which is activated is provided with a thickness of 1 nm to 600 nm, preferably 5 nm to 500 nm, more preferably 5 nm to 200 nm. With such a thickness, it is possible to smooth surface roughness of a surface on which the first bonding layer 203 is formed and also to ensure smoothness of a surface of the first bonding layer 203. In addition, it possible to mitigate distortion with the support substrate to which an SOI layer is bonded. In bonding the SOI layer to the support substrate which is a substrate having an insulating surface in a later step, the support substrate and the SOI layer can be strongly bonded together by providing the first bonding layer 203 of a silicon oxide layer, preferably a thermal oxide layer, a silicon oxide layer formed by treating a surface of the single-crystal semiconductor substrate with ozone water, or a silicon oxide layer formed using organic silane as a row material, for either one or both of bonding surfaces of the support substrate and the SOI layer.

Then, as shown in FIG. 2B, the semiconductor substrate 200 is ground or cut so as to be a rectangle sheet 206. Note that while this embodiment mode describes an example in which the semiconductor substrate 200 is processed into a rectangle after the first bonding layer 203 is formed, the present invention is not limited thereto. The semiconductor substrate 200 may be processed into a rectangle before the silicon oxynitride layer 201 is formed. Alternatively, the semiconductor substrate 200 may be processed into a rectangle before the first bonding layer 203 is formed.

In specific, the semiconductor substrate is ground into the rectangle sheet 206 using a grinding apparatus or a dicing apparatus which includes a diamond wheel or a metal wheel. The largest rectangular which can be taken out from a 5-inch wafer would be a rectangle with a 5-inch diagonal line.

A dicing line for a 5-inch silicon wafer in order to process the wafer into a rectangle sheet with a dicing apparatus is preferably determined so that a size of the rectangle sheet is approximately the same as a light exposure region of one shot of a stepper exposure apparatus.

In this embodiment mode, a stepper exposure apparatus of which the size of light exposure region of one shot is 90 mm×110 mm. Note that, a stepper exposure apparatus of which the size of light exposure region of one shot is 140 mm×140 mm may be used if needed.

There are two kinds of dicing lines: a dicing line 204 in a top view of FIG. 3A and a dicing line 205 in a top view of FIG. 3B. The rectangle sheet 206 in FIG. 3A has a long side parallel to a flat. The rectangle sheet 207 in FIG. 3B has a short side parallel to a flat. Flats serve as reference in ion irradiation. A long side or a short side of the rectangle sheet serves as a reference instead of the flat.

Then, an object is irradiated with ions that are accelerated by an electric field so that ions reach a predetermined depth from the surface of the object with an ion doping apparatus, thus, a separation layer is formed. The separation layer is formed by irradiation with ions of hydrogen, helium, or a halogen typified by fluorine. It is preferable that a surface of the first bonding layer 203 is sufficiently cleaned before the separation layer is formed.

In this embodiment mode, the rectangle sheet 206 is irradiated with hydrogen ions to form a separation layer 208, as is shown in FIG. 2C. In the case of irradiating with hydrogen ions, the hydrogen ions preferably include $H^+$, $H_2^+$, and $H_3^+$ ions with a high proportion of $H_3^+$ ions. With a high proportion of $H_3^+$ ions, efficiency can be increased and irradiation time can be shortened. Such process facilitates separation along separation layer which is performed later.

An ion irradiation method is considered below.

In this embodiment mode, a single-crystal semiconductor substrate is irradiated with ions that are derived from hydrogen (H) (hereafter referred to as "hydrogen ion species"). More specifically, a hydrogen gas or a gas which contains hydrogen in its composition is used as a source material; a hydrogen plasma is generated; and a single-crystal semiconductor substrate is irradiated with the hydrogen ion species in the hydrogen plasma.

(Ions in Hydrogen Plasma)

In such hydrogen plasma as described above, hydrogen ion species such as $H^+$, $H_2^+$, and $H_3^+$ are present. Here are listed reaction equations for reaction processes (formation processes, destruction processes) of the hydrogen ion species.

$$e + H \rightarrow e + H^+ + e \qquad (1)$$

$$e + H_2 \rightarrow e + H_2^+ + e \qquad (2)$$

  (3)

  (4)

$H_2^+ + H_2 \rightarrow H_3^+ + H$  (5)

$H_2^+ H_2 \rightarrow H^+ + H + H_2$  (6)

  (7)

$e + H_3^+ \rightarrow H_2^+ H$  (8)

$e + H_3^+ \rightarrow H + H + H$  (9)

Figure 14:
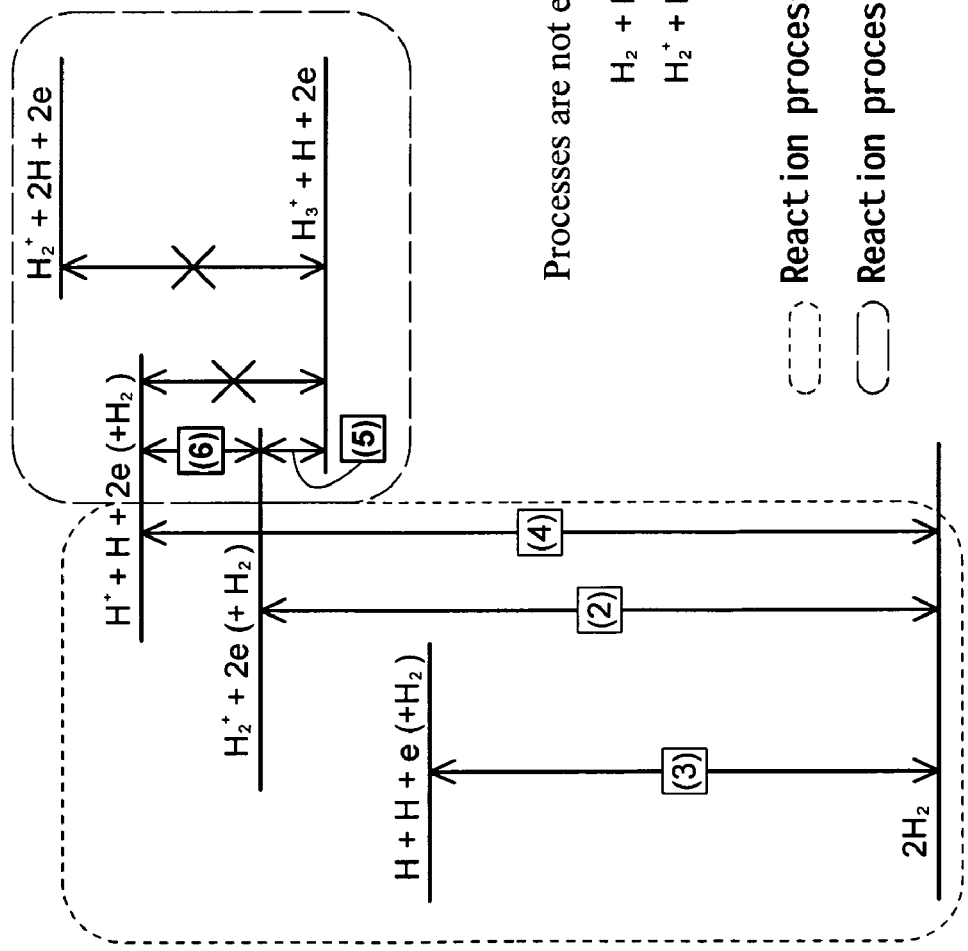
FIG. 14 is an energy diagram of hydrogen ion species.

FIG. 14 is an energy diagram which schematically shows some of the above reactions. Note that the energy diagram shown in FIG. 14 is merely a schematic diagram and does not depict the relationships of energies of the reactions exactly.

($H_3^+$ Formation Process)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the difference between a potential energy at a potential before the charged particle moves and a potential energy at a potential before the collision. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

Figure 15:
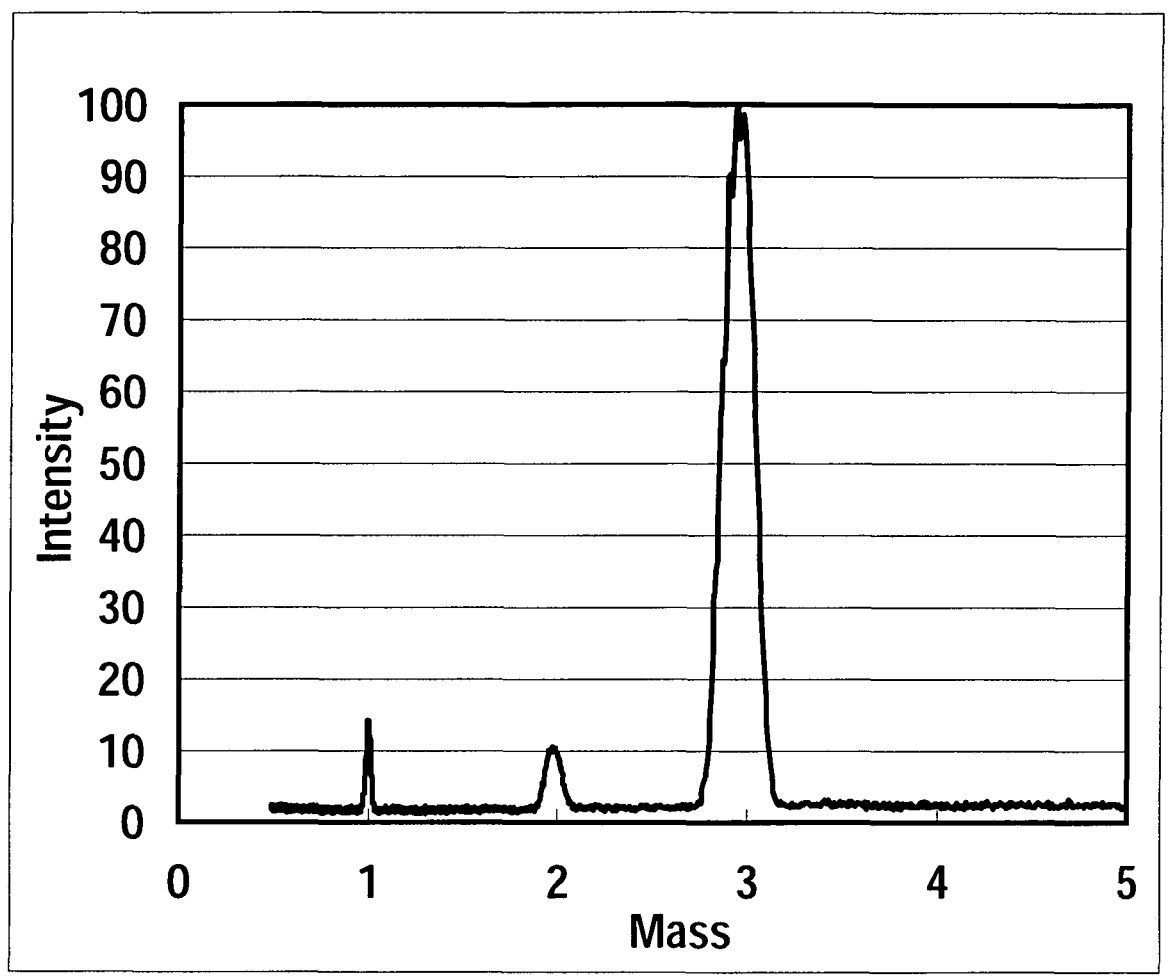
FIG. 15 is a diagram showing the results of ion mass spectrometry.

Here, an example in which the proportions of ion species (particularly, the proportion of $H_3^+$) are different is described. FIG. 15 is a graph showing the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 15, the number of ions with different masses is expressed as a relative proportion where the number of ions with a mass of 3 is defined as 100. It can be seen from FIG. 15 that the ratio between ion species that are generated from the ion source, i.e., the ratio between $H^+$, $H_2^+$, and $H_3^+$, is about 1:1:8. Note that ions at such a ratio can also be generated with an ion doping apparatus which has a plasma source portion (ion source) that generates a plasma, an extraction electrode that extracts an ion beam from the plasma, and the like.

Figure 16:
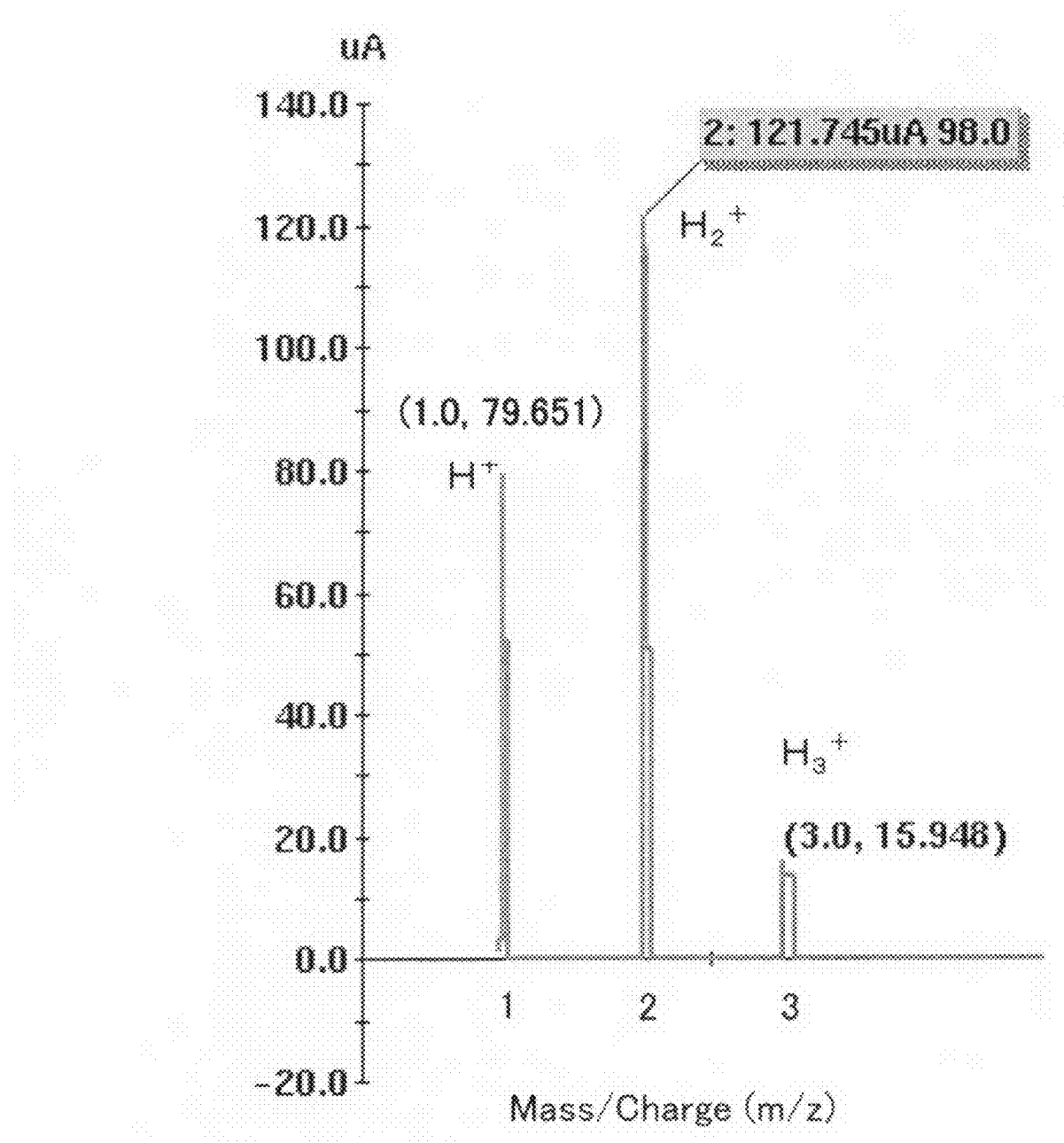
FIG. 16 is a diagram showing the results of ion mass spectrometry.

FIG. 16 is a graph showing the results of mass spectrometry of ions that are generated from $PH_3$ when an ion source different from that for the case of FIG. 15 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 15, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 16 that the ratio between ion species in a plasma, i.e., the ratio between $H^+$, $H_2^+$, and $H_3^+$, is about 37:56:7. Note that, although FIG. 16 shows the data obtained when the source gas is $PH_3$, the ratio between the hydrogen ion species is about the same when a 100% hydrogen gas is used as a source gas, as well.

In the case of the ion source from which the data shown in FIG. 16 is obtained, $H_3^+$, among $H^+$, $H_2^+$, and $H_3^+$, is generated at a proportion of only about 7%. On the other hand, in the case of the ion source from which the data shown in FIG. 15 is obtained, the proportion of $H_3^+$ can be up to 50% or higher (under the aforementioned conditions, about 80%). This is thought to result from the pressure and an electric field inside a chamber, which is clearly shown in the above consideration.

($H_3^+$ Irradiation Mechanism)

When a plasma that contains a plurality of ion species as shown in FIG. 15 is generated and a single-crystal semiconductor substrate is irradiated with the generated ion species without any mass separation being performed, the surface of the single-crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of a Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of a Si substrate changes into a non-single-crystal structure due to the collision of the hydrogen ion species with Si atoms.

Figure 17:
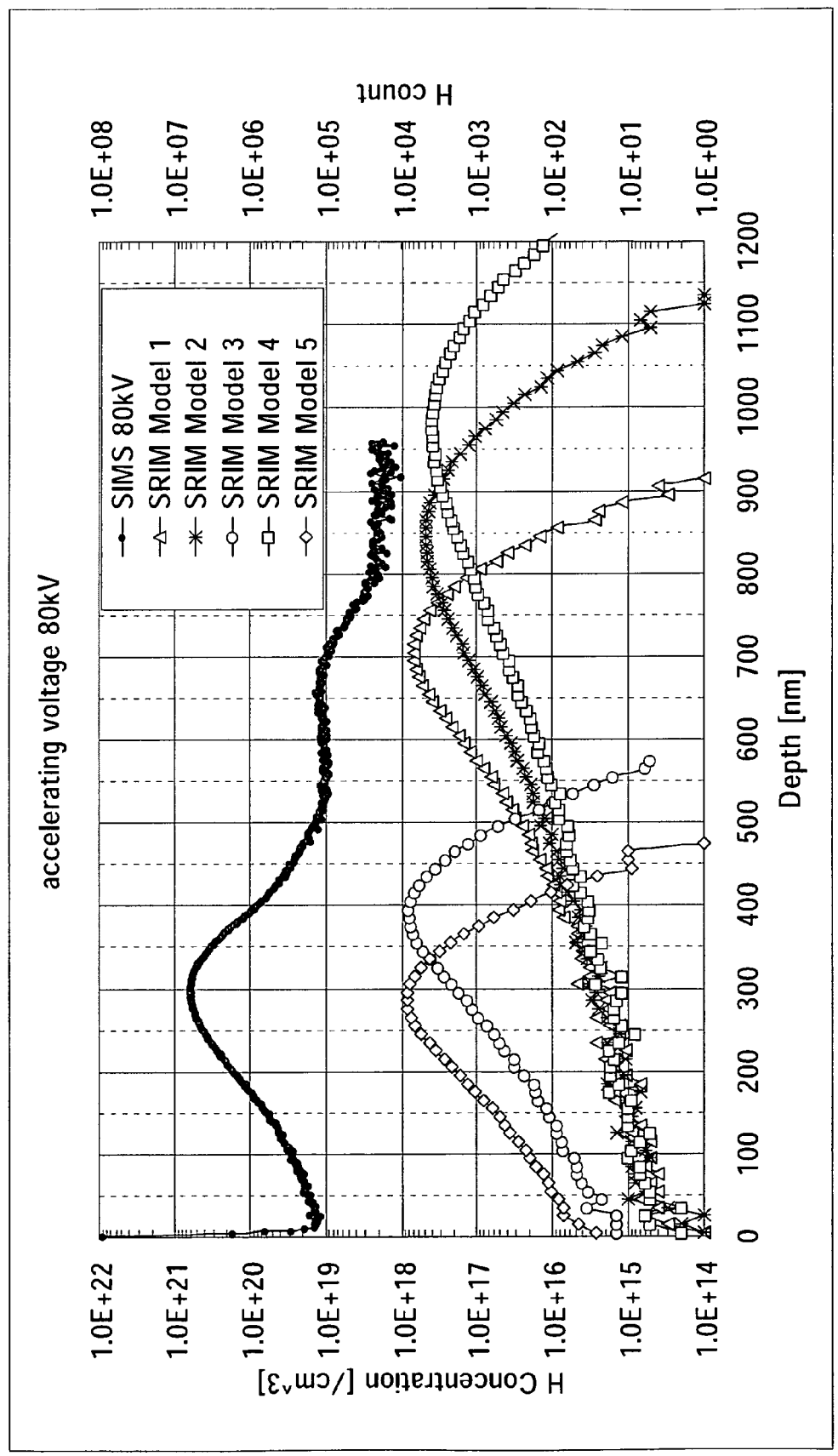
FIG. 17 is a diagram showing the profile (measured values and calculated values) of hydrogen in the depth direction when the accelerating voltage is 80 kV.

FIG. 17 shows the calculation results obtained when irradiation with the hydrogen ion species (irradiation with 100,000 atoms for H) is performed using Models 1 to 5. FIG. 17 also shows the hydrogen concentration (secondary ion mass spectrometry (SIMS) data) in a Si substrate irradiated with the hydrogen ion species of FIG. 15. The results of calculations performed using Models 1 to 5 are expressed on the vertical axis (right axis) as the number of hydrogen atoms, and the SIMS data is expressed on the vertical axis (left axis) as the concentration of hydrogen atoms. The horizontal axis represents the depth from the surface of a Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only about several electron volts, it is likely that the contribution of each of Models 2 and 4 is small because $H_2^+$ and $H_3^+$ mostly split into $H^+$ or H by colliding with Si atoms.

Figure 18:
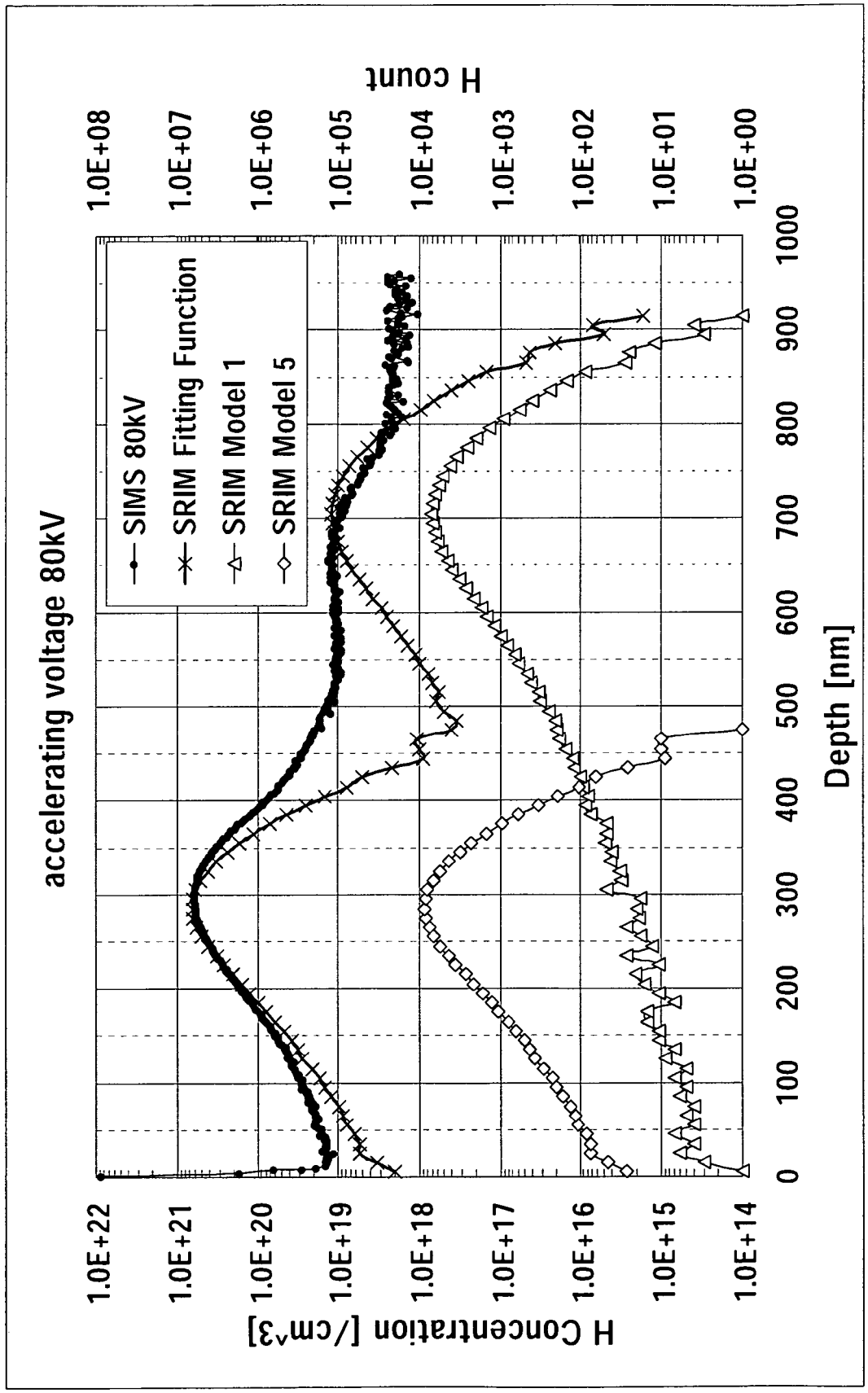
FIG. 18 is a diagram showing the profile (measured values, calculated values, and fitting functions) of hydrogen in the depth direction when the accelerating voltage is 80 kV.
Figure 19:
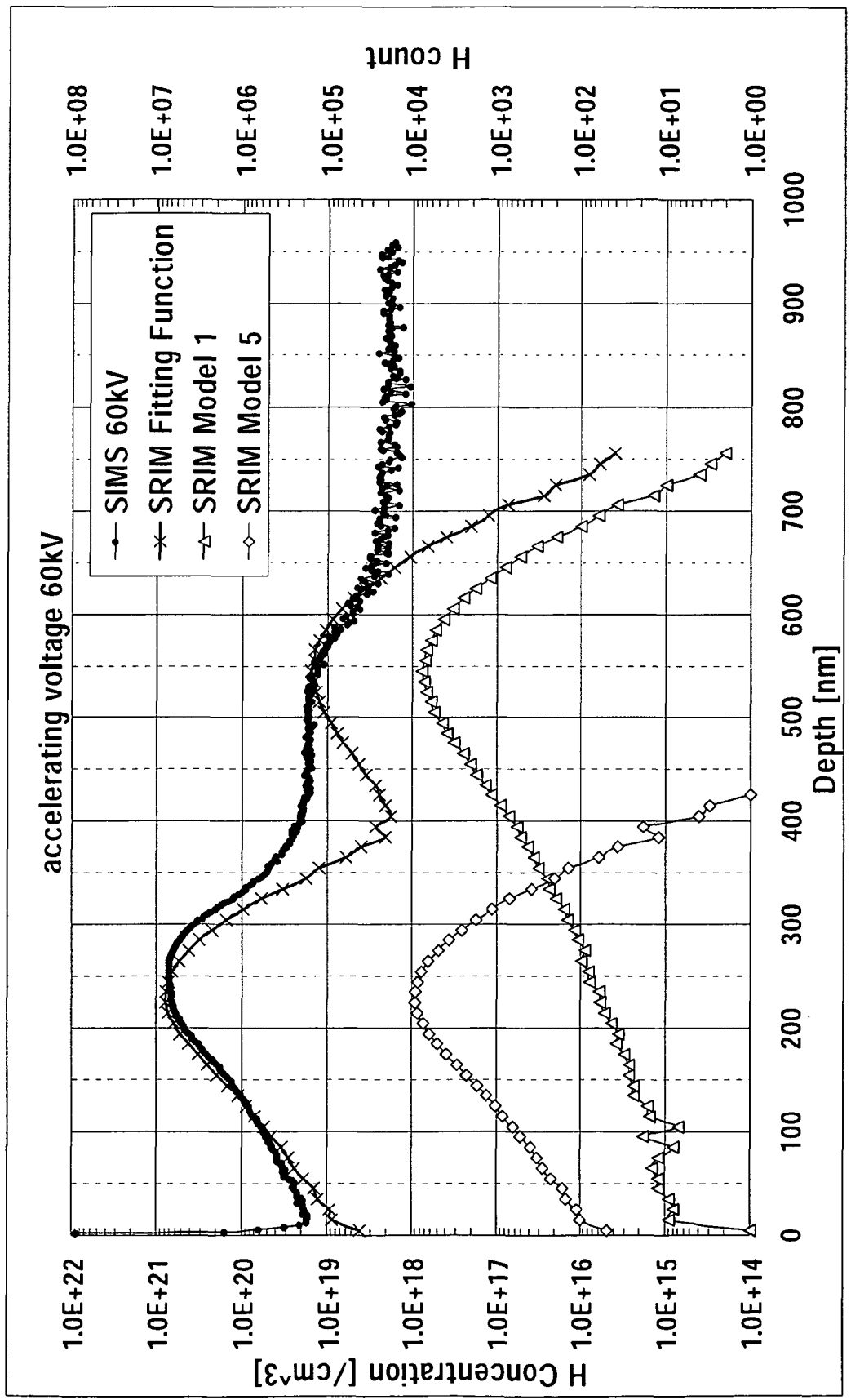
FIG. 19 is a diagram showing the profile (measured values, calculated values, and fitting functions) of hydrogen in the depth direction when the accelerating voltage is 60 kV.
Figure 20:
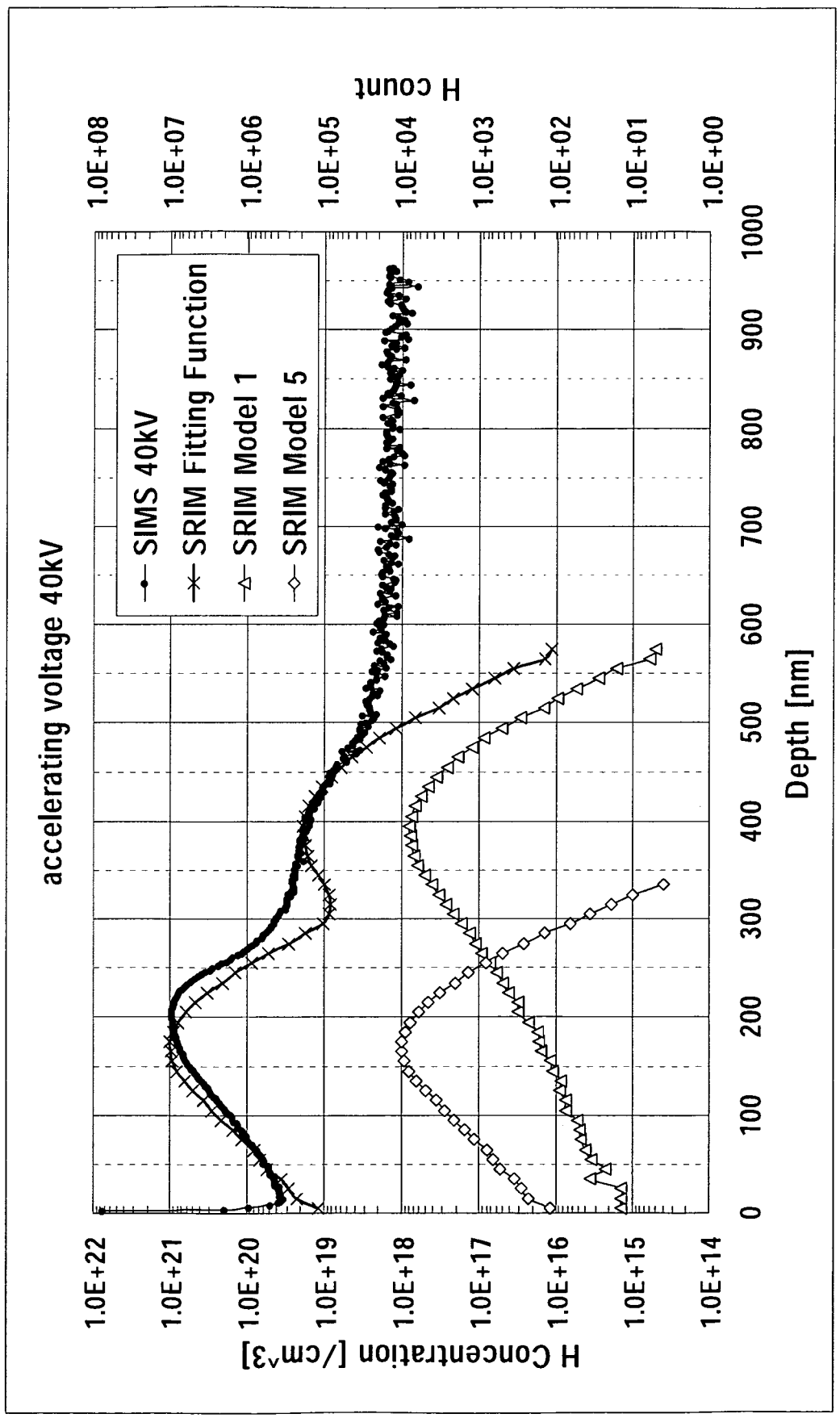
FIG. 20 is a diagram showing the profile (measured values, calculated values, and fitting functions) of hydrogen in the depth direction when the accelerating voltage is 40 kV.

Accordingly, Models 2 to 4 will not be taken into consideration hereinafter. FIGS. 18 to 20 each show the calculation results obtained when irradiation with the hydrogen ion species (irradiation with 100,000 atoms for H) is performed using Models 1 and 5. FIGS. 18 to 20 also each show the hydrogen concentration (SIMS data) in an Si substrate irradiated with the hydrogen ion species of FIG. 15, and the simulation results fitted to the SIMS data (hereinafter referred to as a fitting function). Here, FIG. 18 shows the case where the accelerating voltage is 80 kV; FIG. 19, the case where the accelerating voltage is 60 kV; and FIG. 20, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the concentration of hydrogen atoms. The horizontal axis represents the depth from the surface of a Si substrate.

The fitting function is obtained using the calculation formula given below, in consideration of Models 1 and 5. Note that in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+:H_2^+:H_3^+$ is about 1:1:8), the contribution of $H_2^+$ (i.e., Model 3) should also be taken into consideration; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is highly likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not taken into consideration.

FIG. 21 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not taken into consideration and the calculation assumes amorphous Si, it can be said that values close to that of the ratio between ion species used for actual irradiation ($H^+:H_2^+:H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$, as shown in FIG. 15. For example, because $H_3^+$ splits into $H^+$, H, or the like to be introduced into a substrate, ion introduction efficiency can be improved compared with the case of irradiation mainly with $H^+$ or $H_2^+$. This leads to an improvement in semiconductor substrate production efficiency. In addition, because the kinetic energy of $H^+$ or H after $H_3^+$ splits similarly tends to be low, $H_3^+$ is suitable for manufacture of thin semiconductor layers.

Note that, in this specification, a method is described in which an ion doping apparatus that is capable of irradiation with the hydrogen ion species, as shown in FIG. 15 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion irradiation apparatus.

In irradiation of the rectangle sheet 206 with ions, a high dose of ions is needed; therefore, there are cases where the surface of the rectangle sheet 206 is roughened. Accordingly, a surface which is irradiated with ions is preferably provided with a protective layer having a thickness of 50 nm to 200 nm against ion irradiation so that the surface can be prevented from being damaged and from losing its planarity due to ion irradiation with an ion doping apparatus. Note that the silicon oxynitride layer and the silicon nitride oxide layer serve as a protective layer in this embodiment mode.

Then, a plurality of rectangle sheets 206 are arranged over the support substrate 210 and the sheets and the support substrate 210 are made in close contact with each other. FIG. 2D shows a cross section before two sheets are made in close contact with the support substrate 210. The support substrate 210 has an insulating property or an insulating surface, and glass substrates used for electronics industry (also referred to as a "non-alkali glass substrate") such as an aluminosilicate glass substrate, an aluminoborosilicate glass substrate, or a barium borosilicate glass substrate can be used. In other words, a glass substrate having a coefficient of thermal expansion of from $25 \times 10^{-7}/°$ C. to $50 \times 10^{-7}/°$ C. (preferably, from $30 \times 10^{-7}/°$ C. to $40 \times 10^{-7}/°$ C. and a strain point of from 580° C. to 680° C. (preferably, from 600° C. to 680° C.) can be used. In order to increase bonding strength, a second bonding layer 211 is preferably formed over the support substrate 210. In addition, surfaces which are to be in close contact with each other are preferably cleaned sufficiently.

In this embodiment mode, an example in which a glass substrate having a size of 600 mm×720 mm is used as the support substrate 210. As shown in FIG. 3C, the rectangle sheets 206 are efficiently arranged. FIG. 3C shows a top view of an example where 36 of the rectangle sheets 206 are arranged for one support substrate. Here, one display panel is manufactured using nine of the rectangle sheets 206 as one unit and four units are provided with a margin of 30 mm therebetween, but the present invention is not limited to the arrangement shown in FIG. 3C. Dividing lines of the support substrate are denoted by chain lines in FIG. 3C.

Figure 5:
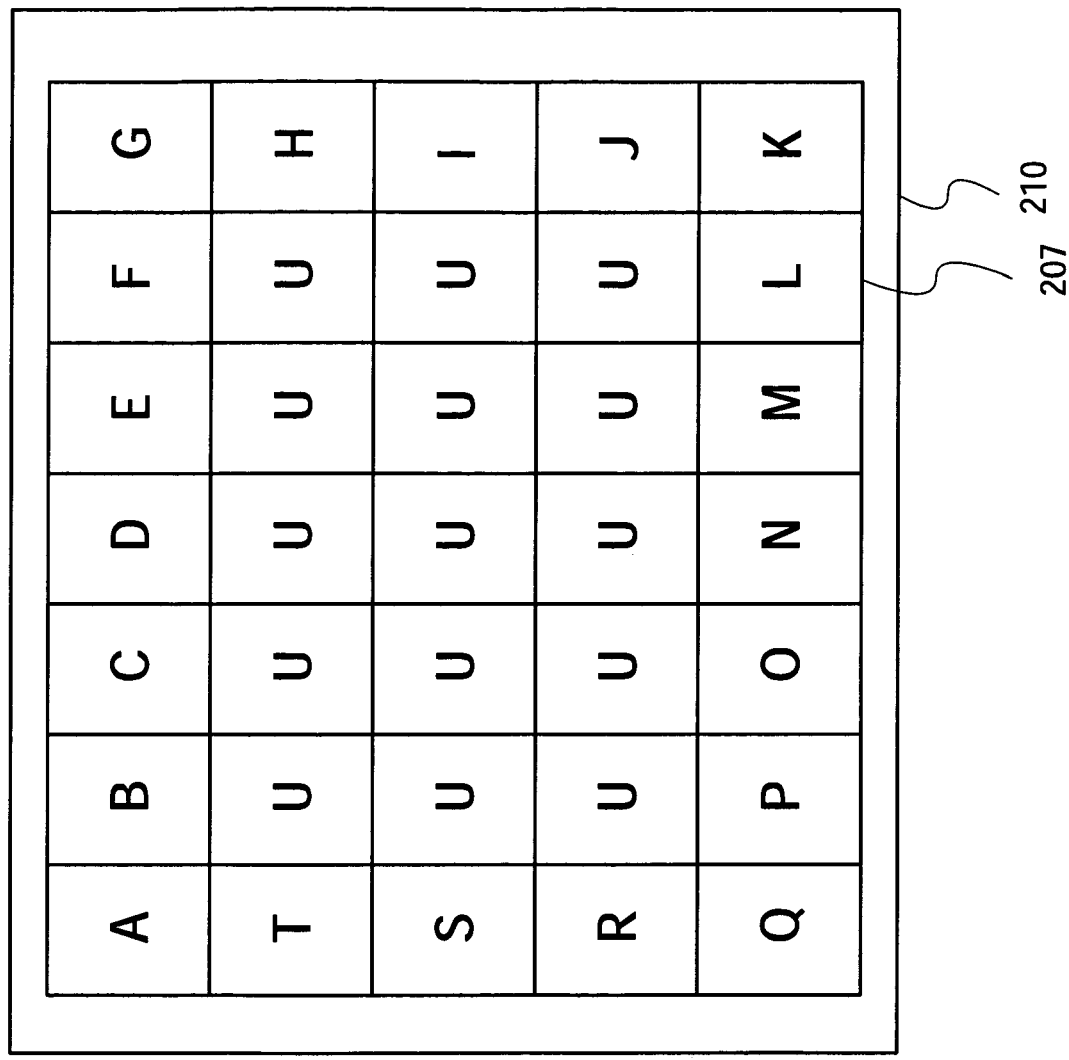
FIG. 5 is a top view illustrating arrangement of single-crystal semiconductor layers over a glass substrate.

In the case of manufacturing a semiconductor device with a large area display portion, for example, a display portion with a 15-inch diagonal line is manufactured using a glass substrate having a size of 600 mm×720 mm, 35 of the rectangle sheets 207 may be used as one unit for the support substrate 210 to form one display panel as is shown in FIG. 5. The rectangle sheet 207 in FIG. 5 corresponds to the rectangle sheet 207 shown in FIG. 3B. Further, in the case of a display portion with a large area, light exposure can be performed with a smaller number of masks than 36, in specific, 21 masks if a division light exposure method is employed.

Although no space is shown between nine sheets 206 which form one unit in FIG. 3C, actually there are gaps between the neighboring sheets due to positioning accuracy of the rectangle sheets 206. Positions of the single-crystal semiconductor layers are determined so that the generated gaps do not adversely affect a pixel circuit.

By making the rectangle sheet 206 and the support substrate 210 face each other and pressing at least one part thereof from the outside, the distance between the bonding surfaces is locally reduced. Accordingly, van der Waals force is increased and together with contribution of hydrogen bonding, the rectangle sheet 206 and the support substrate 210 attract each other so that they are partially bonded. Further, since the distance between the rectangle sheet 206 and the support substrate 210, which face each other, in an adjacent region is also reduced, a region in which van der Waals force strongly acts or a region which is influenced by hydrogen bonding is widened. Accordingly, bonding proceeds and spreads to the entire bonding surfaces. Pressing is performed so that pressure is applied perpendicular to the bonding surface, in consideration of the pressure resistance of the support substrate 210 and the rectangle sheet 206.

Thermal treatment is performed at a temperature at which the separation layer becomes fragile. Here, thermal treatment is performed at a temperature of lower than 400° C., preferably lower than 350° C., and more preferably, lower than 300° C. A change in volume of fine voids in the separation layer occurs by this thermal treatment. Distortion occurs in the separation layer, so that the sheet, which is a semiconductor substrate, becomes partially fragile along the separation layer. In addition, bonding strength of the bonding layer can be increased with this thermal treatment. Thermal treatment can be performed with a furnace for heating or laser beam irradiation. In the case of performing thermal treatment with laser irradiation, the rectangle sheets 206 can be heated through the support substrate. In addition, damage by hydrogen ion irradiation can be recovered with laser beam irradiation.

As for a laser beam, a gas laser typified by an excimer laser or a solid state laser typified by a YAG laser can be used as a light source. A wavelength of the laser beam is preferably in the range from ultraviolet wavelength to visible light wavelength and a wavelength of 190 to 700 nm is employed. The laser beam emitted from the light source is preferably converged to a rectangular or linear shape by an optical system, and irradiation may be performed by scanning the laser beam on an objective surface. Alternatively, flash lamp annealing which is performed using a halogen lamp, a xenon lamp, or the like may be employed for a similar object.

Parts 212 of the semiconductor substrates are separated from the support substrate 210 with the foregoing thermal treatment using the separation layer 208, which is a layer including hydrogen, or its surface as a boundary (also referred to as a cleavage plane), as shown in FIG. 2E. A laminate of a third bonding layer 213, the silicon nitride oxide layer 202, the silicon oxynitride layer 201, and a single-crystal semiconductor layer 214 in that order is formed over the support substrate 210. This single-crystal semiconductor layer 214 can also be referred to as an SOI layer. In addition, the support substrate having the SOI layer can be referred to as an SOI substrate. Note that a region in which the first bonding layer 203 and the second bonding layer 211 which are made in close contact and are bonded to each other is referred to as the third bonding layer 213.

Note that although FIGS. 2D to 2F show an example in which parts of the semiconductor substrates are separated after a plurality of sheets are bonded to the support substrate, the present invention is not limited thereto. After a first sheet is bonded to the support substrate, a part of the semiconductor substrate may be separated therefrom, then, a second sheet is bonded to the support substrate and a part of the semiconductor substrate may be separated therefrom, and a third and following sheets may also be treated in a similar manner.

Note that before the parts 212 of the semiconductor substrates are separated from the support substrate 210 using the separation layer or its surface as a boundary, a trigger is preferably made so that separation can be performed easily. Specifically, pretreatment is performed by which bonding strength between the separation layer and the SOI layer is selectively (partially) lowered, so that separation defects are reduced and a yield is improved. As typical pretreatment, impact of local pressure is applied to the rectangle sheet 206, a groove is formed in the support substrate 210 towards the separation layer with a laser beam or a dicer, or a groove is formed in the rectangle sheet 206 towards the separation layer with a laser beam or a dicer.

In order to form a favorable bond, the surfaces which form a bond are preferably activated. For example, surfaces which form a bond are irradiated with an atomic beam or an ion beam. When an atomic beam or an ion beam is used, an inert gas neutral atom beam or inert gas ion beam of argon or the like can be used. Alternatively, plasma irradiation or radical treatment is performed. Further, at least one of the bonding surfaces of the support substrate and the sheet may be treated with oxygen plasma or washed with ozone water to be hydrophilic. Such a surface treatment facilitates bonding between different kinds of materials even at a temperature of lower than 400° C.

After the support substrate which is in a state shown in FIG. 2E is obtained, a surface of the SOI layer is preferably subjected to CMP (chemical mechanical polishing) so as to be planarized. Further, the surface of the SOI layer may be planarized by irradiating the surface with a laser beam without using a physical polishing means such as CMP. Note that laser beam irradiation is preferably performed in a nitrogen atmosphere with an oxygen concentration of less than or equal to 10 ppm. This is because there is a possibility that the surface of the SOI layer is roughened when irradiation with a laser beam is performed in an oxygen atmosphere. CMP or the like may be performed in order to thin the SOI layer which is obtained.

Then, the single-crystal semiconductor layers 214 are patterned using a photolithography technique as shown in FIG. 2F to form a first island-shaped semiconductor layer 215 and a second island-shaped semiconductor layer 216. Note that a photolithography technique refers to a technique in which a resist is formed, light exposure is performed using a photomask for development, then etching is selectively performed using an obtained resist mask. In this embodiment mode, a stepper exposure apparatus is used and one shot of light exposure is performed per sheet. In other words, 36 shots of light exposure are performed on the support substrate shown in FIG. 3C. Each sheet is provided with an alignment marker and light exposure is performed with respect to each alignment marker. Since a size of the sheet and a light exposure size of one shot are approximately the same, positional displacement does not easily occur by light exposure when the alignment markers are used. If the light exposure size of one shot is much smaller than the size of the sheet, one shot of light exposure may be performed on a region including a boundary between two neighboring sheets. In this case, since there is actually a gap on the boundary between two sheets as shown in FIG. 2E, the position of light exposure is displaced by the gap. If the light exposure size of one shot is much larger than the size of the sheet, a position of light exposure may also be displaced.

Figure 4A:
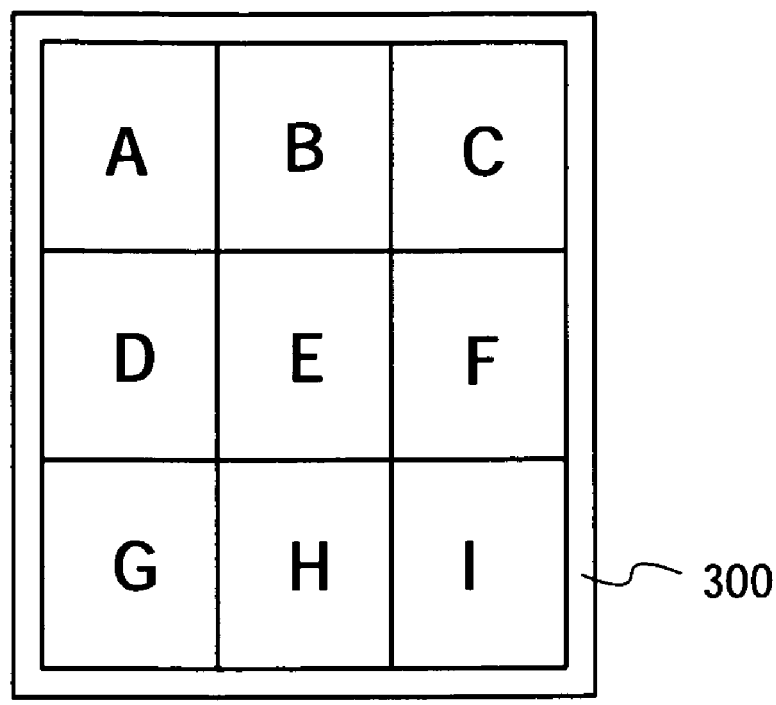
FIGS. 4A and 4B are top views illustrating manufacturing steps.

FIG. 4A shows an example in which the support substrate is cut along the dividing lines in FIG. 3C to obtain a substrate 300 having a size of 300 mm×360 mm provided with arranged nine sheets, and nine shots of light exposure are performed on the nine sheets using nine photomasks. Note that cutting is not necessarily performed before light exposure, and cutting may be performed after a switching element, a light emitting element, and the like are formed. Light exposure regions A to I which correspond to the sheets are exposed to light.

Here, an example is described in which a gap is generated between neighboring sheets due to positioning accuracy of the rectangle sheets 206. The single-crystal semiconductor layers are patterned so as to be retained in positions shown in FIG. 2F so that the generated gaps does not adversely affect a pixel circuit. In a pixel structure, the single-crystal semiconductor layer keeps a distance from a boundary between neighboring sheets, that is, a region 217 where the second bonding layer 211 is exposed, or a wiring is disposed in the region 217 where the second bonding layer 211 is exposed. The width of the region 217 is preferably set as small as possible, preferably, smaller than 10 μm. Although the region 217 seems to have some width in FIG. 2F, the width is quite small compared with the size of the support substrate. The boundary is shown as a boundary line 124 in FIG. 3C.

An example of a pixel structure is shown in FIG. 1. FIG. 1 is an enlarged top view of a part of a display portion having a light emitting element, in specific, six pixels. Note that for simplification, FIG. 1 shows only one of the electrodes (a pixel electrode) of a light emitting element and does not show a light emitting layer including an organic compound and the other electrode formed thereover.

In FIG. 1, a first semiconductor layer 101 serves as an active layer of a switching TFT; in which a region which overlaps with a gate wiring 113 serves as a channel formation region, a region which is connected to a source wiring 125 serves as a source region (or a drain region), and a region which is connected to a connection electrode 140 serves as the drain region (or the source region). The switching TFT has a single gate structure provided with one channel formation region. The switching TFT may have a multi gate structure provided with a plurality of channel formation regions in order to reduce off current.

A seventh semiconductor layer 107 serves as an active layer of a TFT which supplies current to a first light emitting element, and a region thereof which overlaps with a gate electrode 114 serves as a channel formation region. The gate electrode 114 of the TFT which supplies current to the first light emitting element is connected to the connection electrode 140. In addition, a source region (or a drain region) of the TFT which supplies current to the first light emitting element is connected to a power supply line 131, the drain region (or the source region) of the TFT which supplies current to the first light emitting element is connected to a connection electrode 141, and a pixel electrode 160 of the first light emitting element is electrically connected to the connection electrode 141. Further, the power supply line 131 is disposed over the gate electrode 114 to partially overlap with the gate electrode 114. A capacitor formed between the gate electrode 114 and the power supply line 131 can be utilized as a storage capacitor of the first light emitting element.

A periphery of the pixel electrode 160 of the first light emitting element is covered with an insulator called partition wall so as to prevent short circuit between neighboring pixel electrodes. A region of the pixel electrode 160 of the first light emitting element, which is not covered with the partition wall serves as a light emitting region 170 of the first light emitting element.

The foregoing first light emitting element is a pixel having a fundamental pixel structure. Such pixel structures are arranged in rows and columns to form a display portion. In a conventional display portion, one kind of pixel structure is used or three kinds of pixel structures which correspond to three primary colors for full color display are used. In the present invention, since a plurality of the rectangle sheets 206 are arranged over the support substrate 210 as shown in FIG. 3C, a pixel structure is set so that positional displacement in the boundary line 124 between neighboring sheets does not exceed an allowable range. In addition, a pixel structure is determined so that a semiconductor layer of an element is in a region which has a certain distance from an edge of the sheet because the side surface of the sheet is exposed when being processed into a rectangle or being carried and impurities may get into the sheet from the side surface. The pixel structure is set in accordance with this.

The pixel structure, which is shown in FIG. 1, is described below. Six light emitting elements are arranged in one direction. The boundary line 124 is positioned between a third light emitting element and a fourth light emitting element so as to overlap with a power supply line 133. In addition, the semiconductor layer of a TFT driving the third light emitting element which is next to the boundary line 124 is positioned to keep a distance equal to or longer than a distance M from the boundary line 124. The distance M is longer than a width X of a light emitting region 172 of the third light emitting element.

In a pixel structure of the third light emitting element, the light emitting region 172 is located between a source wiring 127 and the power supply line 133, but the semiconductor layer is not located between the source wiring 127 and the power supply line 133. A pixel electrode 162 of the third light emitting element is electrically connected to a ninth semiconductor layer 109 via a connection electrode 146 located between a source wiring 126 and a power supply line 132. In addition, the ninth semiconductor layer 109 has a channel formation region which overlaps with a gate electrode 116. In addition, the ninth semiconductor layer 109 is electrically connected to the power supply line 133 via a connection electrode 147 and a connection electrode 118. The gate electrode 116 is electrically connected to a third semiconductor layer 103 via a connection electrode 144. A capacitor formed between the gate electrode 116 and the power supply line 132 can be utilized as a storage capacitor of the third light emitting element. The third semiconductor layer 103 has a channel formation region which overlaps with the gate wiring 113. In addition, the third semiconductor layer 103 is electrically connected to the source wiring 127 via a connection electrode 145 and a connection electrode 117. Note that the connection electrode 117 and the connection electrode 118 are formed of the same material as the gate wiring 113 and are located below the power supply line 132 and the source wiring 127.

In addition, a light emitting region 171 of a second light emitting element is located between the source wiring 126 and the power supply line 132. A pixel electrode 161 of the second light emitting element is electrically connected to an eighth semiconductor layer 108 via a connection electrode 143. The eighth semiconductor layer 108 has a channel formation region which overlaps with a gate electrode 115. The ninth semiconductor layer 109 is electrically connected to the power supply line 132. The gate electrode 115 is electrically connected to a second semiconductor layer 102 via a connection electrode 142. A capacitor formed between the gate electrode 115 and the power supply line 132 can be utilized as a storage capacitor of the second light emitting element. The second semiconductor layer 102 has a channel formation region which overlaps with the gate wiring 113. The second semiconductor layer 102 is electrically connected to the source wiring 126.

In FIG. 1, the first light emitting element, the second light emitting element, and the third light emitting element, which are arranged in one direction are included in a region which is exposed to light by one shot using a common alignment marker. The fourth light emitting element, a fifth light emitting element, and a sixth light emitting element, which are arranged in one direction are included in a region which is exposed to light by one shot using a common alignment marker. Two shots of light exposure using different markers and photomasks are performed on the sides of the boundary line 124. Even if the positions of the light exposure of the two shots are displaced, the positional displacement can be within the allowable range with the pixel structure in FIG. 1 and a display portion can be manufactured.

In addition, the semiconductor layer of a TFT driving the fourth light emitting element which is next to the boundary line 124 is positioned to keep a distance equal to or larger than the distance N from the boundary line 124. The distance N is longer than the width X of a light emitting region 173 of the fourth light emitting element.

The gap between the power supply line 133 which overlaps with the boundary line 124 and a power supply line 134 which is next to the power supply line 133 is referred to as a gap Y. The distance M is longer than the gap Y, and the distance N is longer than the gap Y.

In a pixel structure of the fourth light emitting element, the light emitting region 173 is located between a source wiring 128 and the power supply line 134, but the semiconductor layer is not located between the source wiring 128 and the power supply line 134. A pixel electrode 163 of the fourth light emitting element is electrically connected to a tenth semiconductor layer 110 via a connection electrode 151 located between a source wiring 129 and a power supply line 135. The tenth semiconductor layer 110 has a channel formation region which overlaps with a gate electrode 120. The tenth semiconductor layer 110 is electrically connected to the power supply line 134 via a connection electrode 150 and a connection electrode 121. The gate electrode 120 is electrically connected to a fourth semiconductor layer 104 via a connection electrode 149. A capacitor formed between the gate electrode 120 and the power supply line 134 can be utilized as a storage capacitor of the fourth light emitting element. The fourth semiconductor layer 104 has a channel formation region which overlaps with the gate wiring 113. In addition, the fourth semiconductor layer 104 is electrically connected to the source wiring 128 via a connection electrode 148 and a connection electrode 119. Note that the connection electrode 121 and the connection electrode 119 are formed of the same material as the gate wiring 113 and are located below the power supply line 134 and the source wiring 129.

In addition, a light emitting region 174 of the fifth light emitting element is located between the source wiring 129 and the power supply line 135. A pixel electrode 164 of the fifth light emitting element is electrically connected to an eleventh semiconductor layer 111 via a connection electrode 153. The eleventh semiconductor layer 111 has a channel formation region which overlaps with a gate electrode 122. The eleventh semiconductor layer 111 is electrically connected to the power supply line 135. The gate electrode 122 is electrically connected to a fifth semiconductor layer 105 via a connection electrode 152. A capacitor formed between the gate electrode 122 and the power supply line 135 can be utilized as a storage capacitor of the fifth light emitting element. The fifth semiconductor layer 105 has a channel formation region which overlaps with the gate wiring 113. The fifth semiconductor layer 105 is electrically connected to the source wiring 129.

The sixth light emitting element has the same structure as the first light emitting element. A light emitting region 175 of the sixth light emitting element is located between a source wiring 130 and a power supply line 136. A pixel electrode 165 of the sixth light emitting element is electrically connected to a twelfth semiconductor layer 112 via a connection electrode 155. The twelfth semiconductor layer 112 has a channel formation region which overlaps with a gate electrode 123. The twelfth semiconductor layer 112 is electrically connected to the power supply line 136. The gate electrode 123 is electrically connected to a sixth semiconductor layer 106 via a connection electrode 154. A capacitor formed between the gate electrode 123 and the power supply line 136 can be utilized as a storage capacitor of the sixth light emitting element. The sixth semiconductor layer 106 has a channel formation region which overlaps with the gate wiring 113. The sixth semiconductor layer 106 is electrically connected to the source wiring 130.

In FIG. 1, the gap between the eighth semiconductor layer 108 and the fourth semiconductor layer 104, which are located with the boundary line 124 therebetween, is M+N. The cross-sectional view in FIG. 2F also shows that the gap between the first island-shaped semiconductor layer 215 and the second island-shaped semiconductor layer 216 is the distance (M+N).

Note that the foregoing semiconductor layers refer to the single-crystal semiconductor layers which are obtained by patterning the rectangle sheets 206.

Figure 4B:
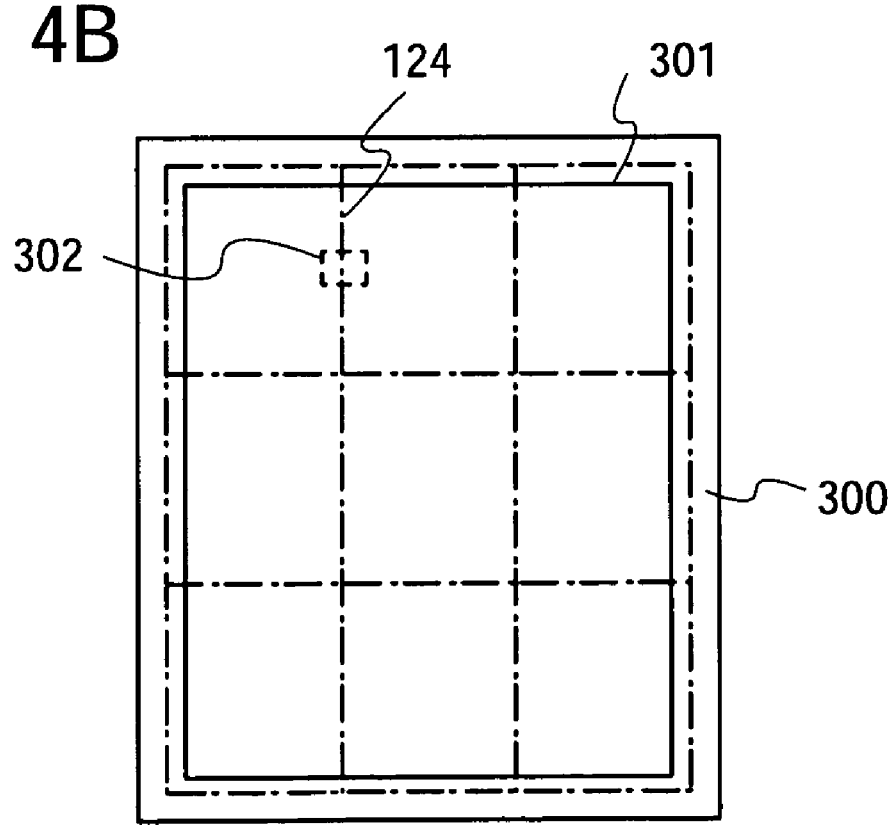

Note that the top view of the pixel structure in FIG. 1 is an enlarged view of a region 302 which is surrounded by a dotted line in FIG. 4B. The region 302 is a part of a display portion 301 of a panel which is formed over the substrate 300. In addition, the region 302 includes a boundary between two neighboring sheets. The region 302 includes the boundary between the light exposure region A and the light exposure region B.

While FIG. 1 shows an example in which a storage capacitor is formed between a gate electrode and a power supply line, the storage capacitor may be a capacitor which uses a semiconductor layer as an electrode or a memory (e.g., an SRAM or a DRAM) which uses a semiconductor layer. In that case, for example, the semiconductor layer is also positioned to keep the distance N or the distance M from the boundary line 124.

In addition, in the case of forming a display portion and a drive circuit over the same substrate, for example, a semiconductor layer which is included in a CMOS circuit is also positioned to keep the distance N or the distance M from the boundary line 124.

Note that the pixel structure in FIG. 1 is an example and it is needless to say that a structure is not limited thereto as long as a semiconductor layer is not disposed adjacent to the boundary line 124. The smallest gap between two semiconductor layers which are located with the boundary line 124 therebetween may be larger than at least the distance Y, preferably twice as large as the width X.

Note that each of the pixel units which are arranged is also referred to as a unit cell. The width of the unit cell corresponds to the gap Y. FIG. 1 can also be described as that unit cells of the same width are arranged in one direction. In FIG. 1, two TFTs are located in a first unit cell including the first light emitting element, four TFTs are located in a second unit cell including the second light emitting element, and no TFT is located in a third unit cell including the third light emitting element. It is one aspect of the present invention that a plurality of unit cells which are evenly spaced include unit cells in which different numbers of TFTs are provided.

While FIG. 1 shows an example in which four TFTs are located in the second unit cell, one of the TFTs may be located in the first unit cell and three TFTs may be located in the first unit cell. Note that although FIG. 1 shows an example in which the semiconductor layer is located between the power supply line and the source wiring, the present invention is not limited thereto. A pixel structure in which a TFT includes a semiconductor layer which overlaps with the power supply line or the source wiring may be employed.

Further, a structure in which a plurality of (five or more) TFTs or various circuits (e.g., a current mirror circuit) are incorporated with a pixel may be employed.

In the case of forming a display portion capable of full color display, the first and fourth light emitting elements may be provided as red light emitting elements, the second and fifth light emitting elements may be provided as blue light emitting elements, and the third and sixth light emitting elements are provided as green light emitting elements. Alternatively, a display portion capable of full color display may be manufactured using four kinds of light emitting element, which include white light emitting elements as well as three kinds of light emitting elements.

While FIG. 1 shows a pixel structure in which the source wiring and the power supply line are parallel and the power supply line and the gate wiring intersect, the present invention is not limited thereto. For example, a pixel structure in which the gate wiring and the power supply line are parallel and the power supply line and the source wiring intersect may be employed.

Note that while FIG. 1 shows an example in which the semiconductor layers are not located in the unit cells which are next to each other with the boundary line 124 therebetween, the semiconductor layers may be located in the unit cells which are next to each other with the boundary line 124 therebetween when positioning accuracy of the rectangle sheets 206 is high and the gap Y, which is the width of one unit cell, is sufficiently large in accordance with the positioning accuracy. For example, TFTs including a semiconductor layer may be located adjacent to the source wiring 127 and adjacent to the power supply line 134.

Since this embodiment mode describes an active matrix light emitting device as an example, a pixel structure is partially complicated. The present invention can also be applied to an active matrix liquid crystal display device, in which only one TFT is located in one unit cell. In that case, for example, a structure may be employed, in which one TFT is located in a first unit cell including a first liquid crystal element, two TFTs are located in a second unit cell including a second liquid crystal element, and no TFT is located in a third unit cell including a third liquid crystal element and in a fourth unit cell including a fourth liquid crystal element. Note that the boundary line 124 is positioned between a pixel electrode of the third liquid crystal element and a pixel electrode of the fourth liquid crystal element.

Note that while FIG. 1 describes the region 302 of two sheets which are arranged in a short side direction of the substrate 300 as shown in FIG. 4B, it is needless to say that two sheets which are arranged in a long side direction of the substrate 300 have similar problems, that is, positional displacement of attachment or contamination by impurities from side surfaces. Although not shown here, a pixel structure is determined so that in two sheets which are arranged in the long side direction of the substrate 300, semiconductor layers of elements are located in a region which has a certain distance from an edge of the sheet. For example, a gate wiring overlaps with a boundary line between the two sheets which are arranged in the long side direction of the substrate 300.

Through the foregoing steps, a semiconductor device having a display portion which has an area larger than a semiconductor substrate can be manufactured using a plurality of semiconductor substrates.

In addition, although an example in which top gate TFTs are used is described, the present invention can be applied regardless of TFT structure. For example, the present invention can be applied to a semiconductor device including bottom gate TFTs (inverse staggered TFTs) or staggered TFTs.

Embodiment Mode 2

This embodiment mode describes a method for manufacturing an SOI substrate which includes steps different from the steps in FIGS. 2A to 2F below.

Figure 6A:
FIGS. 6A to 6F are cross-sectional views illustrating manufacturing steps.

In FIG. 6A, a p-type or an n-type single crystal silicon substrate (silicon wafer) is typically used as a semiconductor substrate 400.

Then, the semiconductor substrate 400 is ground or cut so as to be a rectangle sheet 406.

Then, degreasing washing is performed on the sheet 406 and an oxide film on the surface is removed and thermal oxidation is performed. As thermal oxidation, normal dry oxidation may be performed; however, oxidation in an oxidation atmosphere in which a halogen is added is preferably performed. For example, thermal treatment is performed at a temperature of equal to or higher than 700° C. in an atmosphere containing HCl at 0.5 to 10 volume % (preferably 3 volume %) with respect to oxygen. Preferably, thermal oxidation may be performed at a temperature of 950 to 1100° C. The processing time may be 0.1 to 6 hours, preferably 0.5 to 1 hour. The film thickness of the oxide film, which is formed, is 10 to 1000 nm (preferably 50 to 200 nm), for example, 100 nm.

In stead of HCl, one or plural kinds selected from HF, $NF_3$, HBr, $Cl_2$, $ClF_3$, $BCl_3$, $F_2$, or $Br_2$, can be used as a material including a halogen.

When heat treatment is performed within such a temperature range, a gettering effect by a halogen element can be obtained. Gettering particularly has an effect of removing a metal impurity. In other words, an impurity such as metal is turned into a volatile chloride, moved into the air, and removed by action of chlorine. Oxidation with a halogen is preferably effective if being carried out on the semiconductor substrate 400 having its surface subjected to chemical mechanical polishing (CMP) treatment. Hydrogen has action of compensating defects in an interface between the sheet and an oxide film so as to lower a localized-level density at the interface.

An oxide layer 401 which is formed through this thermal treatment can include a halogen. When halogen elements are included at a concentration of $1 \times 10^{17}/cm^3$ to $5 \times 10^{20}/cm^3$, the oxide film can serve as a protective film which captures an impurity such as metal and prevent contamination of the sheet.

Then, a blocking layer 402 is formed over the oxide layer 401. As the blocking layer 402, a silicon nitride film or a silicon nitride oxide film is formed to have a thickness of 50 nm to 200 nm. For example, a silicon nitride film is formed using $SiH_4$ and $NH_3$ as a source gas by a plasma CVD method. A silicon nitride oxide film is formed using $SiH_4$, $N_2O$, and $NH_3$ as a source gas by a plasma CVD method. The blocking layer 402 exhibits a function of preventing diffusion of impurities into a single crystal semiconductor layer formed from the sheet 406. In addition, in formation of the separation layer, the blocking layer 402 has a function of preventing planarity from being lost due to damages to the surface of the semiconductor substrate by ion irradiation.

Figure 6B:
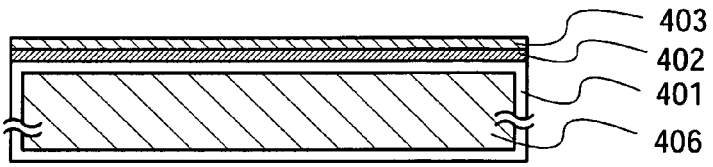

Then, a first bonding layer 403 is formed over the blocking layer 402, as shown in FIG. 6B. A silicon oxide layer is preferably used as the first bonding layer 403. A thickness of the silicon oxide layer is 10 to 200 nm, preferably 10 to 100 nm, more preferably, 20 to 500 nm. A silicon oxide layer which is formed by a chemical vapor deposition method using an organic silane gas is preferably used as the silicon oxide layer. Examples of an organic silane gas that can be used include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$). Alternatively, a silicon oxide layer which is formed by a chemical vapor deposition method using a silane gas can be used. Film formation by a chemical vapor deposition method is performed at a temperature, for example, equal to or lower than 350° C., at which degassing of a separation layer that is formed in a later step does not occur. Thermal treatment for separation of a single-crystal semiconductor layer from a single-crystal or polycrystalline semiconductor substrate is performed at a higher temperature than a film formation temperature of the first bonding layer 403.

Figure 6C:
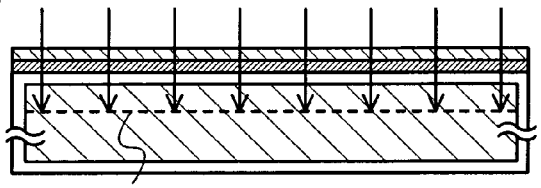

Then, as shown in FIG. 6C, a surface of the semiconductor substrate covered with the first bonding layer 403 is irradiated with ions that are accelerated by an electric field so that ions reach a predetermined depth from the surface to form a separation layer 408. Ion irradiation is preferably performed with an ion doping apparatus. In other words, a doping method in which irradiation with plural ion species generated by making a source gas into plasma is performed without mass separation, is employed. Different from a method using an ion implantation apparatus in which dot sequential scanning is carried out, an irradiation method with an ion doping apparatus can irradiate a large irradiation surface. In the ion doping, the accelerating voltage may be from 10 kV to 100 kV, preferably from 30 kV to 80 kV; the dose may be from $1 \times 10^{16}/cm^2$ to $4 \times 10^{16}/cm^2$; and the beam current density may be equal to or grater than 2 $\mu A/cm^2$, preferably equal to or greater than 5 $\mu A/cm^2$, and more preferably equal to or greater than 10 $\mu A/cm^2$. By irradiation with ions, defects generated in the semiconductor layer can be reduced.

Note that the oxide layer 401 includes a halogen element at a concentration of $1 \times 10^{17}/cm^3$ to $5 \times 10^{20}/cm^3$, and has a function of blocking elements which are impurities in ion irradiation. In hydrogen ion irradiation, heavy metal elements which originate from a material of an inner wall of a chamber or an electrode material may be added to a semiconductor substrate and contaminate a surface of the semiconductor substrate. In order to reduce effect of surface contamination, the surface may be thinly removed by wet etching or dry etching. In addition, since the heavy metal elements which originate from a material of an inner wall of a chamber or an electrode material is added to a region above a region of hydrogen ions in the semiconductor substrate, it is effective to form the oxide layer 401 including a halogen on a surface of the semiconductor substrate. If thermal treatment is performed after heavy metal elements are added to the oxide layer 401, a halogen in the oxide layer 401 is reacted with the heavy metal elements, so that the heavy metal elements do not diffuse. When a thermal oxide film including a halogen is formed, improvement in electrical characteristics, such as reduction in off current can be achieved in the switching element using a single-crystal semiconductor layer.

Note that although this embodiment mode describes an example in which the separation layer 408 is formed after the first bonding layer 403 is formed, the present invention is not limited thereto. The blocking layer 402 and the first bonding layer 403 may be formed after the separation layer 408 is formed. If such a process is employed, the blocking layer 402 and the first bonding layer 403 can be successively formed without being exposed to the atmosphere; accordingly, contamination by foreign body, potassium, sodium or the like can be prevented.

Further, although an example in which the oxide layer 401 is formed after the semiconductor substrate 400 is processed into a rectangle has been described, the present invention is not particularly limited thereto. The semiconductor substrate 400 may be processed into a rectangle after the oxide layer 401 is formed. Alternatively, the semiconductor substrate 400 may be processed into a rectangle before the blocking layer 402 is formed or the semiconductor substrate 400 may be processed into a rectangle before the first bonding layer 403 is formed.

Figure 6D:
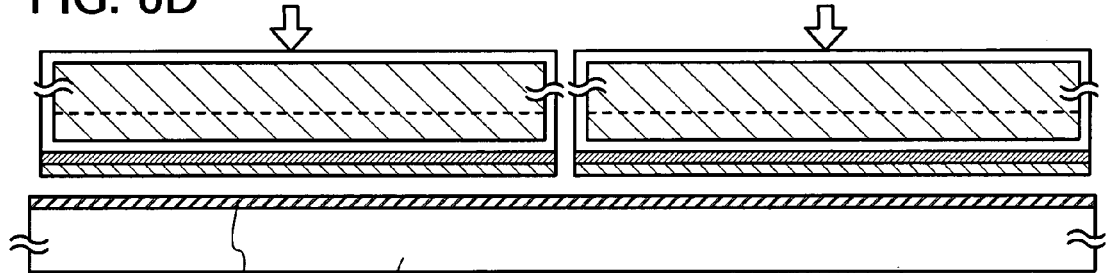

Then, a plurality of rectangle sheets 406 are arranged over a support substrate 410 and the sheets and the support substrate 410 are made in close contact with each other. FIG. 6D shows a cross section before two sheets are made in close contact with the support substrate 410. The support substrate 410 has an insulating property or an insulating surface. In order to increase bonding strength, a second bonding layer 411 is preferably formed over the support substrate 410. In addition, surfaces which are to be in close contact with each other are preferably cleaned sufficiently.

By making the sheet 406 and the support substrate 410 face each other and pressing one part thereof from the outside, the distance between the bonding surfaces is locally reduced. Accordingly, van der Waals force is increased and together with contribution of hydrogen bonding, the sheet 406 and the support substrate 410 attract each other so that they are partially bonded. Further, since the distance between the sheet 406 and the support substrate 410, which face each other, in an adjacent region is also reduced, a region in which van der Waals force strongly acts or a region which is influenced by hydrogen bonding is widened. Accordingly, bonding proceeds and spreads to the entire bonding surfaces. Pressing is performed so that pressure is applied perpendicular to the bonding surface, in consideration of the pressure resistance of the support substrate 410 and the sheet 406.

In addition, thermal treatment is performed at a temperature at which the separation layer becomes fragile and which is lower than a temperature at which separation is carried out using the separation layer 408 or its surface as a boundary. Here, thermal treatment is performed at a temperature of lower than 400° C., preferably lower than 350° C., and more preferably, lower than 300° C. A change in volume of fine voids in the separation layer occurs by this thermal treatment. Distortion occurs in the separation layer 408, so that the sheet, which is a semiconductor substrate, becomes partially fragile along the separation layer 408. Thermal treatment can be performed with a furnace for heating or laser beam irradiation. In the case of performing thermal treatment with laser beam irradiation, the sheets 406 can be heated through the support substrate. Therefore, in irradiation with a laser beam, defects which are included in a region which is to be a single-crystal semiconductor layer later (defects which is formed in hydrogen ion irradiation) can be recovered.

Figure 6E:
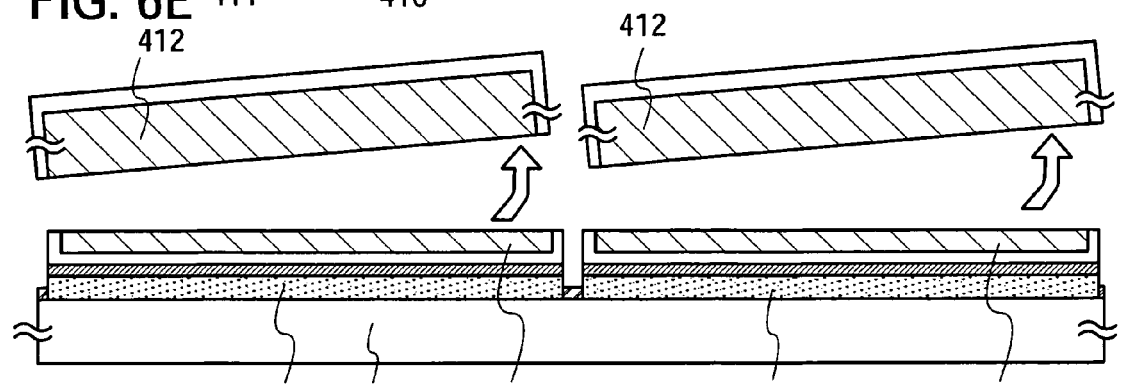

Parts 412 of the semiconductor substrates are separated from the support substrate 410 with either one or both pressure treatment and thermal treatment, which are described above, using the separation layer 408 or its surface as a boundary, as shown in FIG. 6E. A laminate of a third bonding layer 413, the blocking layer 402, the oxide layer 401, and a single-crystal semiconductor layer 414 in that order is formed over the support substrate 410. This single-crystal semiconductor layer 414 can also be referred to as an SOI layer. Note that a region in which the first bonding layer 403 and the second bonding layer 411 are made in close contact and are bonded to each other is referred to as a third bonding layer 413.

Figure 6F:
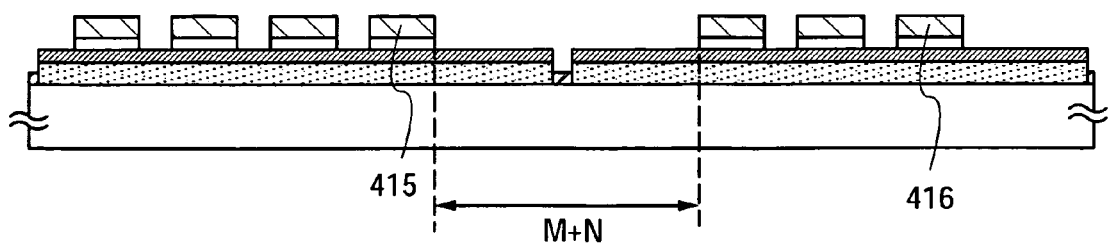

Note that although FIGS. 6D to 6F show an example in which parts of the semiconductor substrates are separated after a plurality of sheets are bonded to the support substrate, the present invention is not limited thereto. After a first sheet is bonded to the support substrate, a part of the semiconductor substrate may be separated therefrom, then, a second sheet is bonded to the support substrate, and a part of the semiconductor substrate may be separated therefrom, and a third and following sheets may also be treated in a similar manner.

Note that before the parts 412 of the semiconductor substrates are separated from the support substrate 410 using the separation layer or its surface as a boundary, a trigger is preferably made so that separation can be performed easily.

In order to form a favorable bond, the surfaces which form a bond are preferably activated. For example, surfaces which form a bond are irradiated with an atomic beam or an ion beam. When an atomic beam or an ion beam is used, an inert gas neutral atom beam or inert gas ion beam of argon or the like can be used. Alternatively, plasma irradiation or radical treatment is performed. Further, at least one of the bonding surfaces of the support substrate and the sheet may be treated with oxygen plasma or washed with ozone water to be hydrophilic. Such a surface treatment facilitates bonding between different kinds of materials even at a temperature of lower than 400° C.

After the support substrate which is in a state shown in FIG. 6E is obtained, a surface of the SOI layer is preferably subjected to CMP (chemical mechanical polishing) so as to be planarized. Further, the surface of the SOI layer may be planarized by irradiating the surface with a laser beam. Note that laser beam irradiation is preferably performed in a nitrogen atmosphere with an oxygen concentration of less than or equal to 10 ppm. This is because there is a possibility that the surface of the SOI layer is roughened when irradiation with a laser beam is performed in an oxygen atmosphere. CMP or the like may be performed in order to thin the SOI layer which is obtained.

Then, the single-crystal semiconductor layers 414 are patterned using a photolithography technique as shown in FIG. 6F to form a first island-shaped semiconductor layer 415 and a second island-shaped semiconductor layer 416.

Further, there actually is a gap generated between neighboring sheets due to positioning accuracy of the sheets 406. The single-crystal semiconductor layer are patterned so as to be retained in positions shown in FIG. 6F so that the generated gaps do not adversely affect a pixel circuit. In a pixel structure, the single-crystal semiconductor layer keeps a distance from a boundary between neighboring sheets, that is, a region 417 where the second bonding layer 411 is exposed, or a wiring is disposed in the region 417 where the second bonding layer 411 is exposed.

The pixel structure which is the same as the one described in Embodiment Mode 1 and shown in FIG. 1 can be used.

The gap between the first island-shaped semiconductor layer 415 and the second island-shaped semiconductor layer 416 is expressed as the distance (M+N), as is shown in the cross-sectional view in FIG. 6F.

This embodiment mode can be freely combined with Embodiment Mode 1.

Embodiment Mode 3

This embodiment mode describes an example in which a semiconductor device is manufactured using a plurality of single-crystal semiconductor layers which are disposed over a support substrate, which are manufactured according to Embodiment Mode 1 or Embodiment mode 2.

A semiconductor device having a light emitting element can be formed according to the present invention, and the light emitting element emits light by any one of bottom emission, top emission, or dual emission. This embodiment mode describes an example of a method for manufacturing a semiconductor device with high yield, in which a semiconductor device having a display function (also referred to as a display device or a light emitting device) is manufactured as a bottom-emission, dual-emission, or top-emission semiconductor device with high performance and high reliability, with reference to FIGS. 7A, 7B, and 8.

First, island-shaped single-crystal semiconductor layers are formed over a support substrate 600, which is a glass substrate, according to Embodiment Mode 1. Note that since details of the method are described in Embodiment Mode 1, they are omitted here and the method is described briefly.

Here, the support substrate 600 over which a first silicon nitride oxide layer 601 is formed and a first bonding layer is formed over the first silicon nitride oxide layer 601 is prepared. In addition, a semiconductor substrate is prepared over which a laminate 603 of a silicon oxynitride layer and a silicon nitride oxide layer formed over the silicon oxynitride layer is formed, and a second bonding layer is formed thereover. Note that at least two semiconductor substrates are prepared per support substrate and each of the semiconductor substrates are processed into rectangles and includes a separation layer formed therein. Then, the support substrate and the semiconductor substrates are attached to each other so that the first bonding layer and the second bonding layer are bonded to each other. When the first bonding layer and the second bonding layer are bonded to each other, the interface therebetween becomes unclear; therefore, the first and the second bonding layers are shown as a bonding layer 604 in FIGS. 7A and 7B.

Then, parts of the semiconductor substrates are separated from the support substrate 600 using the separation layer or its surface as a boundary to form single-crystal semiconductor layers over the support substrate 600. Then, the single-crystal semiconductor layers are etched using a photolithography technique to form island-shaped single-crystal semiconductor layers. As in Embodiment Mode 1, a stepper exposure apparatus is used in this embodiment mode and light exposure of one shot is carried out in a manner such that a light exposure area is approximately the same as the area of one rectangle semiconductor substrate (also referred to as a sheet). Note that positions of the island-shaped single-crystal semiconductor layers are also determined according to Embodiment Mode 1.

Here, an example is described in which bonding is carried out according to Embodiment Mode 1. In the case of a semiconductor device is formed according to Embodiment Mode 2 instead of Embodiment Mode 1, a thermal oxide film including a halogen element is formed in contact with the single-crystal semiconductor layer between the boning layer 604 and the single-crystal semiconductor layer.

Then, a gate insulating layer 607 covering an island-shaped single-crystal semiconductor layer is formed. The gate insulating layer 607 is formed of an insulating film including silicon with a thickness of 10 to 150 nm which is formed by a plasma CVD method, a sputtering method, or the like. The gate insulating layer 607 may be formed by using a material such as an oxide material or nitride material of silicon, typified by silicon nitride, silicon oxide, silicon oxynitride, or silicon nitride oxide, and may have a laminate structure or a single-layer structure. Further, the gate insulating layer 607 may be a stacked layer of three layers including a silicon nitride film, a silicon oxide film, and a silicon nitride film. Preferably, a silicon nitride film with dense film quality may be used. A thin silicon oxide film with a thickness of 1 to 100 nm, preferably 1 to 10 nm, and more preferably 2 to 5 nm may be formed between the single-crystal semiconductor layer and the gate insulating layer. As a method for forming a thin silicon oxide film, the surface of the semiconductor region is oxidized by a GRTA method, an LRTA method, or the like to form a thermal oxide film, so that a thin silicon oxide film can be formed. Noted that a rare gas element such as argon may be contained in a reaction gas and be mixed into an insulating film to be formed in order to form a dense insulating film having little gate leak current at a low film formation temperature.

Next, a first conductive film having a thickness of 20 to 100 nm and a second conductive film having a thickness of 100 to 400 nm, which serves as a gate electrode layer or a connection electrode, are stacked over the gate insulating layer 607. The first conductive film and the second conductive film can be formed by a sputtering method, an evaporation method, a CVD method, or the like. The first conductive film and the second conductive film may be formed of an element selected from tantalum (Ta), tungsten (W), titanium (Ti), molybdenum (Mo), aluminum (Al), copper (Cu), chromium (Cr), or neodymium (Nd), or an alloy material or a compound material including any of those elements as a main component. A semiconductor film typified by a polycrystalline silicon film that is doped with an impurity element such as phosphorus or an AgPdCu alloy may also be used as the first conductive film and the second conductive film. The conductive film is not limited to the two-layer structure, and for example, may have a three-layer structure in which a tungsten film of 50 nm thick as a first conductive film, an aluminum-silicon alloy (Al-Si) film of 500 nm thick as a second conductive film, and a titanium nitride film of 30 nm thick as a third conductive film are sequentially stacked. In a case of a three-layer structure, tungsten nitride may be used instead of tungsten as the first conductive film; an aluminum-titanium alloy (Al—Ti) film may be used instead of an aluminum-silicon alloy (Al—Si) film as the second conductive film; or a titanium film may be used instead of a titanium nitride film as the third conductive film. Note that, a single-layer structure may be used.

Then, a photolithography method is employed to form a mask formed of a resist and to process the first conductive film and the second conductive film into a desired shape. Etching can be performed by an inductively coupled plasma (ICP) etching method by adjusting etching conditions (the amount of electric power applied to a coil-shaped electrode, the amount of electric power applied to an electrode layer on a substrate side, an electrode temperature on a substrate side, and the like) as appropriate so that the first conductive film and the second conductive film have a desired taper shape. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate. In this embodiment mode, the second conductive film is etched using an etching gas containing $CF_4$, $Cl_2$, and $O_2$, and the first conductive film is successively etched using an etching gas containing $CF_4$ and $Cl_2$.

Figure 7A:
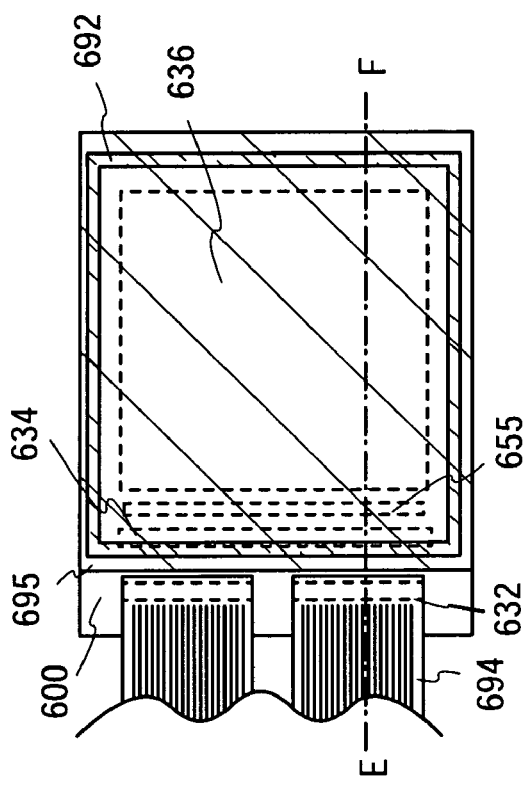
FIG. 7A is a top view and FIG. 7B is a cross-sectional view illustrating a structure of an active matrix EL display device.
Figure 7B:
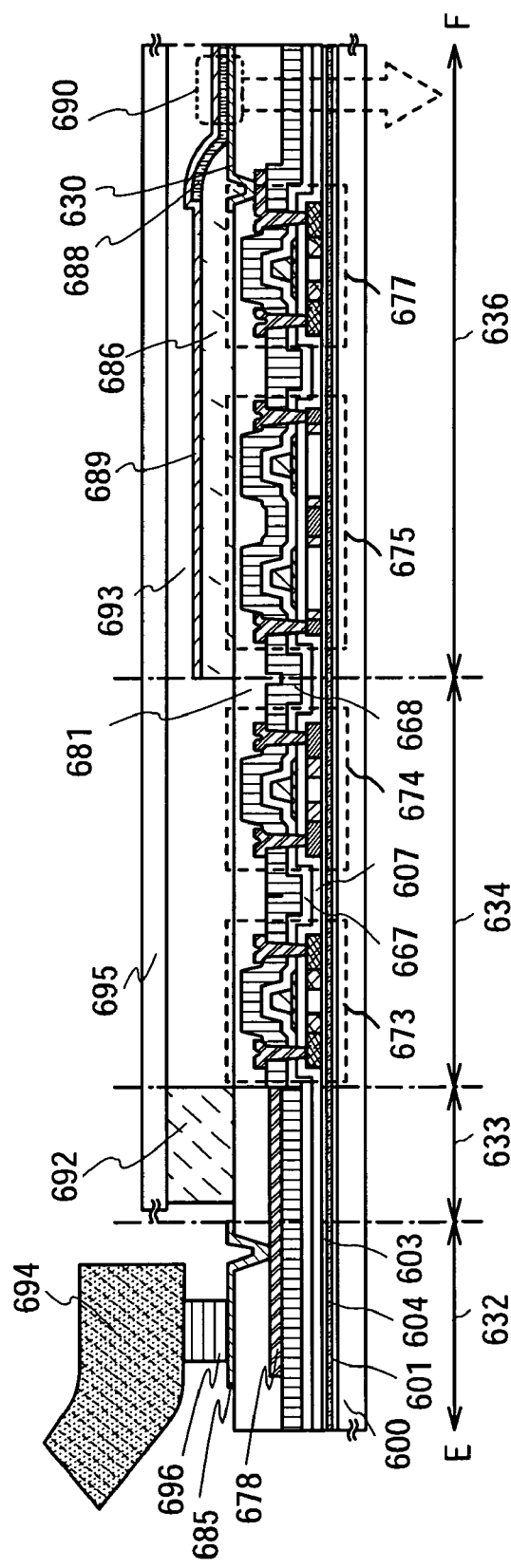

Then, the second conductive film is further processed to have a taper angle larger than a taper angle of a side surface of the first conductive film using the mask formed of a resist which is used in the foregoing etching process. In this embodiment mode, $Cl_2$, $SF_6$, and $O_2$ are used as an etching gas for forming a conductive layer having a tapered shape. With a tapered shape, coverage of a film to be stacked thereover is improved and a defect is reduced, and thus, reliability is improved. Thus, an electrode having a shape shown in FIGS. 7A and 7B is formed, that is, an electrode in which a second conductive film having a smaller width than the first conductive film and has a tapered angle on its side surface is provided over the first conductive film is formed. This electrode is formed over the island-shaped single-crystal semiconductor layer and serves as a gate electrode or a connection electrode for connection with another wiring.

Note that the shape of the gate electrode is not limited to the one shown in FIGS. 7A and 7B. The gate electrode may have a single-layer structure or an electrode structure having a sidewall structure on its side wall.

Then, a first n-type impurity region is formed by adding an impurity element imparting n-type conductivity using the electrode having a tapered shape as a mask. In this embodiment mode, doping is performed using phosphine ($PH_3$) as a doping gas containing an impurity element (the doping gas is $PH_3$ diluted with hydrogen ($H_2$), and the $PH_3$ rate in the gas is 5%). Phosphorus (P) is used as an impurity element imparting n-type conductivity in this embodiment mode.

In this embodiment mode, regions in impurity regions, which overlap with the gate electrode layers with the gate insulating layer interposed therebetween, are referred to as Lov regions. Further, regions in impurity regions, which do not overlap with the gate electrode layers with the gate insulating layer interposed therebetween, are referred to as Loff regions. In FIGS. 7A and 7B, the impurity regions are shown by hatching and blank spaces (or dotted hatching). This does not mean that the blank spaces are not doped with impurity elements, but makes it easy to understand that the concentration distribution of the impurity element in these regions reflects the mask and doping condition. Note that the same can be said for the other drawings of this specification.

Then, a mask which covers parts of a single-crystal semiconductor layer which is to be included in a p-channel TFT and a single-crystal semiconductor layer which is to be included in a switching TFT in a pixel portion is formed. Then, a second n-type impurity region is formed by adding an impurity element imparting n-type conductivity. In this embodiment mode, doping is performed using $PH_3$ as a doping gas containing an impurity element (the doping gas is $PH_3$ diluted with hydrogen ($H_2$), and the $PH_3$ rate in the gas is 5%). The second n-type impurity region is a high concentration n-type impurity region which functions as a source or drain. A third n-type impurity region which is doped through the first conductive film is a low concentration impurity region which functions as a lightly doped drain (LDD) region. The third n-type impurity region is an Lov region, which can relieve an electric field around a drain and suppress deterioration of an on current due to hot carriers.

Then, the mask formed of a resist is removed and a mask formed of a resist which covers a single-crystal semiconductor layer which is to be included in an n-channel TFT is formed. Then, a p-type impurity region is formed by adding an impurity element imparting p-type conductivity. Since boron (B) is used as an impurity element in this embodiment mode, doping is performed with an ion doping apparatus and using diborane ($B_2H_6$) as a doping gas containing an impurity element (the doping gas is $B_2H_6$ diluted with hydrogen ($H_2$), and the $B_2H_6$ rate in the gas is 15%). The p-type impurity region is a high concentration p-type impurity region which functions as a source or drain.

The mask formed of a resist is removed by $O_2$ ashing or using a resist stripping solution, and an oxide film is also removed. After that, an insulating film, that is, a so-called sidewall may be formed to cover a side surface of the gate electrode layer. The sidewall can be formed of an insulating film including silicon which is formed by a plasma CVD method or a low pressure CVD (LPCVD) method.

Heat treatment, intense light irradiation, or laser light irradiation may be performed in order to activate the impurity element. At the same time as the activation, plasma damage to the gate insulating layer and plasma damage to an interface between the gate insulating layer and the single-crystal semiconductor layer can be recovered.

Next, a first interlayer insulating layer which covers an electrode layer having a two-layer structure and the gate insulating layer 607 is formed. In this embodiment mode, a laminate structure of insulating films 667 and 668 is employed. A silicon nitride oxide layer is formed as the insulating film 667 to be 100 nm thick and a silicon oxynitride film is formed as the insulating film 668 to be 900 nm thick to form a laminate structure. In this embodiment mode, the insulating films 667 and 668 are successively formed by a plasma CVD method similarly to a base film. Materials for the insulating films 667 and 668 are not limited to the foregoing materials. The insulating films 667 and 668 may be a silicon nitride layer, a silicon nitride oxide layer, a silicon oxynitride layer, or a silicon oxide layer which is formed by a sputtering method or a plasma CVD method. A single layer structure or a laminate structure of three or more layers using another insulating film including silicon may be employed.

The insulating films 667 and 668 can alternatively be formed of a material selected from aluminum nitride (AlN), aluminum oxynitride (AlON), aluminum nitride oxide containing more nitrogen than oxygen (AlNO), aluminum oxide, diamond-like carbon (DLC), a nitrogen-containing carbon film (CN), or another substance containing an inorganic insulating material. Alternatively, a siloxane resin may be used. Note that a siloxane resin is a resin including a Si—O—Si bond. Siloxane has a skeletal structure formed of a bond of silicon (Si) and oxygen (O) and has an organic group containing at least hydrogen (e.g., an alkyl group or an aryl group) or a fluoro group as a substituent. Siloxane may have both of an organic group containing at least hydrogen and a fluoro group as a substituent. Alternatively, an organic insulating material such as polyimide, acrylic, polyamide, polyimide amide, resist, benzocyclobutene, or polysilazane can be used. A coating film with a favorable planarity formed by a coating method may be used.

Next, a plurality of contact holes (openings) which reach the single-crystal semiconductor layers and the gate electrode layers are formed by selectively etching the insulating films 667 and 668 and the gate insulating layer 607 using a mask formed of a resist. Etching may be performed once or plural times depending on a selectivity of a material to be used.

Then, a conductive film is formed to cover the openings, and the conductive film is etched to form connection electrodes which are electrically connected to parts of a source region and a drain region.

The connection electrodes can be formed by forming a conductive film by a PVD method, a CVD method, an evaporation method, or the like, and then, etching the conductive film into a desired shape. A conductive film can be selectively formed in a predetermined position by a droplet discharge method, a printing method, an electroplating method, or the like. A reflow method or a damascene method may be employed. As a material for the connection electrodes, a metal such as Ag, Au, Cu, Ni, Pt, Pd, Ir, Rh, W, Al, Ta, Mo, Cd, Zn, Fe, Ti, Zr, or Ba, or Si or Ge, an alloy or nitride thereof can be used. A laminate structure of any of those materials may alternatively be employed. In this embodiment mode, titanium (Ti) film is formed to be 60 nm thick, a titanium nitride film is formed to be 40 nm thick, aluminum film is formed to be 700 nm thick, and titanium (Ti) film is formed to be 200 nm thick, and then, thus formed laminate structure is processed into a desired shape.

Through the above-described process, an active matrix substrate can be manufactured, in which a peripheral driver circuit region 634 includes a transistor 673 that is a p-channel thin film transistor having a p-type impurity region in an Lov region and a transistor 674 that is an n-channel thin film transistor having an n-type impurity region in an Lov region; and a pixel region 636 includes a transistor 675 that is a multi-channel type n-channel thin film transistor having an n-type impurity region in a Loff region and a transistor 677 that is a p-channel thin film transistor are provided in the (see FIGS. 7A and 7B). The active matrix substrate can be used for a display device including a light emitting element 690.

Note that the present invention can be applied to not only a method for manufacturing thin film transistors which is described in this embodiment mode but also a method for manufacturing a top gate type (a planar type), a bottom gate type (an inversely staggered type), a dual gate type having two gate electrode layers which are arranged above and below a channel region each with a gate insulating film interposed therebetween, and other structures.

Then, a second interlayer insulating layer 681 is formed. The second interlayer insulating layer 681 can be formed of a material selected from silicon oxide, silicon nitride, silicon oxynitride, silicon nitride oxide, aluminum nitride (AlN), aluminum oxynitride (AlON), aluminum nitride oxide containing more nitrogen than oxygen, aluminum oxide, diamond-like carbon (DLC), a nitrogen-containing carbon film (CN), phosphosilicate glass (PSG), borophosphosilicate glass (BPSG), an alumina film, polysilazane, or another substance containing an inorganic insulating material. Alternatively, a siloxane resin may be used. An organic insulating material may alternatively be used, and either a photosensitive material or a nonphotosensitive material may be used. For example, polyimide, acrylic, polyamide, polyimide amide, resist, or benzocyclobutene can be used.

In this embodiment mode, the interlayer insulating layer provided for planarization is required to have a high heat resistant property, a high insulating property, and high planarity. Therefore, the second interlayer insulating layer 681 is preferably formed by using a coating method typified by a spin coating method.

The second interlayer insulating layer 681 can be formed by using dipping, spray coating, a doctor knife, a roll coater, a curtain coater, a knife coater, a CVD method, an evaporation method, or the like. The second interlayer insulating layer 681 may be formed by a droplet discharge method. In the case of using a droplet discharge method, a liquid material can be saved. A method for forming a pattern without a mask like a droplet discharge method, for example, a printing method (i.e., a method of forming a pattern such as screen printing or offset printing) can be used.

Next, an opening which reaches a connection electrode of the p-channel transistor 677, that is, a contact hole is formed by etching the second interlayer insulating layer 681 in the pixel region 636.

Next, a pixel electrode layer 630 which is electrically connected to the connection electrode is formed. The pixel electrode layer 630 serves a first electrode which is one of two electrodes which is included in the light emitting element 690. The pixel electrode layer 630 can be formed using indium tin oxide, indium zinc oxide (IZO) in which zinc oxide is mixed with indium oxide, a conductive material in which silicon oxide is mixed with indium oxide, organic indium, organic tin, indium oxide containing tungsten oxide, indium zinc oxide containing tungsten oxide, indium oxide containing titanium oxide, or indium tin oxide containing titanium oxide.

A conductive composition including a conductive high molecule (also referred to as a conductive polymer) can be used for the pixel electrode layer 630. When a thin film of a conductive composition is formed as a pixel electrode layer, the thin film preferably has sheet resistance of equal to or less than 10000 $\Omega$/square and light transmittance of equal to or higher than 70% at a wavelength of 550 nm. Note that resistance of a conductive high molecule which is included in the thin film is preferably equal to or lower than 0.1 $\Omega$.cm.

As a conductive high molecule, so-called $\pi$ electron conjugated high-molecule can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive high-molecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), or poly (3-anilinesulfonic acid).

Any of the foregoing conductive high molecules may be used alone as a conductive composition for the pixel electrode layer. Alternatively, any of the foregoing conductive high molecules can be used with an organic resin added thereto to adjust film characteristics such as the intensity of the film of a conductive composition.

As for an organic resin, as long as a resin is compatible to a conductive high molecule or a resin can be mixed and dispersed into a conductive high molecule, a thermosetting resin, a thermoplastic resin, or a photocurable resin may be used. For example, a polyester-based resin such as polyethylene terephthalate, polybutylene terephthalate, or polyethylene naphthalate; a polyimide-based resin such as polyimide or polyimide amide; a polyamide resin such as polyamide 6, polyamide 66, polyamide 12, or polyamide 11; a fluorine resin such as poly(vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a poly-urea-based resin, a melamine resin; a phenol-based resin; polyether; an acrylic-based resin, or a copolymer of any of those resins.

Further, a conductive composition may be doped with an acceptor dopant or a donor dopant so that oxidation-reduction potential of a conjugated electron in a conjugated conductive high-molecule may be changed in order to adjust conductivity of the conductive composition.

A halogen compound, a Lewis acid, a protonic acid, an organic cyano compound, an organic metal compound, or the like can be used as an acceptor dopant. Examples of a halogen compound are chlorine, bromine, iodine, iodine chloride, iodine bromide, and iodine fluoride. Examples of a Lewis acid are phosphorus pentafluoride, arsenic pentafluoride, antimony pentafluoride, boron trifluoride, boron trichloride, and boron tribromide. Examples of a protonic acid include an inorganic acid such as hydrochloric acid, sulfuric acid, nitric acid, phosphoric acid, fluoroboric acid, hydrofluoric acid, and perchloric acid; and an organic acid such as organic carboxylic acid and organic sulfonic acid. As organic carboxylic acid and organic sulfonic acid, the foregoing organic carboxylic acid compound and an organic sulfonic acid compound can be used. As an organic cyano compound, a compound having two or more cyano groups in a conjugated bonding, for example, tetracyanoethylene, tetracyanoethylene oxide, tet-racyanobenzene, tetracyanoquinodimethane, and tetracy-anoazanaphthalene are given.

As a donor dopant, alkali metal, alkaline-earth metal, a quaternary amine compound, or the like can be used.

A conductive composition is dissolved in water or an organic solvent (e.g., an alcohol-based solvent, a ketone-based solvent, an ester-based solvent, a hydrocarbon-based solvent, an aromatic-based solvent) and a thin film which serves as a pixel electrode layer can be formed by a wet process.

A solvent which dissolves a conductive composition is not particularly limited. A solvent which dissolves the foregoing conductive high molecules and high molecular resin compounds such as an organic resin may be used. For example, a conductive composition may be dissolved in any one of or mixture of water, methanol, ethanol, Propylene carbonate, N-methylpyrrolidone, dimethylformamide, dimethylaceta-mide, cyclohexanone, acetone, methyl ethyl ketone, methyl isobutyl ketone; or toluene.

After the conductive composition is dissolved in a solvent as described above, a film thereof can be formed by a wet process, such as an application method, a coating method, a droplet discharge method (also referred to as an inkjet method), or a printing method. The solvent may dried with thermal treatment or may be dried under reduced pressure. In the case where the organic resin is a thermosetting resin, heat treatment may be further performed. In the case where the organic resin is a photocurable resin, light irradiation treatment may be performed.

Then, an insulator 686 which serves as a partition wall which covers an edge of the pixel electrode layer 630 is formed.

Then, a layer 688 including an organic compound is formed as selected over the pixel electrode layer 630 by an evaporation method, an inkjet method, or the like.

Then, a second electrode 689 is formed over the layer 688 including an organic compound. The second electrode forms a pair of electrodes with the first electrode of the light emitting element 690. The electrodes make the layer 688 including an organic compound which is disposed therebetween emit light.

A semiconductor device in FIGS. 7A and 7B has a pixel electrode layer 685 which is formed of a light-transmitting conductive material so that light emitted from the light emitting element 690 can be transmitted therethrough and the second electrode 689 which is formed of a reflective conductive material so that light emitted from the light emitting element 690 is reflected. As the second electrode 689, which should have reflectivity, a conductive film of, for example, titanium, tungsten, nickel, gold, platinum, silver, copper, tantalum, molybdenum, aluminium, magnesium, calcium, lithium, or alloy of any of those materials may be used. A substance which has high reflectivity in a visible light region is preferably used. In this embodiment mode, an aluminium film is used.

The resulting light emitting element 690 is sealed with a sealing substrate 695. The support substrate 600 and the sealing substrate 695 are bonded to each other with a sealant 692.

FIGS. 7A and 7B are a plane view and a cross-sectional view of a semiconductor device. FIG. 7A is a plane view of a semiconductor device, and FIG. 7B is a cross-sectional view taken along line E-F in FIG. 7A. An external terminal connection region 632 to which an FPC 694 is attached, a connection region 655, the peripheral driver circuit region 634, and the pixel region 636 are shown. A terminal electrode layer 678 which connects to an external terminal is provided in the external terminal connection region 632. The FPC 694 is connected to the terminal electrode layer 678 via an anisotropic conductive layer 696 and the pixel electrode layer 685. The pixel electrode layer 685 is formed as the same step as the pixel electrode layer 630. In the connection region 655, the second electrode 689 is connected to a wiring in a lower layer.

Note that etching may be performed by either plasma etching (dry etching) or wet etching. Plasma etching is suitable for a large-sized substrate. As an etching gas, a fluorine-based or a chlorine-based gas such as $CF_4$, $NF_3$, $Cl_2$, or $BCl_3$ is used, and an inert gas such as He or Ar may be added thereto as appropriate. In the case of utilizing an etching process with atmospheric pressure discharge, local electric discharge can be performed and a mask layer does not need to be formed over the entire surface of the substrate.

Further, a conductive layer to form a wiring layer or an electrode layer, a mask layer used for forming a predetermined pattern, and the like may be formed by a method by which a pattern can be formed as selected, such as a droplet discharge method. A droplet discharge (eject) method (also referred to as an inkjet method depending on its system) can form a predetermined pattern (of a conductive layer, an insulating layer, or the like) by selectively discharging (ejecting) droplets of a composition mixed for a specific purpose. In such a method, treatment for controlling wettability or adhesiveness may be performed on a region on which the pattern is formed. Further, a method by which a pattern can be formed without an etching process, for example, a printing method (a method by which a pattern is formed, such as screen printing or offset printing), can be used.

As for a mask which is used in a photolithography technique, a resin material such as an epoxy resin, an acrylic resin, a phenol resin, a novolac resin, a melamine resin, or a urethane resin is used. The mask may be formed using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a positive resist, a negative resist, or the like may be used. In the case of a droplet discharge method, the surface tension and viscosity of any material, which is used, are adjusted as appropriate by, for example, adjusting the concentration of a solvent or adding a surfactant or the like.

While the semiconductor device in FIGS. 7A and 7B has a structure of bottom emission in which light is emitted in a direction indicated by the arrow, it is not particularly limited and the semiconductor device may have a top emission structure or a dual emission structure in which light is emitted from both the top and bottom surfaces.

Figure 8:
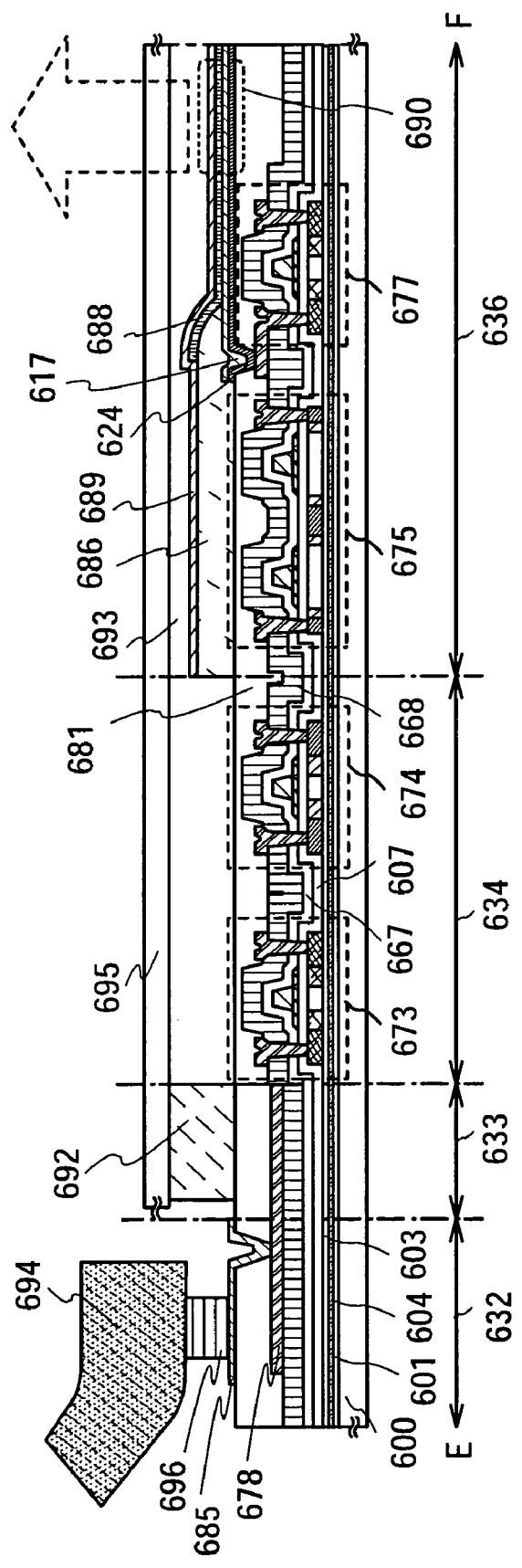
FIG. 8 is a cross-sectional view illustrating a structure of an active matrix EL display device.

FIG. 8 shows an example of a top emission structure. Note that although structures of electrodes of light emitting elements and the size of the insulators 686 are different between FIGS. 8 and 7B, other parts are the same and description of the same parts are omitted here. Note that the same reference numerals as those in FIG. 7B are used in FIG. 8.

A wiring layer 624 that is a reflective metal layer is formed below a first electrode 617 of the light emitting element 690. The first electrode 617 that is a transparent conductive film is formed over the wiring layer 624. As the wiring layer 624, which should have reflectivity, a conductive film of, for example, titanium, tungsten, nickel, gold, platinum, silver, copper, tantalum, molybdenum, aluminium, magnesium, calcium, lithium, or alloy of any of those materials may be used. A substance which has high reflectivity in a visible light region is preferably used. A conductive film may also be used as the first electrode 617, and in that case, if a laminate is not required, a single layer may be employed and the wiring layer 624 having reflectivity is not required to be provided.

The first electrode 617 and the second electrode 689 may each be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide, indium zinc oxide, indium tin oxide to which silicon oxide is added, or the like can be used.

Even when the second electrode 689 is formed of a material having no light-transmitting property such as a metal film, light can be emitted through the second electrode 689 if a thickness of the second electrode 689 is formed small (preferably a thickness of about 5 to 30 nm) so as to be able to transmit light. As a metal thin film which can be used for the second electrode 689, a conductive film formed of titanium, tungsten, nickel, gold, platinum, silver, aluminum, magnesium, calcium, lithium, an alloy of any of those materials, or the like can be given.

When a top emission structure shown in FIG. 8 is employed, an aperture ratio can be easily high, that is, an area of a light emitting region can be easily large; therefore, even when a panel includes a unit cell having four TFTs and a unit cell having two TFTs, the area of light emitting regions of unit cells can be the same. Accordingly, a panel which has a light emitting region larger than that in the pixel structure described in Embodiment Mode 1 can be manufactured.

This embodiment mode can be freely combined with Embodiment Mode 1 or Embodiment Mode 2.

Embodiment Mode 4

This embodiment mode describes structures of light-emitting elements that can be used for display elements in the semiconductor device of the present invention with reference to FIGS. 9A to 9D.

FIGS. 9A to 9D show structures of a light emitting element in which an EL layer 860 is sandwiched between a first electrode 870 and a second electrode 850. The EL layer 860 includes a first layer 804, a second layer 803, and a third layer 802 as is shown in the drawings. In FIGS. 9A to 9D, the second layer 803 is a light emitting layer, and the first layer 804 and the third layer 802 are functional layers.

The first layer 804 has a function of transporting holes to the second layer 803. In FIGS. 9A to 9D, a hole-injecting layer included in the first layer 804 includes a substance having a high hole-injecting property, and molybdenum oxide, vanadium oxide, ruthenium oxide, tungsten oxide, manganese oxide, or the like can be used. Further, the first layer 804 can be formed using a phthalocyanine-based compound such as phthalocyanine (abbrev.: $H_2Pc$) or copper phthalocyanine (CuPc); an aromatic amine compound such as 4,4'-bis[N-(4-diphenylaminophenyl)-N-phenylamino]biphenyl (abbrev.: DPAB) or 4,4'-bis(N-{4-[N-(3-methylphenyl)-N-phenylamino]phenyl}-N-phenylamino)biphenyl (abbrev.: DNTPD); a high molecular compound such as poly(ethylene dioxythiophene)/poly(styrenesulfonic acid) (abbrev.: PEDOT/PSS); or the like.

Further, a composite material including an organic compound and an inorganic compound can be used for the hole-injecting layer. In particular, a composite material including an organic compound and an inorganic compound showing an electron-accepting property with respect to the organic compound is excellent in a hole-injecting property and a hole-transporting property since electrons are transferred between the organic compound and the inorganic compound and carrier density is increased.

In the case where a composite material including an organic compound and an inorganic compound is used for the hole-injecting layer, the hole-injecting layer can form an ohmic contact with the electrode layer; therefore, a material of the electrode layer can be selected regardless of a work function.

As the inorganic compound used for the composite material, oxide of a transition metal is preferably used. Oxide of a metal belonging to Groups 4 to 8 of the periodic table can be used. Specifically, the following are preferable because of an electron-accepting property: vanadium oxide, niobium oxide, tantalum oxide, chromium oxide, molybdenum oxide, tungsten oxide, manganese oxide, and rhenium oxide. Among them, molybdenum oxide is particularly preferable because molybdenum oxide is stable in the atmosphere, has low hygroscopicity, and is easy to be handled.

As the organic compound used for the composite material, various compounds such as an aromatic amine compound, a carbazole derivative, aromatic hydrocarbon, or a high molecular compound (e.g., an oligomer, a dendrimer, or a polymer) can be used. Note that, the organic compound used for the composite material preferably is an organic compound having a high hole-transporting property. Specifically, it is preferable to use a substance having a hole mobility of greater than or equal to $10^{-6}$ cm$^2$/Vs. Further, other materials having a higher hole-transporting property than an electron-transporting property may be used. Examples of the organic compound which can be used for the composite material are specifically listed below.

For example, as the aromatic amine compound, the following can be given: N,N'-di(p-tolyl)-N,N'-diphenyl-p-phenylenediamine (abbrev.: DTDPPA), 4,4'-bis[N-(4-diphenylaminophenyl)-N-phenylamino]biphenyl (abbrev.: DPAB), 4,4'-bis(N-{4-[N-(3-methylphenyl)-N-phenylamino]phenyl}-N-phenylamino)biphenyl (abbrev.: DNTPD), 1,3,5-tris[N-(4-diphenylaminophenyl)-N-phenylamino]benzene (abbrev.: DPA3B), and the like.

As specific examples of the carbazole derivative which can be used for the composite material, the following can be given: 3-[N-(9-phenylcarbazol-3-yl)-N-phenylamino]-9-phenylcarbazole (abbrev.: PCzPCA1, 3,6-bis[N-(9-phenylcarbazol-3-yl)-N-phenylamino]-9-phenylcarbazole (abbrev.: PCzPCA2), 3-[N-(1-naphthyl)-N-(9-phenylcarbazol-3-yl)amino]-9-phenylcarbazole (abbrev.: PCzPCN1), and the like.

Further, the following can be used: 4,4'-di(N-carbazolyl)biphenyl (abbrev.: CBP), 1,3,5-tris[4-(N-carbazolyl)phenyl]benzene (abbrev.: TCPB), 9-[4-(N-carbazolyl)]phenyl-10-phenylanthracene (abbrev.: CzPA), 1,4-bis[4-(N-carbazolyl)phenyl]-2,3,5,6-tetraphenylbenzene, and the like.

As the aromatic hydrocarbon which can be used for the composite material, the following can be given: 2-tert-butyl-9,10-di(2-naphthyl)anthracene (abbrev.: t-BuDNA), 2-tert-butyl-9,10-di(1-naphthyl)anthracene, 9,10-bis(3,5-diphenylphenyl)anthracene (abbrev.: DPPA), 2-tert-butyl-9,10-bis(4-phenylphenyl)anthracene (abbrev.: t-BuDBA), 9,10-di(2-naphthyl)anthracene (abbrev.: DNA), 9,10-diphenylanthracene (abbrev.: DPAnth), 2-tert-butylanthracene (abbrev.: t-BuAnth), 9,10-bis(4-methyl-1-naphthyl)anthracene (abbrev.: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can be used. As described above, an aromatic hydrocarbon which has a hole mobility of greater than or equal to $1 \times 10^{-6}$ cm$^2$/Vs and of which the carbon number is 14 to 42 is more preferable.

Note that the aromatic hydrocarbon which can be used for the composite material may have a vinyl skeleton. As examples of the aromatic hydrocarbon having a vinyl group, 4,4'-bis(2,2-diphenylvinyl)biphenyl (abbrev.: DPVBi), 9,10-bis[4-(2,2-diphenylvinyl)phenyl]anthracene (abbrev.: DPVPA), and the like can be given.

Further, a high molecular compound such as poly(N-vinylcarbazole) (abbrev.: PVK) or poly(4-vinyltriphenylamine) (abbrev.: PVTPA) can be used.

As a substance for forming a hole-transporting layer included in the first layer 804 in FIGS. 9A to 9D, a substance having a high hole-transporting property, specifically, an aromatic amine compound (that is, a compound having a benzene ring-nitrogen bond) is preferable. As examples of a material which are widely used, the following can be given: 4,4'-bis[N-(3-methylphenyl)-N-phenylamino]biphenyl, a derivative thereof such as 4,4'-bis[N-(1-napthyl)-N-phenylamino]biphenyl (hereinafter referred to as NPB), and a starburst aromatic amine compound such as 4,4',4''-tris(N,N-diphenyl-amino)triphenylamine, and 4,4',4''-tris[N-(3-methylphenyl)-N-phenylamino]triphenylamine. Most of those substances have a hole mobility of greater than or equal to $10^{-6}$ cm$^2$/Vs. Further, other materials having a higher a hole-transporting property than an electron-transporting property may be used. The hole-transporting layer is not limited to a single layer and may be a mixed layer of any of the foregoing substances or a laminate which includes two or more layers of any of the foregoing substances.

The third layer 802 has a function of transporting and injecting electrons to the second layer 803. An electron-transporting layer included in the third layer 802 is described with reference to FIGS. 9A to 9D. As the electron-transporting layer, a substance having a high electron-transporting property can be used. For example, a layer including a metal complex or the like having a quinoline or benzoquinoline skeleton, such as tris(8-quinolinolato)aluminum (abbrev.: Alq), tris(4-methyl-8-quinolinolato)aluminum (abbrev.: Almq$_3$), bis(10-hydroxybenzo[h]quinolinato)beryllium (abbrev.: BeBq$_2$), or bis(2-methyl-8-quinolinolato)(4-phenylphenolato)aluminum (abbrev.: BAlq) can be used. Further, a metal complex or the like having an oxazole-based or thiazole-based ligand, such as bis[2-(2-hydroxyphenyl)benzoxazolato]zinc (abbrev.: Zn(BOX)$_2$) or bis[2-(2-hydroxyphenyl)benzothiazolato]zinc (abbrev.: Zn(BTZ)$_2$) can be used. Further, other than metal complexes, the following can be used: 2-(4-biphenylyl)-5-(4-tert-butylphenyl)-1,3,4-oxadiazole (abbrev.: PBD), 1,3-bis[5-(p-tert-butylphenyl)-1,3,4-oxadiazol-2-yl]benzene (abbrev.: OXD-7), 3-(4-biphenylyl)-4-phenyl-5-(4-tert-butylphenyl)-1,2,4-triazole (abbrev.: TAZ), bathophenanthroline (abbrev.: BPhen), bathocuproine (abbrev.: BCP), and the like can be used. Most of those substances have an electron mobility of greater than or equal to $10^{-6}$ cm$^2$/Vs. Further, other materials having a higher electron-transporting property than a hole-transporting property may be used. The electron-transporting layer is not limited to a single layer and may be a laminate which includes two or more layers of any of the foregoing substances.

With reference to FIGS. 9A to 9D, an electron-injecting layer included in the third layer 802 is described. As the electron-injecting layer, a substance having a high electron-injecting property can be used. As the electron-injecting layer, an alkali metal, an alkaline earth metal, or a compound thereof such as lithium fluoride (LiF), cesium fluoride (CsF), or calcium fluoride (CaF$_2$) can be used. For example, a layer of a substance having an electron-transporting property and includes an alkali metal, an alkaline earth metal, or a compound thereof, for example, a layer of Alq including magnesium (Mg) or the like can be used. It is preferable to use the layer of a substance having an electron-transporting property and includes an alkali metal or an alkaline earth metal as the electron-injecting layer because electron injection from the electrode layer is efficiently performed by using the layer.

Next, the second layer 803 which is a light emitting layer is described. The light emitting layer has a function of emitting light and includes an organic compound having a light-emitting property. Further, the light emitting layer may include an inorganic compound. The light emitting layer may be formed using various organic compounds having a light-emitting property and inorganic compounds. The thickness of the light emitting layer is preferably about 10 to 100 nm.

There are no particular limitations on the organic compound used for the light-emitting layer as long as it has a light-emitting property. For example, the following can be given: 9,10-di(2-naphthyl)anthracene (abbrev.: DNA), 9,10-di(2-naphthyl)-2-tert-butylanthracene (abbrev.: t-BuDNA), 4,4'-bis(2,2-diphenylvinyl)biphenyl (abbrev.: DPVBi), coumarin 30, coumarin 6, coumarin 545, coumarin 545T, perylene, rubrene, periflanthene, 2,5,8,11-tetra(tert-butyl)perylene (abbrev.: TBP), 9,10-diphenylanthracene (abbrev.: DPA), 5,12-diphenyltetracene, 4-(dicyanomethylene)-2-methyl-[p-(dimethylamino)styryl]-4H-pyran (abbrev.: DCM1), 4-(dicyanomethylene)-2-methyl-6-[2-(julolidin-9-yl)ethenyl]-4H-pyran (abbrev.: DCM2), and 4-(dicyanomethylene)-2,6-bis[p-(dimethylamino)styryl]-4H-pyran (abbrev.: BisDCM). Further, a compound capable of emitting phosphorescence such as bis[2-(4',6'-difluorophenyl)pyridinato-N,C$^{2'}$]iridium(picolinate) (abbrev.: FIrpic), bis{2-[3',5'-bis(trifluoromethyl)phenyl]pyridinato-N,C$^{2'}$}iridium(picolinate) (abbrev.: Ir(CF$_3$ppy)$_2$(pic)), tris(2-phenylpyridinato-N, C$^{2'}$)iridium (abbrev.: Ir(ppy)$_3$), bis(2-phenylpyridinato-N, C$^{2'}$)iridium(acetylacetonate) (abbrev.: Ir(ppy)$_2$(acac)), bis[2-(2'-thienyl)pyridinato-N,C$^{3'}$]iridium(acetylacetonate) (abbrev.: Ir(thp)$_2$(acac)), bis(2-phenylquinolinato-N,C$^{2'}$)iridium(acetylacetonate) (abbrev.: Ir(pq)$_2$(acac)), or bis[2-(2'-benzothienyl)pyridinato-N,C$^{3'}$]iridium(acetylacetonate) (abbrev.: Ir(btp)$_2$(acac)) can be used.

Further, a triplet excitation light-emitting material containing a metal complex or the like may be used for the light emitting layer in addition to a singlet excitation light-emitting material. For example, among pixels emitting red, green, and blue light, the pixel emitting red light whose luminance is reduced by half in a relatively short time is formed using a triplet excitation light-emitting material and the other pixels are formed using a singlet excitation light-emitting material. Since a triplet excitation light-emitting material has a favorable light-emitting efficiency, less power is consumed to obtain the same luminance. In other words, when a triplet excitation light-emitting material is used for the pixel emitting red light, a smaller amount of current is necessary to be applied to a light emitting element; therefore, reliability can be improved. The pixel emitting red light and the pixel emitting green light may be formed using a triplet excitation light-emitting material and the pixel emitting blue light may be formed using a singlet excitation light-emitting material in order to achieve low power consumption. Low power consumption can be further achieved when a light emitting element emitting green light, which has high visibility to human eyes, is formed of a triplet excitation light-emitting material.

Another organic compound may be further added to the light emitting layer including any of the above-described organic compounds which emit light. Examples of the organic compound that can be added are TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and 4,4'-bis(N-carbazolyl)biphenyl (abbrev.: CBP), and 1,3,5-tris[4-(N-carbazolyl)phenyl]benzene (abbrev.: TCPB), but, the present invention is not limited thereto. It is preferable that the organic compound which is added in addition to the organic compound which emits light have a larger excitation energy and be added in a larger amount than the organic compound which emits light, in order to make the organic compound emit light efficiently (thus, concentration quenching of the organic compound can be prevented). Further, as another function, the added organic compound may emit light with the organic compound which emits light (thus, white light emission or the like can be performed).

The light emitting layer may have a structure in which color display is performed by formation of light emitting layers having different emission wavelength ranges for pixels. Typically, light emitting layers corresponding to colors of R (red), G (green), and B (blue) are formed. In this case, color purity can be improved and a pixel region can be prevented from having a mirror surface (reflection) by provision of a filter which transmits light of an emission wavelength range of the pixel on the light-emission side of the pixel. A circularly polarizing plate or the like that has been conventionally considered to be necessary can be omitted by provision of the filter, and the loss of light emitted from the light emitting layer can be eliminated. Further, change in color tone, which occurs when a pixel region (a display screen) is obliquely seen, can be reduced.

Either a low-molecular organic light-emitting material or a high-molecular organic light-emitting material may be used for a material of the light emitting layer. A high-molecular organic light-emitting material has higher physical strength than a low-molecular material and an element using the high-molecular organic light-emitting material has higher durability than an element using a low-molecular material. In addition, since a high-molecular organic light-emitting material can be formed by coating, the element can be relatively easily formed.

The color of light emission is determined depending on a material forming the light emitting layer; therefore, a light emitting element which emits light of a desired color can be formed by selecting an appropriate material for the light emitting layer. As a high-molecular electroluminescent material which can be used for forming the light emitting layer, a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly (3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2, 2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The inorganic compound used for the light emitting layer may be any inorganic compound as long as light emission of the organic compound is not easily quenched by the inorganic compound, and various kinds of metal oxide and metal nitride may be used. In particular, an oxide of a metal that belongs to Group 13 or 14 of the periodic table is preferable because light emission of the organic compound is not easily quenched, and specifically, aluminum oxide, gallium oxide, silicon oxide, and germanium oxide are preferable. However, the inorganic compound is not limited thereto.

Note that the light emitting layer may be formed by stacking a plurality of layers each having a combination of the organic compound and the inorganic compound, which are described above, or may further have another organic compound or inorganic compound. A layer structure of the light emitting layer can be changed, and an electrode layer for injecting electrons may be provided or light-emitting materials may be dispersed, instead of provision of a specific electron-injecting region or light-emitting region. Such a change can be permitted unless it departs from the spirit of the present invention.

A light emitting element formed using the above materials emits light by being forwardly biased. A pixel of a semiconductor device which is formed using a light emitting element can be driven by a passive matrix mode or an active matrix mode. In either case, each pixel emits light by application of forward bias thereto at a specific timing; however, the pixel is in a non-light-emitting state for a certain period. Reliability of a light emitting element can be improved by application of reverse bias in the non-light-emitting time. In a light emitting element, there is a deterioration mode in which light emission intensity is decreased under a constant driving condition or a deterioration mode in which a non-light-emitting region is increased in the pixel and luminance seems to be decreased. However, progression of deterioration can be slowed down by performing alternating driving in which bias is applied forwardly and reversely; thus, reliability of a semiconductor device including a light emitting element can be improved. In addition, either digital driving or analog driving can be applied.

A color filter (colored layer) may be provided for a sealing substrate. The color filter (colored layer) can be formed by an evaporation method or a droplet discharge method. High-definition display can be performed using the color filter (colored layer). This is because a broad peak can be modified to be sharp in a light emission spectrum of each of RGB by the color filter (colored layer).

Full color display can be performed by formation of a material emitting light of a single color and combination of the material with a color filter or a color conversion layer. The color filter (colored layer) or the color conversion layer may be provided for, for example, the sealing substrate, and the sealing substrate may be attached to an element substrate.

Needless to say, display of single color light emission may be performed. For example, an area color type semiconductor device may be formed by using single color light emission.

Figure 9A:
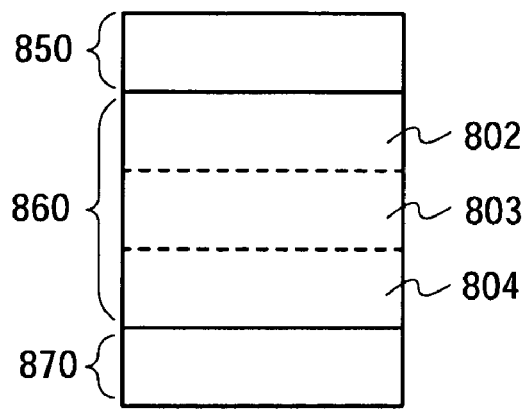
FIGS. 9A to 9D illustrate laminates of light emitting elements.
Figure 9B:
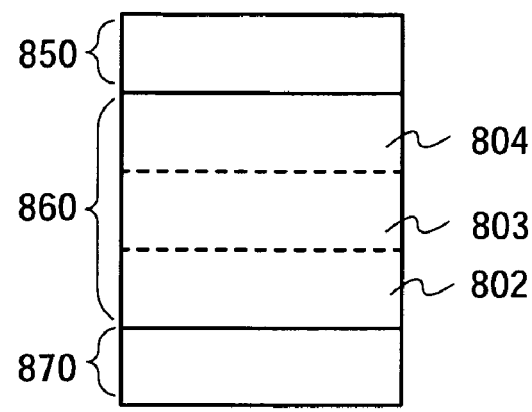

It is necessary to select materials for the first electrode 870 and the second electrode 850 in consideration of the work function. Either the first electrode 870 or the second electrode 850 can be an anode (an electrode layer with high potential) or a cathode (an electrode layer with low potential) depending on the pixel structure. In the case where the polarity of a drive thin film transistor is a p-channel type, the first electrode 870 may serve as an anode and the second electrode 850 may serve as a cathode, as shown in FIG. 9A. In the case where the polarity of the drive thin film transistor is an n-channel type, the first electrode 870 may serve as a cathode and the second electrode 850 may serve as an anode, as shown in FIG. 9B. Materials that can be used for the first electrode 870 and the second electrode 850 are described below. It is preferable to use a material having a high work function (specifically, a material having a work function of greater than equal to 4.5 eV) for one of the first electrode 870 and the second electrode 850 which serves as an anode and a material having a low work function (specifically, a material having a work function of less than or equal to 3.5 eV) for the other electrode which serves as a cathode. However, since the first layer 804 is excellent in a hole-injecting property and a hole-transporting property and the third layer 802 is excellent in an electron-injecting property and an electron-transporting property, both the first electrode 870 and the second electrode 850 are scarcely restricted by a work function and various materials can be used.

The light emitting elements in FIGS. 9A and 9B each have a structure in which light is taken out from the first electrode 870 and thus, the second electrode 850 does not necessarily have a light-transmitting property. The second electrode 850 may be formed of a film mainly containing an element selected from Ti, Ni, W, Cr, Pt, Zn, Sn, In, Ta, Al, Cu, Au, Ag, Mg, Ca, Li or Mo, or an alloy material or a compound material containing any of those elements as its main component, such as titanium nitride, $TiSi_xN_y$, $WSi_x$, tungsten nitride, $WSi_xN_y$, or NbN; or a laminate thereof with a total thickness of 100 to 800 nm.

In addition, when the second electrode 850 is formed using a light-transmitting conductive material similarly to the material used for the first electrode 870, light can be taken out from the second electrode 850 as well, and a dual emission structure can be obtained, in which light from the light emitting element is emitted through both the first electrode 870 and the second electrode 850.

Note that the light emitting element of the present invention can have variations by changing types of the first electrode 870 and the second electrode 850.

FIG. 9B shows the case where the EL layer 860 is formed by stacking the third layer 802, the second layer 803, and the first layer 804 in that order from the first electrode 870 side.

Figure 9C:
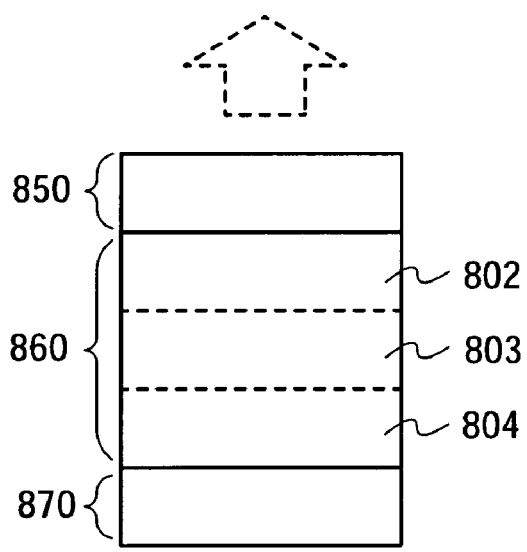
Figure 9D:
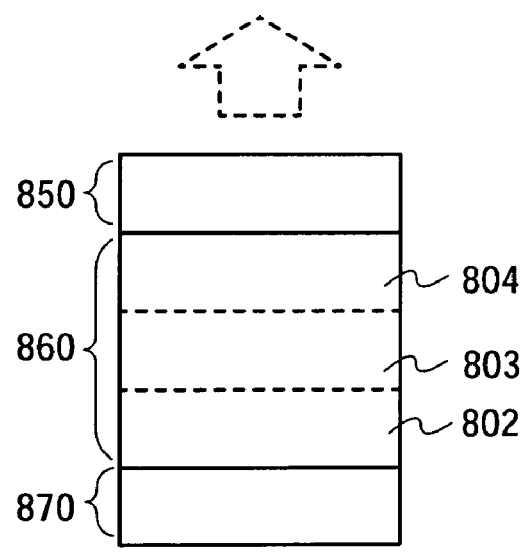

FIG. 9C shows a structure in which an electrode layer having reflectivity is used for the first electrode 870 and an electrode having a light-transmitting property is used for the second electrode 850 in FIG. 9A and in which light emitted from the light emitting element is reflected by the first electrode 870, transmitted through the second electrode 850, and emitted to the outside. Similarly, FIG. 9D shows a structure in which an electrode having reflectivity is used for the first electrode 870 and an electrode having a light-transmitting property is used for the second electrode 850 in FIG. 9B and in which light emitted from the light emitting element is reflected by the first electrode 870, transmitted through the second electrode 850, and emitted to the outside.

Further, various methods can be used as a method for forming the EL layer 860 when an organic compound and an inorganic compound are mixed for the EL layer 860. For example, there is a co-evaporation method for vaporizing both an organic compound and an inorganic compound by resistance heating. Further, co-evaporation may be performed in which an inorganic compound may be vaporized by an electron beam (EB) while an organic compound is vaporized by resistance heating. Furthermore, a method for sputtering an inorganic compound while vaporizing an organic compound by resistance heating to deposit the both at the same time may also be used. Instead, the EL layer 860 may be formed by a wet method.

As a method for manufacturing the first electrode 870 and the second electrode 850, an evaporation method by resistance heating, an EB evaporation method, a sputtering method, a CVD method, a spin coating method, a printing method, a dispenser method, a droplet discharge method, or the like can be used.

This embodiment mode can be freely combined with any one of Embodiment Modes 1 to 3. Even in the case of a large semiconductor device, a high performance semiconductor device including a light emitting element which is highly reliable can be manufactured with high throughput and high productivity using a manufacturing method described in Embodiment Mode 1.

Embodiment Mode 5

Figure 10A:
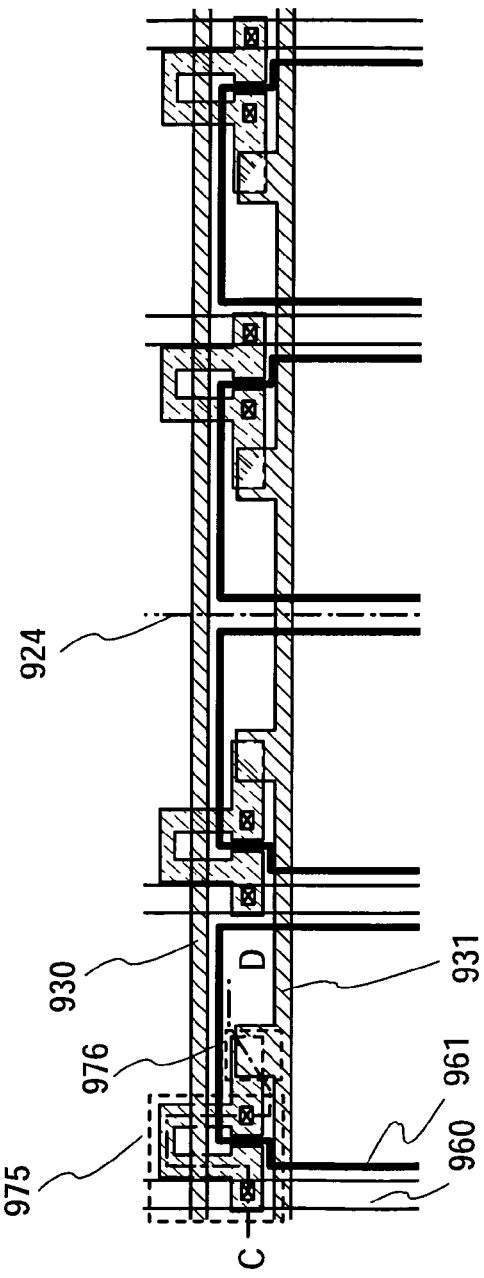
FIG. 10A is a top view and FIG. 10B is a cross-sectional view of an active matrix liquid crystal display device.
Figure 10B:
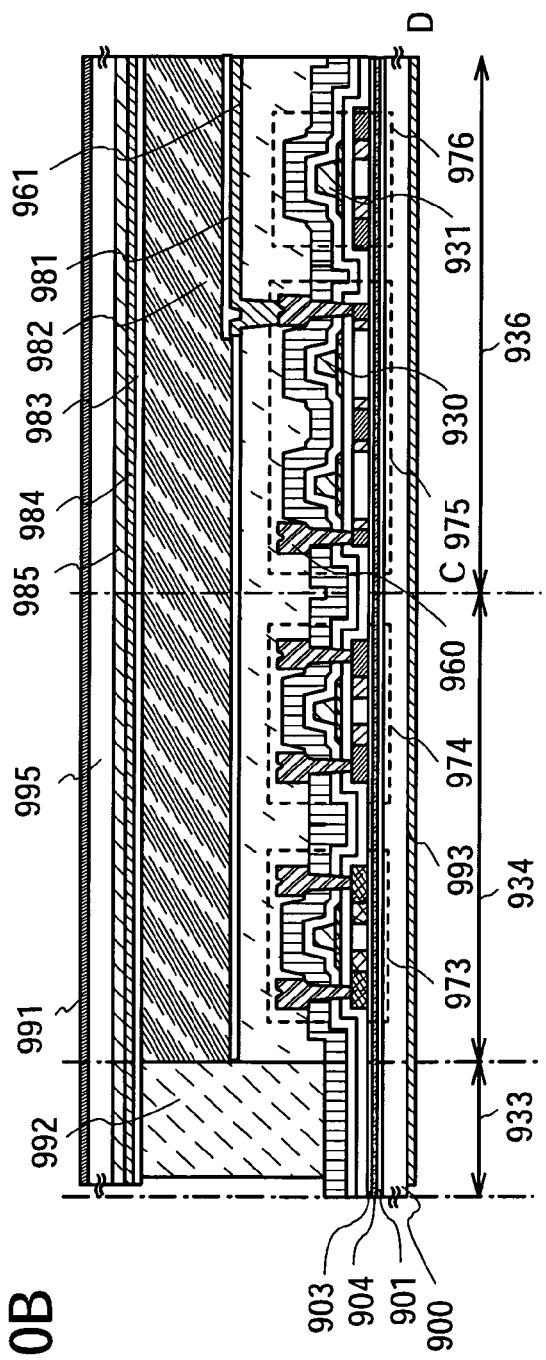

While Embodiment Mode 3 describes an example in which a semiconductor device using a light emitting element, this embodiment mode describes an example in which a semiconductor device using a liquid crystal element according to FIG. 10B.

First, an island-shaped single-crystal semiconductor layer is formed over a support substrate 900, which is a glass substrate, according to Embodiment Mode 2. Note that since details of the method are described in Embodiment Mode 1, they are omitted here and the method is described briefly.

Here, the support substrate 900 over which a first silicon nitride oxide layer 901 is formed and a first bonding layer is formed over the first silicon nitride oxide layer 901 is prepared. In addition, a semiconductor substrate provided with an oxide film 903 which is formed through thermal treatment at a temperature of equal to or higher than 700° C. in an atmosphere containing HCl at 0.5 to 10 volume % (preferably 3 volume %) with respect to oxygen and a second bonding layer thereover is prepared. Note that at least two semiconductor substrates are prepared per support substrate and each of the semiconductor substrates are processed into rectangles. A separation layer is formed in each of the substrates. Then, the support substrate and the semiconductor substrates are attached to each other so that the first bonding layer and the second bonding layer are bonded to each other. When the first bonding layer and the second bonding layer are bonded to each other, the interface therebetween becomes unclear; therefore, the first and the second bonding layers are shown as a bonding layer 904 in FIG. 10B.

Then, parts of the semiconductor substrates are separated from the support substrate 900 using the separation layer or its surface as a boundary to form single-crystal semiconductor layers over the support substrate 900. Then, the single-crystal semiconductor layers are etched using a photolithography technique to form island-shaped single-crystal semiconductor layers. As in Embodiment Mode 1, a stepper exposure apparatus is used in this embodiment mode and light exposure of one shot is carried out in a manner such that a light exposure area is approximately the same as the area of one rectangle semiconductor substrate (also referred to as a sheet). Note that positions of the island-shaped single-crystal semiconductor layers are also determined according to Embodiment Mode 1.

Since the following steps, that is, a method for manufacturing a TFT using a single-crystal semiconductor layer is approximately the same as those in Embodiment Mode 3, description of the details is omitted here. Note that TFTs used in a light emitting device and TFTs used in a liquid crystal display device have different intended use; therefore, channel lengths and channel widths are adjusted as appropriate, and TFTs in a light emitting device and in a liquid crystal display device have different designs. In particular, a light emitting device includes a unit cell having two or more TFTs, while a liquid crystal display device can be manufactured using a unit cell having one TFT. In addition, while a light emitting device includes a power supply line, a liquid crystal display device does not include a power supply line and includes a capacitor line. In a liquid crystal display device, n-channel TFTs may be used alone if a drive circuit is not formed over the same substrate.

FIG. 10A shows an example of a top view of a pixel. A boundary line 924 indicated by a chain line is a juncture between different semiconductor substrates which are attached. Pixel electrode layers 961 are arranged in one direction and the boundary line 924 is positioned therebetween. The pixel structure is symmetric with respect to the boundary line 924. Thus, a single-crystal semiconductor layer can be kept away from the boundary line 924. Although the single-crystal semiconductor layers are located in the unit cells which are next to each other with the boundary line 924 therebetween, a sufficient distance can be kept between the single-crystal semiconductor layer and the boundary line 924.

In addition, a capacitor line 931 overlaps with the single-crystal semiconductor layer with an insulating film therebetween to form a storage capacitor, thus, a capacitor portion 976 is formed. A transistor 975 that is a multi-channel type n-channel thin film transistor is located near an intersection of a gate wiring 930 and a source wiring 960. The gate wiring 930 overlaps with the single-crystal semiconductor layer with an insulating film therebetween and the overlapping portion is a channel formation region of a TFT. The single-crystal semiconductor layer is electrically connected to the source wiring 960 through a contact hole. In addition, the single-crystal semiconductor layer is electrically connected to the pixel electrode layer 961 through a contact hole.

In the case of a transmissive liquid crystal display device, the pixel electrode layer 961 can be formed using indium tin oxide, indium zinc oxide (IZO) in which zinc oxide is mixed with indium oxide, a conductive material in which silicon oxide is mixed with indium oxide, organic indium, organic tin, indium oxide containing tungsten oxide, indium zinc oxide containing tungsten oxide, indium oxide containing titanium oxide, or indium tin oxide containing titanium oxide. Alternatively, in the case of a reflective liquid crystal display device, aluminium, silver, or an alloy thereof is used for the pixel electrode layer 961.

Note that a cross-sectional view taken along dotted line C-D in FIG. 10A corresponds to a pixel region 936 in FIG. 10B. Note that FIG. 10A is a top view of a liquid crystal display device in which steps up to formation of a pixel electrode are performed. FIG. 10B is a cross-sectional view of a liquid crystal display device in which a sealing substrate 995 is attached with a sealant 992 and a polarizer is further provided.

A liquid crystal display device in FIG. 10B includes a seal region 933, a drive circuit region 934, and the pixel region 936. An insulating layer 981 which is called an alignment film is formed over the pixel electrode layer 961 by a printing method or a droplet discharge method. Then, rubbing treatment is performed. Note that rubbing treatment is not necessarily performed depending on a mode of liquid crystal, for example, when a VA mode is employed, rubbing treatment is not necessarily performed. An insulating layer 983 serving as an alignment film which is provided for the sealing substrate 995 is similar to the insulating layer 981. The sealing substrate 995 has a conductive layer 984 serving as a counter electrode, a color layer 985 serving as a color filter, and a polarizer 991 (also referred to as a polarizing plate), in addition to the insulating layer 983. In addition, the sealing substrate 995 may have a shielding film (a black matrix), and the like.

Since the liquid crystal display device of this embodiment mode is of a transmissive type, a polarizer (a polarizing plate) 993 is provided on an opposite side of the support substrate 900 from elements. A retardation plate may be stacked between the polarizing plate and a liquid crystal layer. In addition, an anti-reflection film which prevents external light from being reflected to a viewing side may be provided on the viewing side which is a nearest side to a user.

Note that the color filter is not provided in some cases where light-emitting diodes (LEDs) of RGB or the like are arranged as a backlight and a successive additive color mixing method (a field sequential method) in which color display is performed by time division is employed. The black matrix is preferably provided so as to overlap with a transistor and a CMOS circuit in order to reduce reflection of external light by wirings of the transistor and the CMOS circuit. Note that the black matrix may be provided so as to overlap with the capacitor element so that reflection by a metal film forming the capacitor element can be prevented.

The liquid crystal layer can be formed by a dispenser method (a dripping method), or an injecting method by which liquid crystal is injected using a capillary action after attaching the substrate 900 having elements to the sealing substrate 995. A dripping method is preferably employed when using a large substrate to which an injecting method is not easily applied.

Spacers may be provided in such a way that particles each having a size of several micro millimeters are dispersed, or the spacers may be formed by a method by which a resin film is formed over the entire surface of the substrate and then etched.

In this embodiment mode, the oxide film 903 can include a halogen element. The oxide film can serve as a protective film which captures an impurity such as metal and prevent contamination of the semiconductor substrate. Thus, reliability can be improved.

This embodiment mode can be freely combined with any one of Embodiment Modes 1 to 3.

Embodiment Mode 6

While Embodiment Mode 1 describes an example in which a gap is generated between neighboring sheets due to an error in bonding and the region 217 where the second bonding layer 211 is exposed is generated, this embodiment mode describes an example in which neighboring sheets are bonded so as to partially overlap with each other in order not to form the region 217 where the second bonding layer 211 is exposed. In this embodiment mode, two edges of sheets in a region where the sheets overlap with each other are referred to as two boundary lines. In a pixel structure in this embodiment mode, a semiconductor layer is not located in a position which overlaps with two boundary lines which are generated by neighboring sheets which partially overlap with each other. In addition, the semiconductor layer is located in a position which is away from the two boundary lines in the pixel structure. A single-crystal semiconductor layer is also formed between two boundary lines in this embodiment mode.

An example of a manufacturing method is described hereinafter with reference to FIGS. 11A to 11C and 12A to 12C. Note that materials of a bonding layer, specific materials of a blocking layer, a separation layer, and the like, a manufacturing method, and the like are described in Embodiment Mode 1; therefore, description thereof are omitted and a procedure is described here.

A first silicon nitride oxide layer 701 is formed over a support substrate 700, which is a glass substrate, and a first bonding layer 702 is formed thereover.

In addition, a semiconductor substrate over which a silicon oxynitride layer 703, a second silicon nitride oxide layer 704, and a second bonding layer 705 are formed in that order is prepared as a rectangle semiconductor substrate 706. Note that at least two semiconductor substrates are prepared per support substrate and each of the semiconductor substrates are processed into rectangles. A separation layer 708 is formed in each of the substrates.

A method for manufacturing the rectangle semiconductor substrate 706 in which a separation layer is formed is not particularly limited and various procedures described in Embodiment Mode 1 can be employed.

Figure 11A:
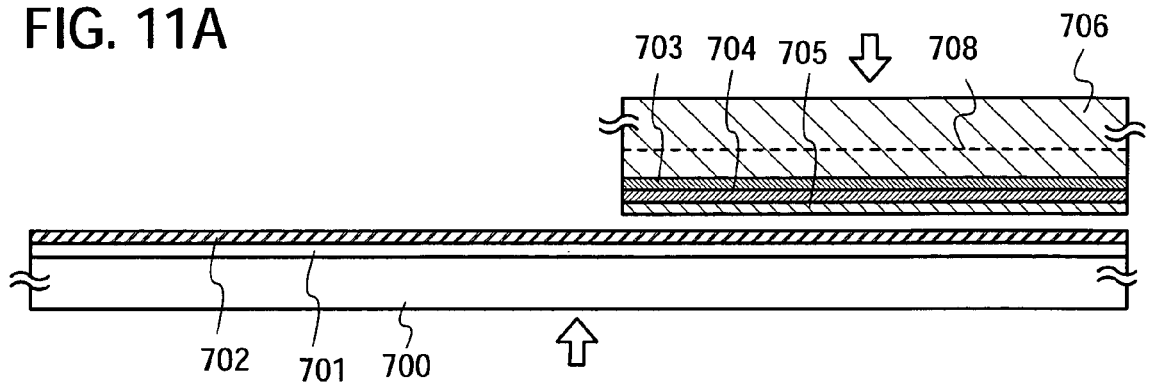
FIGS. 11A to 11C are cross-sectional views illustrating manufacturing steps.

Then, the support substrate 700 and the rectangle semiconductor substrate 706 overlap with each other so that the first bonding layer 702 and the second bonding layer 705 are bonded to each other. FIG. 11A shows a cross section before a first one of the rectangle semiconductor substrates 706 are made in close contact with the support substrate 700.

By making the support substrate 700 and the rectangle semiconductor substrate 706 face each other and pressing one part thereof from the outside, the distance between the bonding surfaces is locally reduced. Accordingly, van der Waals force is increased and together with contribution of hydrogen bonding, the rectangle semiconductor substrate 706 and the support substrate 700 attract each other so that they are partially bonded. Further, since the distance between the rectangle semiconductor substrate 706 and the support substrate 700, which face each other, in an adjacent region is reduced, a region in which van der Waals force strongly acts or a region which is influenced by hydrogen bonding is widened. Accordingly, bonding proceeds and spreads to the entire bonding surfaces.

A part of the semiconductor substrate is separated from the support substrate 700 using the separation layer 708 or its surface as a boundary. A laminate in which the first silicon nitride oxide layer 701, the first bonding layer 702, the second bonding layer 705, the second silicon nitride oxide layer 704, the silicon oxynitride layer 703, and a first single-crystal semiconductor layer 709 are stacked in that order is formed over the support substrate 700. Thermal treatment may be performed for separation. Further, a trigger may be made before separation to facilitate the separation.

Then, a second one of the rectangle semiconductor substrates is made in close contact with the support substrate 700 so that the second one of the rectangle semiconductor substrates and the first single-crystal semiconductor layer 709 partially overlap with each other. Then, a part 716 of the semiconductor substrate is similarly separated from the support substrate 700 using the separation layer or its surface as a boundary. An overlapping region 720 where a second single-crystal semiconductor layer 719 overlaps with the first single-crystal semiconductor layer 709 with a third bonding layer 715 interposed therebetween is formed. Note that the third bonding layer 715 provided for the second one of the rectangle semiconductor substrates is fixed to the first single-crystal semiconductor layer 709 to be in contact therewith in the overlapping region 720.

Note that the third bonding layer 715 is bonded on the first single-crystal semiconductor layer 709 to be in contact therewith, but the bonding strength is lower than bonding strength of a bond between the first bonding layer 702 and the second bonding layer 705.

Figure 11B:
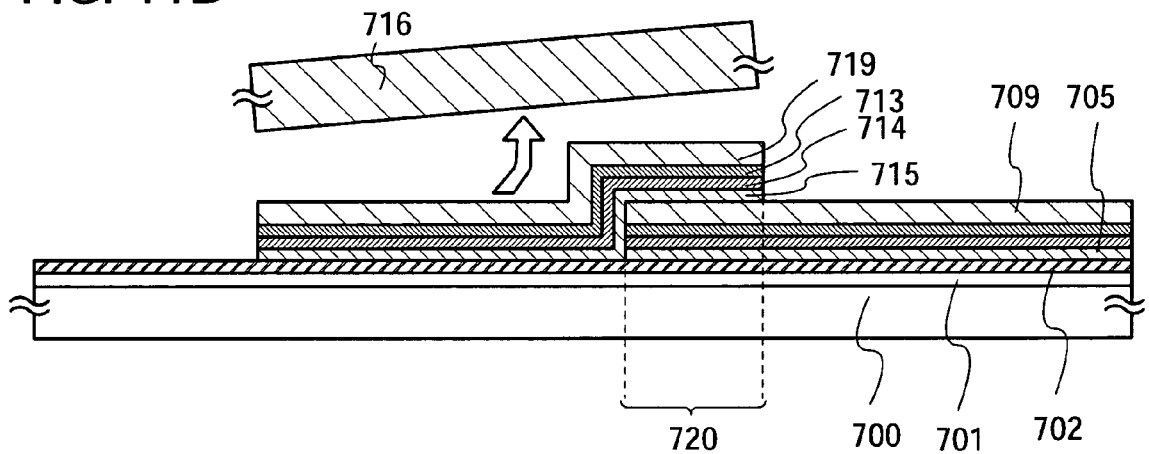

A laminate in the overlapping region 720 includes, over the support substrate 700, the first silicon nitride oxide layer 701, the first bonding layer 702, the second bonding layer 705, the second silicon nitride oxide layer 704, the silicon oxynitride layer 703, the first single-crystal semiconductor layer 709, the third bonding layer 715, a third silicon nitride oxide layer 714, a silicon oxynitride layer 713, and the second single-crystal semiconductor layer 719 which are stacked in that order. A cross-sectional view in this step is shown in FIG. 11B. Note that the overlapping region 720 is illustrated large for clear understanding in FIG. 11B. A width of the overlapping region 720 is less than 5 mm when the rectangle semiconductor substrate has a side of about 100 mm.

Then, a third and following rectangle semiconductor substrates are disposed thereover with a similar procedure. Bonding strength of bonds of each rectangle semiconductor substrate to the support substrate in this step is weaker than bonding strength of bonds after thermal treatment which is carried out later. Accordingly this state can refer to as a prebonded state.

Then, the single-crystal semiconductor layers are processed using a photolithography technique.

As a mask which is used in a photolithography technique, a resin material such as an epoxy resin, an acrylic resin, a phenol resin, a novolac resin, a melamine resin, or a urethane resin is used. The mask layer may be formed using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a positive resist, a negative resist, or the like may be used. In the case of a droplet discharge method, the surface tension and viscosity of any material, which is used, are adjusted as appropriate by, for example, adjusting the concentration of a solvent or adding a surfactant or the like. In this embodiment mode, a mask is formed using a resist and light exposure is performed using a stepper exposure apparatus.

Figure 11C:
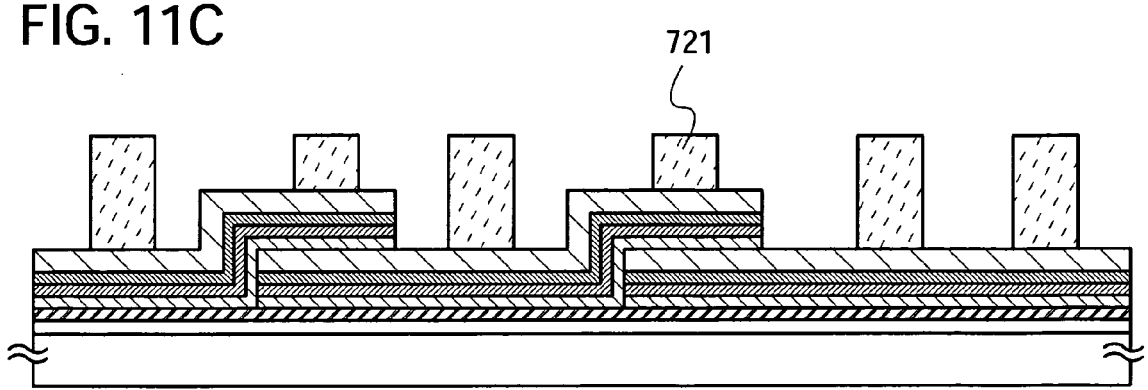

In this embodiment mode, one shot of light exposure is performed per rectangle semiconductor substrate as in Embodiment Mode 1. Then, development is performed. A cross-sectional view after the development is shown in FIG. 11C. A pixel structure is determined so that a mask 721 which remains after light exposure is located at least not to overlap with opposing edges of the overlapping region 720. Note that the overlapping region 720 is illustrated large for clear understanding in FIG. 11C. For example, when a width of the overlapping region 720 is 5 mm, a width of the mask 721 is about 10 μm.

Figure 12A:
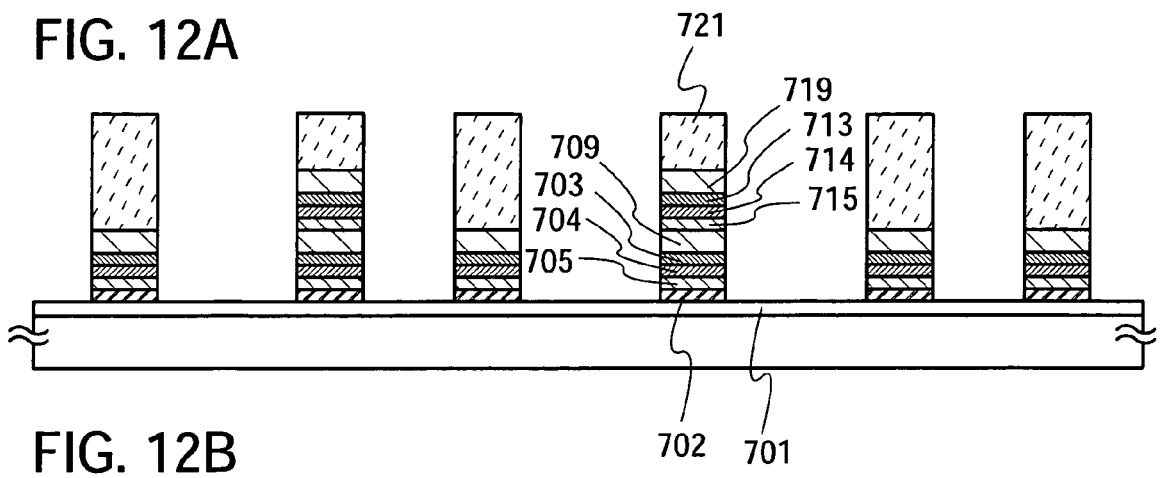
FIGS. 12A to 12C are cross-sectional views illustrating manufacturing steps.

Then, plasma etching (dry etching) or wet etching is performed to form an island-shaped single-crystal semiconductor layer shown in FIG. 12A.

Figure 12B:
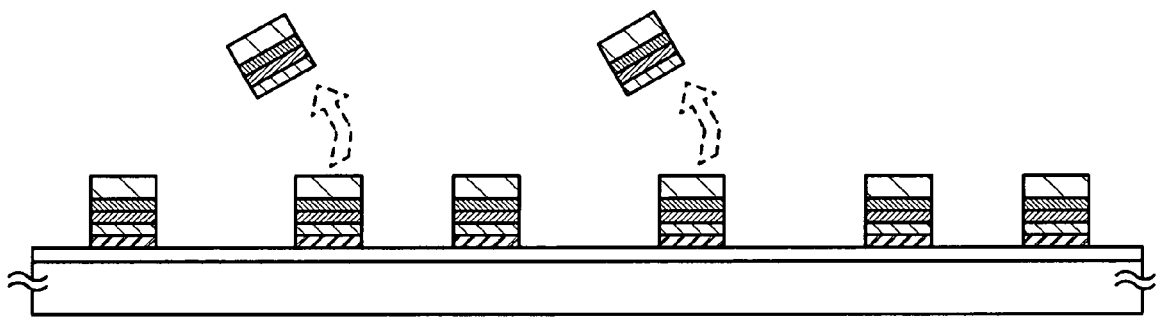

Then the mask 721 is removed by $O_2$ ashing or using a resist stripping solution, and a natural oxide film on the surface is also removed. When the mask 721 is removed, the second single-crystal semiconductor layer 719 is also removed by separation using a surface in which the third bonding layer 715 is on the first single-crystal semiconductor layer 709 to be in contact therewith as a separation surface. Separation can be caused because the prebonded state has been formed. Thus, only a single-crystal semiconductor layer which is fixed to the support substrate 700 is retained by bonding between the first bonding layer 702 and the second bonding layer 705. A cross-sectional view in this step is shown in FIG. 12B.

After that, thermal treatment for further increasing bonding strength between the first bonding layer 702 and the second bonding layer 705 is performed. Thermal treatment can be performed with a furnace for heating, laser beam irradiation, or the like. Alternatively, flash lamp annealing using a halogen lamp or a xenon lamp may be employed for a similar purpose. This thermal treatment makes the prebonded state be a boded state. In the boded state, an interface between the first bonding layer and the second bonding layer becomes unclear; therefore, the first bonding layer and the second bonding layer is shown a bonding layer 707 in FIG. 12C.

Figure 12C:
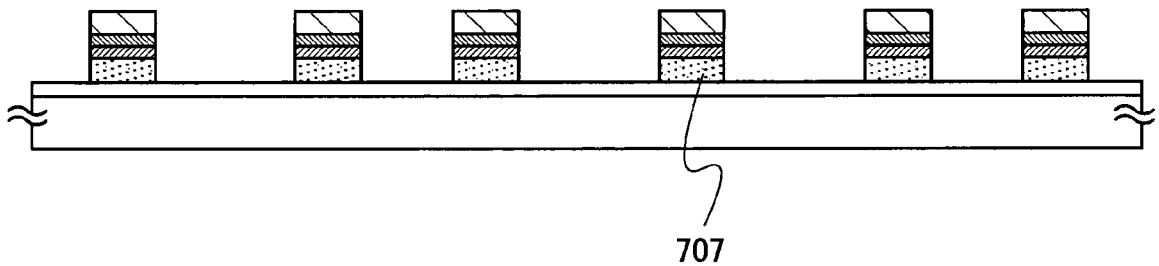

Note that thermal treatment may be performed in the prebonded state in FIG. 11B as long as a heating temperature thereof is lower than a heating temperature in the thermal treatment in FIG. 12C or thermal energy thereof is lower than a thermal energy in the thermal treatment in FIG. 12C.

The resulting island-shaped single-crystal semiconductor layers are used for manufacturing a semiconductor element such as a display element.

Through the foregoing steps, a semiconductor device having a display portion which has an area rather than a semiconductor substrate can be manufactured using a plurality of semiconductor substrates.

This embodiment mode can be freely combined with any one of Embodiment Modes 1 to 5.

Embodiment Mode 7

Various semiconductor devices having a display function can be manufactured according to the present invention. In other words, the present invention is applicable to various electronic appliances in which these semiconductor devices having a display function are incorporated into display portions. This embodiment mode describes examples of electronic appliances including a semiconductor device for providing high performance and high reliability.

As electronic appliances of the present invention, television devices (also simply referred to as televisions or television receivers), cameras such as digital cameras or digital video cameras, mobile phone sets (also simply referred to as mobile phones or cell-phones), portable information terminals such as PDAs, portable game machines, monitors for computers, computers, audio reproducing devices such as car audio systems, image reproducing devices provided with a recording medium such as home game machines (specifically, a digital versatile disc (DVD)), and the like can be given. Specific examples thereof are described with reference to FIGS. 13A to 13C.

A television device can be completed using a semiconductor device which includes a display element which is formed according to the present invention. An example of a television device with high performance and high reliability is described with reference to FIG. 13A.

A television device can be completed by incorporating a display module into a housing. A display panel in which components such as an FPC are set as shown in FIGS. 7A and 7B is generally referred to as tan EL display module. When an EL display module shown in FIGS. 7A and 7B is used, an EL television device can be completed, and when a liquid crystal display module shown in FIGS. 10A and 10B is used, a liquid crystal television device can be completed. A main display screen 2003 can be formed using a display module, and other accessories such as a speaker portion 2009 and an operation switch are provided. Thus, a television device can be completed according to the present invention.

Figure 13A:
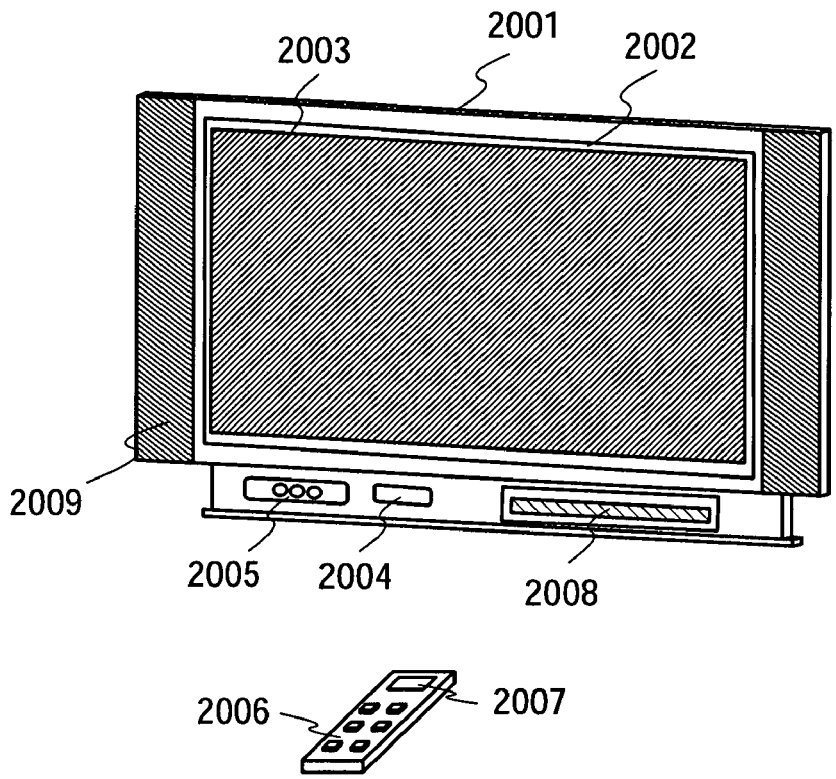
FIGS. 13A to 13C illustrate examples of electronic appliances.

A display panel 2002 using a display element is incorporated into a housing 2001, as shown in FIG. 13A. The television device can receive general TV broadcast by a receiver 2005 and further can be connected to a wired or wireless communication network via a modem 2004 so that one-way (from a sender to a receiver) or two-way (between a sender and a receiver or between receivers) information communication can be performed. The television device can be operated by a switch of the housing or a separate remote control unit 2006, which may have a display portion 2007 for displaying information to be outputted.

The television device may include a sub screen 2008 formed using a second display panel for displaying channels, sound volume, and the like, in addition to the main display screen 2003. In this structure, the main display screen 2003 may be formed using an EL display panel superior in viewing angle, and the sub screen may be formed using a liquid crystal display panel which can display an image with low power consumption. Alternatively, a structure in which the main display screen 2003 is formed of a liquid crystal display panel, the sub screen is formed of an EL display panel, and the sub screen can blink may be employed, when reduction in power consumption is prioritized. According to the present invention, a display device with high performance and high reliability can be manufactured with high productivity even if a large substrate and a number of TFTs and electronic parts are used.

According to the present invention, a semiconductor device with high performance and high reliability which has a display function can be manufactured in high productivity. Therefore, a television device with high performance and high reliability can be manufactured with high productivity.

Figure 13B:
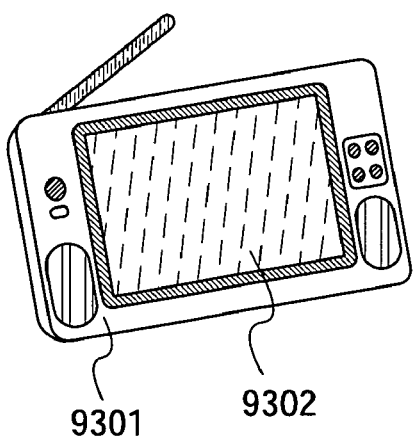

A portable television device shown in FIG. 13B includes a main body 9301, a display portion 9302, and the like. A semiconductor device of the present invention can be applied to the display portion 9302. Thus, a portable television device with high performance and high reliability can be provided. In addition, a semiconductor device of the present invention can be widely applied to a medium one which can be carried and a large one (for example, 40 inches or more).

Figure 13C:
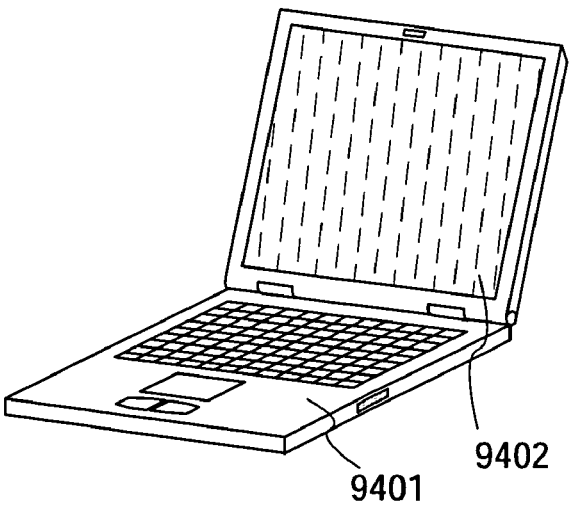

A portable computer shown in FIG. 13C includes a main body 9401, a display portion 9402, and the like. A semiconductor device of the present invention can be applied to the display portion 9402. A semiconductor device having a 15-inch display portion can be manufactured according to Embodiment Mode 1. Thus, a portable computer with high performance and high reliability can be provided.

This embodiment mode can be freely combined with any one of Embodiment Modes 1 to 6.

This application is based on Japanese Patent Application serial no. 2007-133500 filed with Japan Patent Office on May 18, 2007, the entire contents of which are hereby incorporated by reference.

EXPLANATION OF REFERENCE

101: first semiconductor layer, 102: second semiconductor layer, 103: third semiconductor layer, 104: fourth semiconductor layer, 105: fifth semiconductor layer, 106: sixth semiconductor layer, 107: seventh semiconductor layer, 108: eighth semiconductor layer, 109: ninth semiconductor layer, 110: tenth semiconductor layer, 111: eleventh semiconductor layer, 112: twelfth semiconductor layer, 113: gate wiring, 114 to 116: gate electrode, 117 to 119: connection electrode, 120 to 123: gate electrode, 124: boundary line, 125 to 130: source wiring, 131 to 136: power supply line, 140 to 155: connection electrode, 160: pixel electrode of first light emitting element, 161: pixel electrode of second light emitting element, 162: pixel electrode of third light emitting element, 163: pixel electrode of fourth light emitting element, 164: pixel electrode of fifth light emitting element, 165: pixel electrode of sixth light emitting element, 170: light emitting region of first light emitting element, 171: light emitting region of second light emitting element, 172: light emitting region of third light emitting element, 173: light emitting region of fourth light emitting element, 174: light emitting region of fifth light emitting element, 175: light emitting region of sixth light emitting element, 200: semiconductor substrate, 201: silicon oxynitride layer, 202: silicon nitride oxide layer, 203: first bonding layer, 204 and 205: dicing line, 206 and 207: rectangle sheet, 208: separation layer, 210: support substrate, 211: second bonding layer, 212: part of semiconductor substrate, 213: third bonding layer, 214: single-crystal semiconductor layer, 215: first island-shaped semiconductor layer, 216: second island-shaped semiconductor layer, 217: region, 300: substrate, 301: display portion, 302: region, 400: semiconductor substrate, 401: oxide layer, 402: blocking layer, 403: first bonding layer, 406: sheet, 408: separation layer, 410: support substrate, 411: second bonding layer, 412: part of semiconductor substrate, 413: third bonding layer, 414: single-crystal semiconductor layer, 415: first island-shaped semiconductor layer, 416: second island-shaped semiconductor layer, 417: region, 600: support substrate, 601: first silicon nitride oxide layer, 603: laminate, 604: bonding layer, 607: gate insulating layer, 617: first electrode, 624: wiring layer, 630: pixel electrode layer, 632: external connection region, 634: peripheral driver circuit region, 636: pixel region, 655: connection region, 667: insulating film, 668: insulating film, 673: transistor, 674: transistor, 675: transistor, 677: transistor, 678: terminal electrode layer, 681: second interlayer insulating layer, 685: pixel electrode layer, 686: insulator, 688: layer including an organic compound, 689: second electrode, 690: light emitting element, 692: sealant, 694: FPC, 695: sealing substrate, 696: anisotropic conductive layer, 700: support substrate, 701: first silicon nitride oxide layer, 702: first bonding layer, 703: silicon oxynitride layer, 704: second silicon nitride oxide layer, 705: second bonding layer, 706: semiconductor substrate, 707: bonding layer, 708: separation layer, 709: first single-crystal semiconductor layer, 713: silicon oxynitride layer, 714: third silicon nitride oxide layer, 715: third bonding layer, 716: part of semiconductor substrate, 719: second single-crystal semiconductor layer, 720: overlapping region, 721: mask, 802: third layer, 803: second layer, 804: first layer, 850: second electrode, 860: EL layer, 870: first electrode, 900: support substrate, 901: first silicon nitride oxide layer, 903: oxide layer, 904: bonding layer, 924: boundary line, 930: gate wiring, 931: capacitor line, 933: seal region, 934: drive circuit region, 936: pixel region, 960: source wiring, 961: pixel electrode layer, 975: transistor, 976: capacitor portion, 981 and 983: insulating layer, 984: conductive layer, 985: color layer, 991: polarizer, 992: sealant, 993: polarizer (polarizing plate), 995: sealing substrate, 2001: housing, 2002: display panel, 2003: main screen, 2004: modem, 2005: receiver, 2006: remote control unit, 2007: display portion, 2008: sub screen, 2009: speaker portion, 9301: main body, 9302: display portion, 9401: main body, 9402: display portion

The invention claimed is:

1. A semiconductor device comprising:
a display portion including a plurality of unit cells which are arranged in matrix over a substrate having an insulating surface,
wherein each of a first unit cell and a second unit cell in the plurality of unit cells, which are next to each other and arranged in a row direction, has a first electrode,
wherein a partition wall is formed over the first electrodes of the first unit cell and the second unit cell,
wherein each of the first unit cell and the second unit cell has a light emitting layer over the first electrode and the partition wall and a second electrode over the light emitting layer,
wherein the first unit cell includes a semiconductor layer of a first switching element electrically connected to the first electrode of the first unit cell, and includes a semiconductor layer of a second switching element electrically connected to the first electrode of the second unit cell, and
wherein a light emitting region surrounded by the partition wall, which is included in the first unit cell, is substantially the same as a light emitting region surrounded by the partition wall, which is included in the second unit cell.

2. The semiconductor device according to claim 1,
wherein the first unit cell includes a plurality of semiconductor layers and the second unit cell does not include a semiconductor layer.

3. The semiconductor device according to claim 1,
wherein the semiconductor layer of the first switching element and the semiconductor layer of the second switching element are a single-crystal semiconductor layer.

4. A semiconductor device comprising:
a display portion including a plurality of unit cells which are arranged in matrix over a substrate having an insulating surface,
wherein each of a first unit cell, a second unit cell, a third unit cell, and a fourth unit cell in the plurality of unit cells, which are adjacently arranged in a row direction, has a first electrode, wherein a partition wall is formed over the first electrodes of the first unit cell and the second unit cell, wherein each of the first unit cell, the second unit cell, the third unit cell, and the fourth unit cell has a light emitting layer over the first electrode and the partition wall and a second electrode over the light emitting layer, wherein the first unit cell includes a semiconductor layer of a first switching element electrically connected to the first electrode of the first unit cell, and includes a semiconductor layer of a second switching element electrically connected to the first electrode of the second unit cell, wherein the fourth unit cell includes a semiconductor layer of a fourth switching element electrically connected to the first electrode of the fourth unit cell, and includes a semiconductor layer of a third switching element electrically connected to the first electrode of the third unit cell, and wherein a light emitting region surrounded by the partition wall, which is included in the first unit cell, is substantially the same as light emitting regions surrounded by the partition wall, each of which is included in the second unit cell, the third unit cell, and the fourth unit cell, respectively.

5. The semiconductor device according to claim 4, wherein each of the first unit cell and the fourth unit cell includes a plurality of semiconductor layers and the second unit cell and the third unit cell do not include a semiconductor layer.

6. The semiconductor device according to claim 4, wherein the semiconductor layer of the first switching element and the semiconductor layer of the second switching element are a single-crystal semiconductor layer.

7. A semiconductor device comprising:

a display portion including a plurality of unit cells which are arranged in matrix over a substrate having an insulating surface, wherein each of a first unit cell, a second unit cell, a third unit cell, a fourth unit cell, a fifth unit cell, and a sixth unit cell which are adjacently arranged in a row direction has a first electrode, wherein a partition wall is formed over the first electrodes of the first unit cell and the second unit cell, wherein each of the first unit cell, the second unit cell, the third unit cell, the fourth unit cell, the fifth unit cell, and the sixth unit cell has a light emitting layer over the first electrode and the partition wall and a second electrode over the light emitting layer, wherein the second unit cell includes a semiconductor layer of a first switching element electrically connected to the first electrode of the second unit cell, and includes a semiconductor layer of a second switching element electrically connected to the first electrode of the third unit cell, wherein the fifth unit cell includes a semiconductor layer of a fifth switching element electrically connected to the first electrode of the fifth unit cell, and includes a semiconductor layer of a fourth switching element electrically connected to the first electrode of the fourth unit cell, and wherein a light emitting region surrounded by the partition wall, which is included in the first unit cell, is substantially the same as light emitting regions surrounded by the partition wall, each of which is included in the second unit cell, the third unit cell, the fourth unit cell, the fifth unit cell, and the sixth unit cell, respectively.

8. The semiconductor device according to claim 7, wherein each of the first, second, fifth, and sixth unit cells includes a plurality of semiconductor layers, wherein the third unit cell and the fourth unit cell do not include a semiconductor layer.

9. The semiconductor device according to claim 8, wherein a number of the plurality semiconductor layers in the first unit cell is different that in the second unit cell.

10. The semiconductor device according to claim 7, wherein the semiconductor layers of the first, second, fourth, and fifth switching elements are a single-crystal semiconductor layer.

* * * * *